US011993517B2

United States Patent
Tahara et al.

(10) Patent No.: US 11,993,517 B2
(45) Date of Patent: May 28, 2024

(54) SURFACE-MODIFIED CARBON MATERIAL, AND METHOD FOR PRODUCING SURFACE-MODIFIED CARBON MATERIAL

(71) Applicant: Japan Science and Technology Agency, Kawaguchi (JP)

(72) Inventors: Kazukuni Tahara, Kawasaki (JP); Yoshito Tobe, Toyonaka (JP); Toru Ishikawa, Toyonaka (JP); Yuki Kubo, Toyonaka (JP); Steven Willy Nicolas De Feyter, Leuven (BE); Brandon Edward Hirsch, Leuven (BE); Zhi Li, Leuven (BE)

(73) Assignee: Japan Science and Technology Agency, Kawaguchi (JP)

( * ) Notice: Subject to any disclaimer, the term of this patent is extended or adjusted under 35 U.S.C. 154(b) by 641 days.

(21) Appl. No.: 16/976,514

(22) PCT Filed: Feb. 28, 2019

(86) PCT No.: PCT/JP2019/010720
§ 371 (c)(1),
(2) Date: Nov. 24, 2020

(87) PCT Pub. No.: WO2019/168206
PCT Pub. Date: Sep. 6, 2019

(65) Prior Publication Data
US 2021/0070616 A1 Mar. 11, 2021

(30) Foreign Application Priority Data
Mar. 1, 2018 (JP) ................................. 2018-036704

(51) Int. Cl.
*C01B 32/194* (2017.01)
*C01B 32/21* (2017.01)
(Continued)

(52) U.S. Cl.
CPC ............ *C01B 32/194* (2017.08); *C01B 32/21* (2017.08); *H01L 29/786* (2013.01); *H01M 4/96* (2013.01);
(Continued)

(58) Field of Classification Search
CPC ... C01B 32/21; C01B 32/194; C01B 2204/22; C01P 2004/02; C01P 2004/22; C01P 2006/40; H01L 29/786; H01M 4/96
See application file for complete search history.

(56) References Cited

U.S. PATENT DOCUMENTS 8,377,306 B2   2/2013 Attias et al.
9,991,016 B2   6/2018 Cericola et al.
(Continued)

FOREIGN PATENT DOCUMENTS

JP    200961725 A    3/2009
JP    2012247189 A   12/2012
(Continued)

OTHER PUBLICATIONS

Verstraete, Lander, et al. "Self-assembly under confinement: nanocorrals for understanding fundamentals of 2D crystallization." ACS nano 10.12 (2016): 10706-10715.*

(Continued)

*Primary Examiner* — Richard M Rump
(74) *Attorney, Agent, or Firm* — The Webb Law Firm

(57) ABSTRACT

The present invention is a surface-modified carbon material including chemical addends added to the surface of graphene, such that a one-dimensional periodicity corresponding to a large number of addition positions of the chemical addends can be observed in a Fourier-transformed image of a scanning probe microscopic image of the surface of graphene. The surface-modified carbon material of the present invention has a bandgap and therefore can be used as a (Continued)

sensor capable of electronically controlling an operation or another electronic device.

16 Claims, 40 Drawing Sheets

(51) Int. Cl.
  *H01L 29/786* (2006.01)
  *H01M 4/96* (2006.01)
(52) U.S. Cl.
  CPC ...... *C01B 2204/22* (2013.01); *C01P 2004/04* (2013.01); *C01P 2004/22* (2013.01); *C01P 2006/40* (2013.01)

(56) References Cited

U.S. PATENT DOCUMENTS

| | | | |
|---|---|---|---|
| 10,115,493 | B2 | 10/2018 | Cericola et al. |
| 10,220,366 | B2 | 3/2019 | Walters et al. |
| 2015/0099180 | A1 | 4/2015 | Cericola et al. |
| 2017/0033360 | A1 | 2/2017 | Michaud et al. |
| 2017/0174520 | A1 | 6/2017 | Walters et al. |
| 2017/0179477 | A1 | 6/2017 | Walters et al. |
| 2018/0254119 | A1 | 9/2018 | Cericola et al. |
| 2019/0201864 | A1 | 7/2019 | Walters et al. |

FOREIGN PATENT DOCUMENTS

| | | |
|---|---|---|
| JP | 2015525184 A | 9/2015 |
| JP | 201748094 A | 3/2017 |
| JP | 2017512741 A | 5/2017 |
| JP | 2017513793 A | 6/2017 |
| JP | 2017515262 A | 6/2017 |
| WO | 2007118976 A2 | 10/2007 |
| WO | 2015146779 A1 | 10/2015 |

OTHER PUBLICATIONS

Verstraete, Lander, et al. "Unidirectional supramolecular self-assembly inside nanocorrals via in situ STM nanoshaving." Physical Chemistry Chemical Physics 20.43 (2018): 27482-27489.*

Hu, Yi, et al. "Exploration of 2D Self-Assembly for Dehydrobenzo [12] Annulene (DBA) Derivatives: Selective Adsorption in Nanocorrals."*

Combellas et al., "Steric Effects in the Reaction of Aryl Radicals on Surfaces", Langmuir, 2009, pp. 286-293, vol. 25.

Ejigu et al., "Single Stage Simultaneous Electrochemical Exfoliation and Functionalization of Graphene", ACS Appl. Mater. Interfaces, 2017, pp. 710-721, vol. 9.

Huynh et al., "Nanoconfined self-assembly on a grafted graphitic surface under electrochemical control", Nanoscale, 2017, pp. 362-368, vol. 9.

Cai et al., "Atomically precise bottom-up fabrication of graphene nanoribbons", Nature, 2010, pp. 470-473, vol. 466.

Cancado et al., "Quantifying Defects in Graphene via Raman Spectroscopy at Different Excitation Energies", Nano Letters, 2011, pp. 3190-3196, vol. 11.

Greenwood et al., "Covalent Modification of Graphene and Graphite Using Diazonium Chemistry: Tunable Grafting and Nanomanipulation", ACS Nano, 2015, pp. 5520-5535, vol. 9:5.

Li et al., "Self-Assembled Air-Stable Supramolecular Porous Networks on Graphene", ACS Nano, 2013, pp. 10764-10772, vol. 7:12.

Lian et al., "Electronic Structure and Charge Transport in Nanostripped Graphene", The Journal of Physical Chemistry, 2016, pp. 20024-20032, vol. 120.

Mitsuhashi et al., "Uniform Epitaxial Growth of Graphene for High-Frequency Transistors in Terahertz", SEI Technical Review, 2017, pp. 53-58, vol. 7, No. 191. (English-language Abstract).

Navarro et al., "Organic Covalent Patterning of Nanostructured Graphene with Selectivity at the Atomic Level", Nano Letters, 2016, pp. 355-361, vol. 16.

Novoselov et al., "Electric Field Effect in Atomically Thin Carbon Films", Science, 2004, pp. 666-669, vol. 306.

Rabe et al., "Commensurability and Mobility in Two-Dimensional Molecular Patterns on Graphite", Science, 1991, pp. 424-427, vol. 253.

Tahara et al., "Harnessing by a diacetylene unit: a molecular design for porous two-dimensional network formation at the liquid/solid interface", Chemical Communications, 2014, pp. 2831-2833, vol. 50.

Tahara et al., "Chemical Modification of Graphene Using Self-Assembly of Reactive Organic Molecules", The 95th CSJ Annual Meeting, 2015, 3 pages. (English-language Abstract).

Xia et al., "Electrochemical Functionalization of Graphene at the Nanoscale with Self-Assembling Diazonium Salts", ACS Nano, 2016, pp. 7125-7134, vol. 10.

* cited by examiner (S)

(T)

(1)

(2)

30

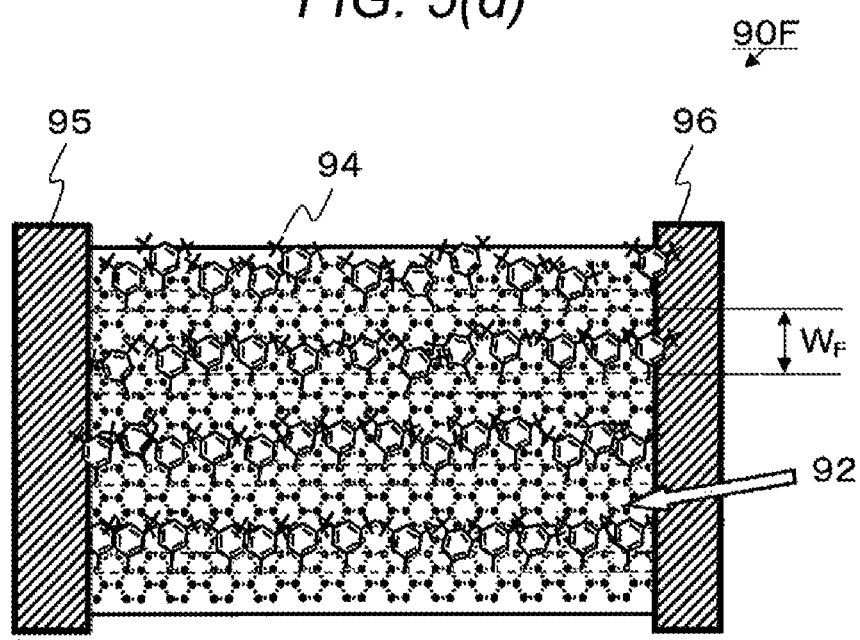

(a)

(b)

Unit cell : a = b = 3.2 nm, γ = 60° n = 10, 8, 6, 4
Pore diameters
DBAOC10 : 2.7 nm
DBAOC8 : 2.1 nm
DBAOC6 : 1.6 nm
DBAOC4 : 1.4 nm (a)

(b)

(a)

(b)

(a)

(b)

- TYPE        + TYPE

| | Fourier-transformed image | Surface-modified state |
|---|---|---|
| One-dimensional periodicity | | |
| Two-dimensional periodicity (honeycomb-shaped) | | |

SURFACE-MODIFIED CARBON MATERIAL, AND METHOD FOR PRODUCING SURFACE-MODIFIED CARBON MATERIAL

CROSS-REFERENCE TO RELATED APPLICATIONS

This application is the United States national phase of International Application No. PCT/JP2019/010720 filed Feb. 28, 2019, and claims priority to Japanese Patent Application No. 2018-036704 filed Mar. 1, 2018, the disclosures of which are hereby incorporated by reference in their entirety.

TECHNICAL FIELD

The present invention relates to a surface-modified carbon material and a method for producing a surface-modified carbon material. More specifically, the present invention relates to a surface-modified carbon material obtained by adding chemical addends to the surface of graphene and the like so as to have a periodicity, and a method for producing the same.

BACKGROUND ART

Graphene in which $sp^2$ carbons are arranged in a honeycomb shape is expected to be used in various applications because of its excellent electrical properties, mechanical properties, optical properties, and thermal properties. Graphene is considered to be utilized in the electronic field because of its high conductivity. Therefore, graphene related researches thrive in universities, research institutions, and companies and the like.

Graphene is a substance exhibiting a semi-metallic property, and is a zero bandgap semiconductor. Therefore, the application of graphene as it is as an electronic material is limited. However, if a bandgap can be appropriately introduced into graphene, graphene can be utilized for a high-performance field-effect transistor which operates at high speed at room temperature, and a small and highly sensitive molecular sensor.

Therefore, many methods for introducing the bandgap into graphene have been reported. Examples thereof include doping of electrons or holes into graphene from a supporting substrate, lithography processing of graphene with light or ion plasma, microfabrication with an SPM probe, and introduction of defects (spa carbon) by chemical modification using active chemical species.

Among these methods, the chemical modification of graphene has an advantage that the introduction of the bandgap into graphene as well as the electronic or chemical properties of organic groups added to graphene make it possible to control a Fermi level and a surface property. Therefore, the chemical modification of graphene has been actively studied.

It is known that, in the chemical modification of graphene or the like, an edge portion is more likely to be chemically modified than an in-surface portion is chemically modified. In the chemical modification of graphene, it is important to control the addition positions of a large number of active chemical species in the in-surface portion of graphene to maintain a predetermined order property. This is because the in-surface portion can be chemically modified while the predetermined order property is maintained, which preferably provides an advantage that a carrier movement way, that is, control of a current can be realized.

First, International Publication No. WO 2007/118976 discloses an invention relating to a method for bringing a fluid into contact with a substrate. In this invention, on the surface of the fluid brought into contact with the substrate, an organic molecular network having a central part and at least one lateral arm is formed. A two-dimensional molecular sieve formed by adsorbing network molecules onto the surface of silicon, metal, or pyrolytic graphite (HOPG) or the like is disclosed. FIG. 13 shows a two-dimensional structure 100 formed by continuously interacting an organic compound basic framework 105a and an organic compound grafted part 105b with each other on planar alignment of 6-membered rings 102 of a carbon material.

Next, FIG. 14(a) is a schematic cross-sectional view of a related art associated with Japanese Patent Document JP 2009-61725 A. The related art associated with Japanese Patent Document JP 2009-61725 A is an invention in which a modified carbonaceous film is formed on the surface of a substrate 113 made of stainless steel, ceramic, or resin or the like. That is, in Japanese Patent Document JP 2009-61725 A, a modified carbonaceous film 110 is disclosed, which has a carbonaceous film containing $sp^2$-bonded carbon and spa-bonded carbon and a functional group containing hydrogen atoms and oxygen atoms on the surface of the carbonaceous film (planar alignment of 6-membered rings 112), and includes an organic component (graft chain 111) chemically bonded to the surface of the carbonaceous film.

FIG. 14(b) schematically shows a related art associated with Japanese Patent Document JP 2012-247189 A. An electronic device 120 has a structure in which an edge-modified graphene film (planar alignment of 6-membered rings 122) on a substrate is used as a channel, and a source electrode 124 and a drain electrode 125 are electrically joined to the channel. In this electronic device 120, a functional group 121 which adsorbs or binds to detected substance species is added to the edge of the graphene film to constitute an edge-modified graphene sensor. A method for chemically modifying not the edge of a carbon material such as graphene but the surface of planar alignment of 6-membered rings also has been attempted for a large number of chemical addends. FIG. 14(c) is a photograph showing a method for randomly and chemically modifying the surface of graphite, and then mechanically removing chemical addends with an STM probe to expose the surface of carbon in a desired shape. This method is called a nanoshaving method.

FIG. 15 schematically shows a condition in which NBD as chemical addends is added to the surface of a carbon material. In this case, a multi-layered state is formed by cascading an aryl radical substitution reaction to an aryl group added to the planar alignment of 6-membered rings on the surface of the carbon material. As a result, high density modification and addition position control in the plane of a large number of chemical addends on the carbon material have not been achieved.

Thus, in the conventional method, the addition of the active chemical species to graphene randomly occurs, which makes it virtually impossible to control the addition position (spa carbon position), particularly, in the surface. It was also difficult to strictly control the modification rate of adducts. Some studies have been reported for solving such problems.

For example, Non-Patent Literature 1: Navarro, J.; Leret, S.; Calleja, F.; Stradi, D.; Black, A.; Bernardo-Gavito, R.; Garnica, M.; Granados, D.; Vazquez de Parga, A. L.; Perez, E. M.; Miranda, R., Organic Covalent Patterning of Nanostructured Graphene with Selectivity at the Atomic Level. Nano Lett. 2016, 16, 355361 (Navarro et. al.), reports that cyanomethyl radicals are regioselectively added to monolayer graphene on Ru(0001) due to an interaction between a metal and graphene. However, this method cannot control dimensionality and a period (pitch).

Non-Patent Literature 2: Xia, Z.; Leonardi, F.; Gobbi, M.; Liu, Y.; Bellani, V.; Liscio, A.; Kovtun, A.; Li, R.; Feng, X.; Orgiu, E.; Samori, P.; Treossi, E.; Palermo, V. Electrochemical Functionalization of Graphene at the Nanoscale with Self-Assembling Diazonium Salts. ACS Nano 2016, 10, 7125-7134, ("Xia et. al."), reports that aryl diazonium salts having a long-chain alkyl group are aligned on graphene by self-assembling, and electrochemically reduced to generate aryl radicals, thereby providing the addition to graphene. The possibility of periodic modification has been discussed.

The methods of Non-Patent Literature 1 (Navarro et. al.) and Non-Patent Literature 2 (Xia et. al.) are attractive approaches to the periodic chemical modification. However, both the methods are far from precise control of chemical surface modification on a carbon material. The highly accurate control of addition positions and the control of a modification rate when chemical addends are added are considered to be insufficient.

In contrast, Non-Patent Literature 3: Cai, J.; Ruffieux, P.; Jaafar, R.; Bieri, M.; Braun, T.; Blankenburg, S.; Muoth, M.; Seitsonen, A. P.; Saleh, M.; Feng, X.; Mullen, K.; Fasel, R. Atomically Precise Bottom-Up Fabrication of Graphene Nanoribbons. Nature 2010, 466, 470-473, ("Cai et. al."), reports a method for synthesizing nanographene or graphene nanoribbon (GNR) in a bottom-up manner by utilizing a chemical reaction on a solid substrate or in a solution. This method has an advantage that graphene and GNR having an appropriate size can be obtained from a designed precursor. Therefore, research has been actively conducted on this method in recent years. However, their electronic or magnetic properties largely depend on an edge structure, and are largely different from those of graphene itself. It is also impossible to widen a ribbon width beyond a certain extent.

Meanwhile, a method for forming a nano pattern on the surface of graphite or graphene utilizing the formation of a self-assembling unimolecular film by the physical adsorption of organic molecules has been reported.

For example, Non-Patent Literature 4: Rabe, J. P.; Buchholz, S. Commensurability and Mobility in Two-Dimensional Molecular Patterns on Graphite. Science 1991, 253, 424-427, ("Rabe et. al."), reports that linear alkanes form a lamella type unimolecular film through self-assembly at the interface between an organic solvent and graphite. However, Non-Patent Literature 4 (Rabe et. al.) does not disclose any idea of performing chemical modification while periodically controlling addition positions.

Non-Patent Literature 5: Li, B.; Tahara, K.; Adisoejoso, J.; Vanderlinden, W.; Mali, K. S.; De Gendt, S.; Tobe, Y.; De Feyter, S. Self-Assembled Air-Stable Supramolecular Porous Networks on Graphene. ACS Nano 2013, 7, 10764-10772, ("Li et. al."), and Non-Patent Literature 6: Tahara, K.; Adisoejoso, J.; Inukai, K.; Lei, S.; Noguchi, A.; Li, B.; Vanderlinden, W.; De Feyter, S.; Tobe, Y. Harnessing by a Diacetylene Unit: a Molecular Design for Porous Two-Dimensional Network Formation at the Liquid/Solid Interface. Chem. Commun. 2014, 50, 2831-2833, ("Tahara et. al.), have reported a method for simply forming a nano pattern on the surface of graphite or graphene utilizing self-assembling unimolecular film formation provided by physical adsorption of organic molecules at a solid-liquid interface using a newly synthesized dehydrobenzo[12]annulene (DBA) derivative. STM observation confirmed that the DBA derivative forms honeycomb-shaped molecular alignment at the interface between an organic solvent and graphite or graphene.

Non-Patent Literature 7: Kazukuni Tahara, Development of Precision Graphene Chemical Modification Technique by Self-Assembly of Reactive Molecules, 95th CSJ's National Meeting holding in spring, Mar. 27, 2015, (Tahara), reports experimental results of forming a 6-fold symmetric periodic structure on graphite utilizing the above technique of Non-Patent Literature 5 (Li et. al.) or Non-Patent Literature 6 (Tahara et. al.), followed by performing chemical modification.

Non-Patent Literature 8: Fuminori Mitsuhashi, Masaya Okada, Yasunori Tateno, Masanori Ueno, Takashi Nakabayashi, Method for Producing Graphene Having Excellent Uniformity for Realizing Transistors Operated in Terahertz Band, July 2017, SEI Technical Review No. 191 53-58, ("Mitsuhashi et. al."), reports a method for producing graphene utilizing an SiC sputter film forming method. Non-Patent Literature 9: Novoselov, K. S.; Geim, A. K.; Morozov, S. V.; Jiang, D.; Zhang, Y.; Dubonos, S. V.; Grigorieva, I. V.; Firsov, A. A. Electric Field Effect in Atomically Thin Carbon Films. Science 2004, 306, 666-669, ("Novoselov et. al."), reports a method for forming graphene on an SiO substrate.

In Non-Patent Literature 10: Lian, J. X.; Lherbier, A.; Wang L. J.; Charlier, J.-C.; Beljonne, D.; Olivier, Y. Electronic Structure and Charge Transport in Nanostripped Graphene. J. Phys. Chem. C 2016, 120, 20024-20032, ("Lian et. al."), calculation prediction was attempted for a technique capable of controlling the bandgap of graphene when spa carbon defects are one-dimensional-periodically introduced into graphene.

Non-Patent Literature 11: Greenwood, J.; Phan, T. H.; Fujita, Y.; Li, Z.; Ivasenko, O.; Vanderlinden, W.; Van Gorp, H.; Frederickx, W.; Lu, G.; Tahara, K.; Tobe, Y.; Uji-i H.; Mertens, S. F. L; De Feyter, S. Covalent Modification of Graphene and Graphite Using Diazonium Chemistry: Tunable Grafting and Nanomanipulation. ACS Nano 2015, 5, 5520-5535, ("Greenwood et. al.), reports a method for adding 3,5-di-tert-butylbenzenediazonium chloride (TBD) or 4-nitrobenzenediazonium chloride (NBD) as chemical addends to the surface of graphene or graphite. In FIG. 13, a technique of exposing a carbon surface in a rectangular region by partially removing a layer of aryl groups added to the surface of a carbon material with an STM probe was shown (see FIG. 14(c)). Furthermore, a technique of forming two blocks by causing pentacontane molecules to self-assemble using the exposed rectangular region as a template was shown. In this related art, the pentacontane self-assembling on the surface of the carbon material could be observed to be aligned in several adjacent blocks, but in a larger area size, the blocks were disposed in a mosaic pattern. Thus, Non-Patent Literature 11 (Greenwood et. al.) utilized a nanoshaving method using the STM probe, and did not achieve the formation of adducts (chemical addends) in a predetermined alignment state so that the carbon material could be used in an electronic device.

Finally, Non-Patent Literature 12: Cancado, L. G.; Jorio, A.; Martins Ferreira, E. H.; Stavale, F.; Achete, C. A.; Capaz, R. B.; Moutinho, M. V. O.; Lombardo, A.; Kulmala, T. S.; Ferrari, A. C. Quantifying Defects in Graphene via Raman Spectroscopy at Different Excitation Energies. Nano Lett. 2011, 11, 3190-3196, ("Cancado et. al.") reports that defects in graphene can be quantitatively analyzed by Raman spectra analysis of different excitation energies.

SUMMARY OF INVENTION

Technical Problem

The above related arts could relatively easily chemically modify the edge portion of the carbon material, and subject the carbon material to spot-like chemical modification, or could randomly and chemically modify the inside of the surface of the carbon material.

In other words, a novel technique which is required for providing new generation devices and is used for performing advanced chemical modification has not been achieved. That is, it was difficult to orderly add chemical addends to the surface of the carbon material. More specifically, it was extremely difficult to accurately control the positions of the chemical addends in the surface of the carbon material while adding the chemical addends in a high density to the surface. Alternatively, it was difficult to chemically modify a predetermined area or larger at a desired modification rate. Thus, as general knowledge, the high-level control of the chemical doping to graphene or the like could not be achieved, which made it difficult to prepare a material suitable to utilization for the device.

An object of the present invention is to provide a surface-modified carbon material obtained by adding a large number of chemical addends to the surface of a carbon material, wherein the addition positions of the chemical addends are controlled in the surface. Specifically, an object of the present invention is to provide a surface-modified carbon material obtained by imparting a predetermined order property to addition positions on the surface of a carbon material, and a method for producing the same. Another object of the present invention is to provide an organic compound-carbon material composite which is an intermediate for producing the surface-modified carbon material, and a method for producing the same.

Solution to Problem

The present co-inventors diligently studied the types of adducts and reaction conditions and the like for chemical modification using a film formed by causing an alkane or the like to self-assemble on the surface of a carbon material such as graphene or graphite as a mask.

Based on experimental results and theoretical considerations, the present co-inventors found that the addition reaction of radicals generated from a diazonium salt or the like is generated in a state where the mask is placed on the surface of the carbon material, which makes it possible to control the addition positions so as to have a one-dimensional periodicity or a two-dimensional periodicity.

That is, the present invention relates to the following [Aspect 1] to [Aspect 28].

[Aspect 1]
A surface-modified carbon material including a large number of chemical addends provided on at least a part of a surface of a carbon material selected from the group consisting of graphene, graphite, a glassy carbon film, and film-like pyrolytic carbon, wherein
a one-dimensional periodicity corresponding to a large number of addition positions of the chemical addends can be observed in a Fourier-transformed image of a scanning probe microscopic image of the surface.

[Aspect 2]
The surface-modified carbon material according to [Aspect 1], wherein a pitch corresponding to the one-dimensional periodicity is 2 to 10 nm.

[Aspect 3]
The surface-modified carbon material according to aspect 1 or 2, wherein the carbon material is the graphene, and Id/Ig between intensity Ig of a G band and intensity Id of a D band in Raman spectra of the surface is 0.2 to 5.0.

[Aspect 4]
The surface-modified carbon material according to [Aspect 1] or [Aspect 2], wherein the carbon material is the graphite, and Id/Ig of intensity Ig of a G band and intensity Id of a D band in Raman spectra of the surface is 0.01 to 0.11.

[Aspect 5]
The surface-modified carbon material according to any one of [Aspect 1] to [Aspect 4], wherein the chemical addend is an aryl group.

[Aspect 6]
The surface-modified carbon material according to [Aspect 5], wherein the aryl group is represented by the following formula (1):

[Chemical Formula 1]

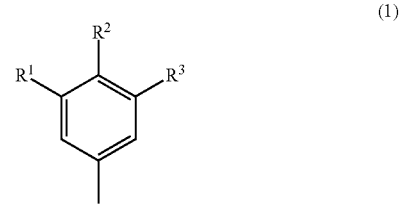

wherein: $R^1$, $R^2$, and $R^3$ are each independently an alkyl group, an alkenyl group, an alkynyl group, an aryl group, OR, COOH, SOOH, SOONH$_2$, NO$_2$, COOR, SiR$_3$, H, F, Cl, Br, I, OH, NH$_2$, NHR, NR$_2$, CN, CONHR, or COH (R is an alkyl group, an alkenyl group, an alkynyl group, an aryl group, or a halogen substitution product thereof).

[Aspect 7]
An organic compound-carbon material composite including: a carbon material; a thin film; and a solvent, wherein: the carbon material is selected from the group consisting of graphene, graphite, a glassy carbon film, and film-like pyrolytic carbon; the thin film is composed of a periodic organic compound assembly; a surface of the carbon material is covered with the thin film; and the solvent is a non-polar organic solvent or a low-polarity organic solvent, and is disposed on the thin film.

[Aspect 8]
The organic compound-carbon material composite according to [Aspect 7], wherein the thin film includes the periodic organic compound assembly in which linear alkanes having 15 to 80 carbon atoms or linear alkane derivatives having 10 to 80 carbon atoms are disposed in parallel.

[Aspect 9]
The organic compound-carbon material composite according to [Aspect 8], wherein the periodic organic compound assembly has polygonal holes.

[Aspect 10]
A method for producing a surface-modified carbon material, the method including: a first step of forming a thin film on a surface of a carbon material using an organic compound; and a second step of causing a chemical modification compound to react with the surface of the carbon material using the thin film as a mask, wherein:

the organic compound is a linear alkane having 15 to 80 carbon atoms or a linear alkane derivative having 10 to 80 carbon atoms;

the carbon material is selected from the group consisting of graphene, graphite, a glassy carbon film, and film-like pyrolytic carbon;

in the first step, the organic compound self-assembles on the surface of the carbon material to form a thin film which is a thin film periodic assembly exhibiting a one-dimensional periodicity; and in the second step, the chemical modification compound is caused to react with the surface of the carbon material at a position of a gap of the periodic assembly.

[Aspect 11]

The method for producing a surface-modified carbon material according to [Aspect 10], wherein the linear alkane or the linear alkane derivative is a compound represented by the following formula (2):

[Chemical Formula 2]

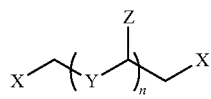

(2)

wherein: X represents H, $CH_3$, $CF_3$, $CH=CH_2$, $C\equiv CH$, an aryl group, F, Cl, Br, I, OH, SH, $NH_2$, COH, or COOH; Y represents $CH_2$, $CF_2$, $CH=CH$, $C\equiv C$, a divalent atomic group formed by removing two hydrogen atoms from an aromatic hydrocarbon, O, S, NH, CO, COO, CONH, NHCO, or NHCHX; Z represents H, $CH_3$, an aryl group, OH, SH, $NH_2$, COH, COOH, COOX, CONH, NHCOX, or NHCHX; and n is an integer satisfying a condition in which the number of carbon atoms in the formula (2) is 15 to 80 in the alkane, and 10 to 80 in the alkane derivative.

[Aspect 12]

The method for producing a surface-modified carbon material according to [Aspect 10] or [Aspect 11], wherein the thin film is a lamella type unimolecular film.

[Aspect 13]

The method for producing a surface-modified carbon material according to any one of [Aspect 10] to [Aspect 12], wherein the chemical modification compound is a compound represented by the following formula (3):

[Chemical Formula 3]

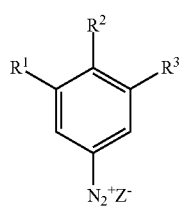

(3)

wherein: $R^1$, $R^2$, and $R^3$ are each independently an alkyl group, an alkenyl group, an alkynyl group, an aryl group, OR, SOOH, $SOONH_2$, COOH, $NO_2$, COOR, $SiR_3$, H, F, Cl, Br, I, OH, $NH_2$, NHR, CN, CONHR, or COH (R is an alkyl group, an alkenyl group, an alkynyl group, or an aryl group); and Z is a halogen atom, $BF_4$, $BR_4$, or $PF_6$ ($R_4$ is an alkyl group, an alkenyl group, an alkynyl group, an aryl group, or a halogen substitution product thereof).

[Aspect 14]

A method for producing a surface-modified carbon material, the surface-modified carbon material produced by causing a chemical modification compound to electrochemically react with a carbon material using an electrochemical cell including a working electrode, a counter electrode, a reference electrode, and an electrolyte aqueous solution, wherein:

the carbon material is used as the working electrode;

the carbon material is selected from the group consisting of graphene, graphite, a glassy carbon film, and film-like pyrolytic carbon;

an aqueous solution containing the chemical modification compound is used as the electrolyte aqueous solution;

a liquid medium containing a compound exhibiting a periodic self-assembling property is disposed between the working electrode and the electrolyte aqueous solution; and the electrolyte aqueous solution and the liquid medium are immiscible with each other.

[Aspect 15]

The method for producing a surface-modified carbon material according to [Aspect 14], wherein the compound exhibiting a periodic self-assembling property is a linear alkane having 15 to 80 carbon atoms or a linear alkane derivative having 10 to 80 carbon atoms.

[Aspect 16]

The method for producing a surface-modified carbon material according to [Aspect 15], wherein the linear alkane or the linear alkane derivative is a compound represented by the following formula (2):

[Chemical Formula 4]

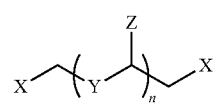

(2)

wherein: X represents H, $CH_3$, $CF_3$, $CH=CH_2$, $C\equiv CH$, an aryl group, F, Cl, Br, I, OH, SH, $NH_2$, COH, or COOH; Y represents $CH_2$, $CF_2$, $CH=CH$, $C\equiv C$, a divalent atomic group formed by removing two hydrogen atoms from an aromatic hydrocarbon, O, S, NH, CO, COO, CONH, NHCO, or NHCHX; Z represents H, $CH_3$, an aryl group, OH, SH, $NH_2$, COH, COOH, COOX, CONH, NHCOX, or NHCHX; and n is an integer satisfying a condition in which the number of carbon atoms in the formula (2) is 15 to 80 in the alkane, and 10 to 80 in the alkane derivative.

[Aspect 17]

The method for producing a surface-modified carbon material according to [Aspect 15] or [Aspect 16], wherein a concentration of the alkane or linear alkane derivative in the liquid medium is 1 μmol/L or more.

[Aspect 18]

The method for producing a surface-modified carbon material according to [Aspect 14], wherein the compound exhibiting a periodic self-assembling property is a dehydrobenzo[12]annulene derivative.

[Aspect 19]
The method for producing a surface-modified carbon material according to any one of [Aspect 14] to [Aspect 18], wherein the liquid medium is obtained by dissolving the compound exhibiting a periodic self-assembling property in a non-polar organic solvent or a low-polarity organic solvent.

[Aspect 20]
The method for producing a surface-modified carbon material according to [Aspect 19], wherein the non-polar organic solvent or the low-polarity organic solvent is at least one substance selected from the group consisting of a fatty acid, alkyl substituted benzene, an alkane having less than 20 carbon atoms, an alkanol, dialkyl ether, a halogenated hydrocarbon, or an aromatic hydrocarbon.

[Aspect 21]
The method for producing a surface-modified carbon material according to any one of [Aspect 14] to [Aspect 20], wherein a concentration of the chemical modification compound in the electrolyte aqueous solution is 0.2 to 10.0 mmol/L.

[Aspect 22]
The method for producing a surface-modified carbon material according to any one of [Aspect 10] to [Aspect 21], wherein the chemical modification compound is a compound represented by the following formula (3):

[Chemical Formula 5]

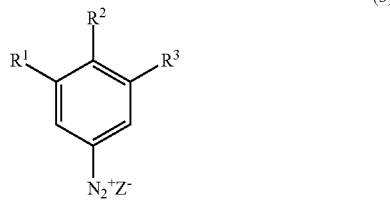

(3)

wherein: $R^1$, $R^2$, and $R^3$ are each independently an alkyl group, an alkenyl group, an alkynyl group, an aryl group, OR, SOOH, SOONH$_2$, COOH, NO$_2$, COOR, SiR$_3$, H, F, Cl, Br, I, OH, NH$_2$, NHR, CN, CONHR, or COH (R is an alkyl group, an alkenyl group, an alkynyl group, or an aryl group); and Z is a halogen atom, BF$_4$, BR$_4$, or PF$_6$ (R is an alkyl group, an alkenyl group, an alkynyl group, an aryl group, or a halogen substitution product thereof).

[Aspect 23]
A surface-modified carbon material including a large number of chemical addends on at least a part of a surface of a carbon material selected from the group consisting of graphene, graphite, a glassy carbon film, and film-like pyrolytic carbon, wherein:
  a two-dimensional periodicity corresponding to a large number of addition positions of the chemical addends is provided in a Fourier-transformed image of a scanning probe microscopic image of the surface; and
  when the surface is fractionated by one compartment having an area of 5 to 15 nm$^2$, a ratio of the total number of compartments in which the chemical addends are present to the number of all compartments is 70% or more.

[Aspect 24]
The surface-modified carbon material according to [Aspect 23], wherein the ratio is 90% or more.

[Aspect 25]
A field-effect transistor including the surface-modified carbon material according to any one of [Aspect 1] to [Aspect 6], [Aspect 23], or [Aspect 24].

[Aspect 26]
A sensor including the surface-modified carbon material according to any one of [Aspect 1] to [Aspect 6], [Aspect 23], or [Aspect 24].

[Aspect 27]
A light emitting device including the surface-modified carbon material according to any one of [Aspect 1] to [Aspect 6], [Aspect 23], or [Aspect 24].

[Aspect 28]
A catalyst including the surface-modified carbon material according to any one of [Aspect 1] to [Aspect 6], [Aspect 23], or [Aspect 24].

Advantageous Effects of Invention

The present invention is a surface-modified carbon material obtained by adding chemical addends to at least a part of the surface of a carbon material selected from the group consisting of graphene, graphite, a glassy carbon film, and film-like pyrolytic carbon, wherein a large number of addition positions of the chemical addends have a predetermined periodicity as a whole. Therefore, the surface-modified carbon material of the present invention has various advantages such as allowing transport of carriers, that is, allowing an electric current to be controlled. Alternatively, when an electronic device is formed, a change in transport of carriers depending on a change in an external environment can be indirectly sensed.

A method for producing a surface-modified carbon material of the present invention can add the chemical addends to the surface of the carbon material while controlling the chemical addends, whereby the surface-modified carbon material can be produced, which the addition positions of the large number of chemical addends have a periodicity. The glassy carbon film is a film-like object made of a substance having glass and ceramic properties, and all the constituent substances of the glassy carbon film are said to be sp$^2$ carbon. Examples of the pyrolytic carbon film include a carbon film having a film thickness of about several μm and formed by being decomposed at a high temperature of about 1000° C. It is known that the layer structure and the internal structure can be adjusted by changing a producing process. Hereinafter, experiments and the like of Examples were performed using graphene or graphite as a typical material example of the carbon material in the present invention.

In the method for producing a surface-modified carbon material of the present invention, by appropriately adjusting the molecular length and shape of an alkane or the like used as a mask, sp$^3$ carbon disposed so as to have a predetermined period, for example, a one-dimensional periodicity or a two-dimensional periodicity can be introduced into graphene or the like.

The method for producing a surface-modified carbon material of the present invention overcomes the limit of microfabrication by a conventional lithography method. The method is a novel technique which achieves ultra-microfabrication approximate to a molecular level, and can introduce sp$^3$ carbon into graphene or the like with various widths depending on the molecular length of the alkane or the like used as a mask.

BRIEF DESCRIPTION OF DRAWINGS

FIG. 5(d) is a schematic plan view of an electronic device 90F (uniform pitch type) using another configuration example 1 of a surface-modified carbon material according to the present invention.

FIG. 5(e) is a schematic plan view of an electronic device 90P (different pitch type) using another configuration example 2 of a surface-modified carbon material according to the present invention.

Figure 7:
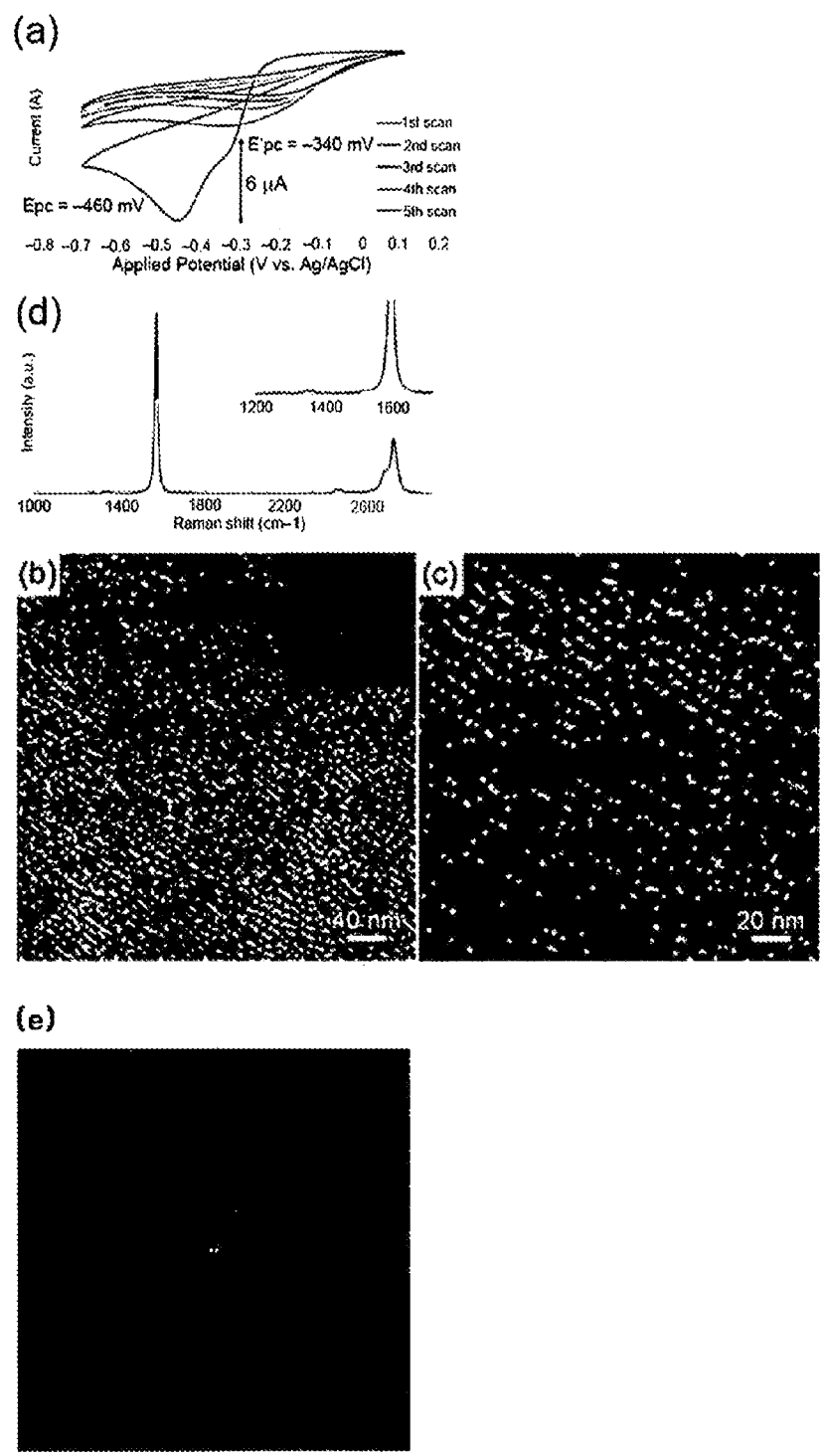

(a) of FIG. 7 is a cyclic voltammogram obtained in Example 1-1. From the bottom, a first sweep wave, a second sweep wave, a third sweep wave, a fourth sweep wave, and a fifth sweep wave are shown. (b) and (c) of FIG. 7 are STM observation images obtained in Example 1-1, and an upper right image of (b) of FIG. 7 is a Fourier-transformed image of the STM observation image. (d) of FIG. 7 is Raman spectra obtained in Example 1-1. (e) of FIG. 7 is an enlarged view of the Fourier-transformed image.

Figure 8:
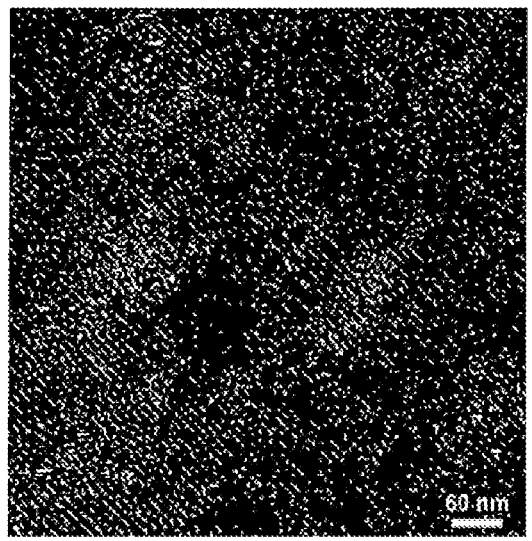
Figure 8:
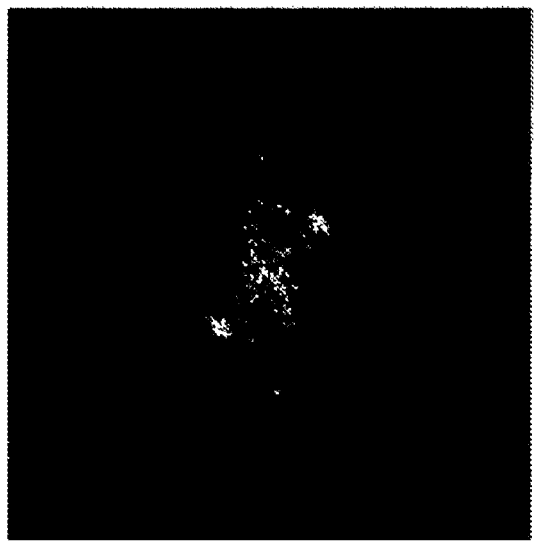

(a) of FIG. 8 is an STM observation image obtained in Example 1-2. (b) of FIG. 8 is a Fourier-transformed image of the STM observation image obtained in Example 1-2.

Figure 9:
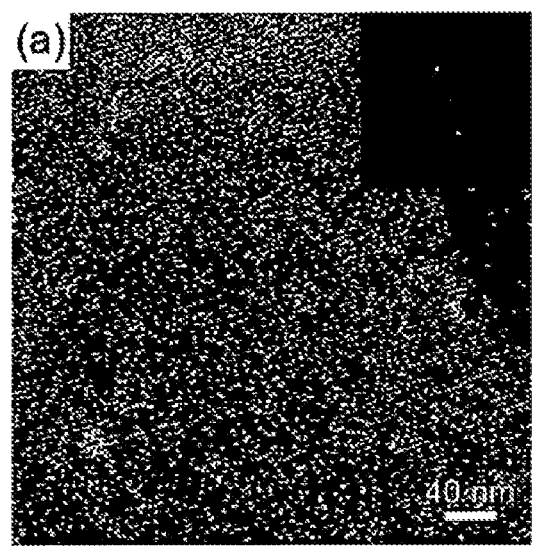
Figure 9:
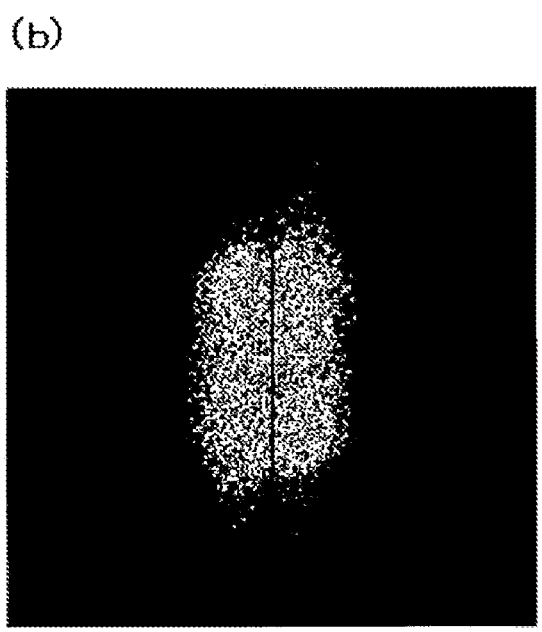

(a) of FIG. 9 is an STM observation image obtained in Example 1-3. An upper right image of (a) of FIG. 9 is a Fourier-transformed image of the STM observation image, and (b) of FIG. 9 is an enlarged view of the Fourier-transformed image.

Figure 10:
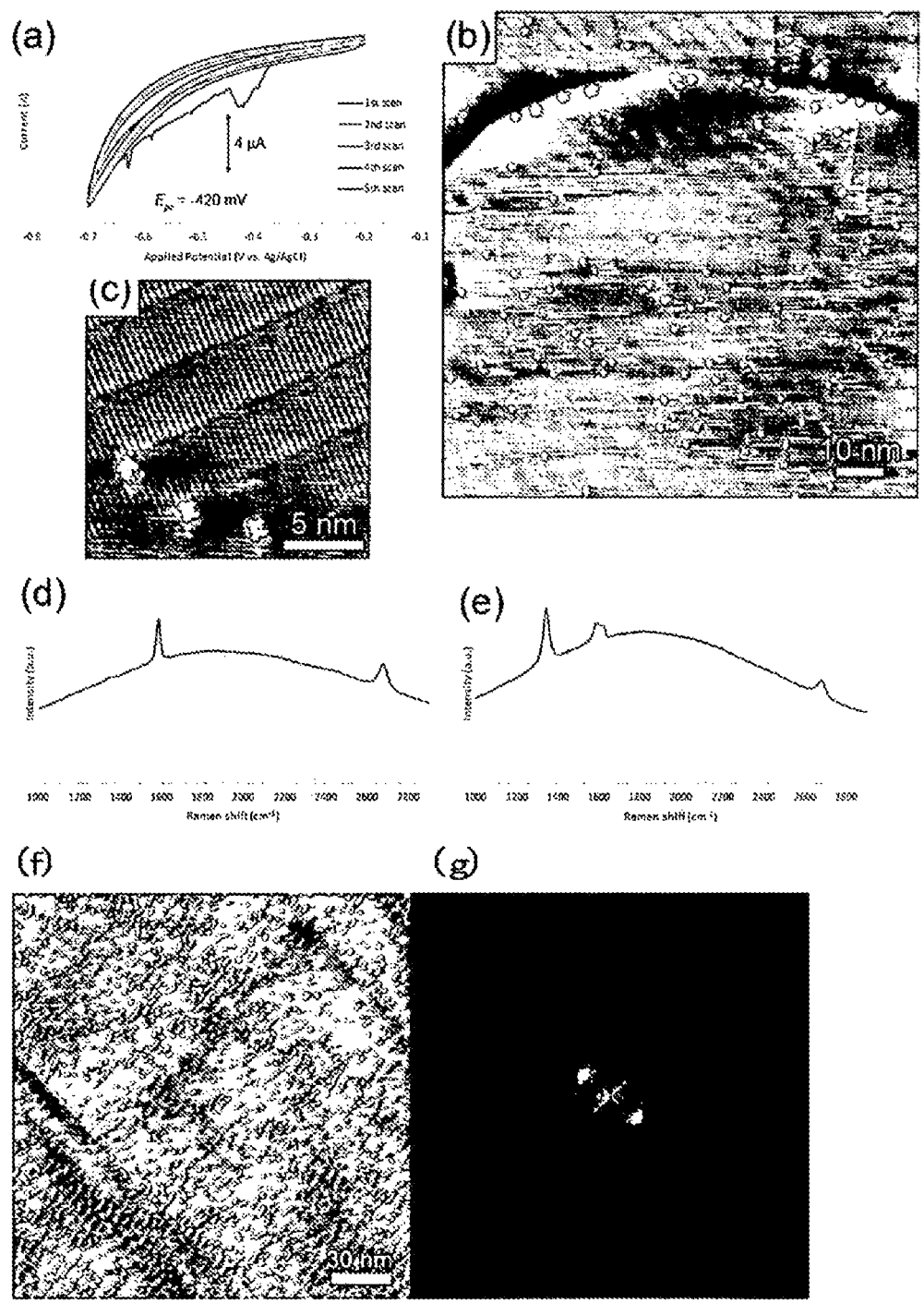

(a) of FIG. 10 is a cyclic voltammogram obtained in Example 1-4. From the bottom, a first sweep wave, a second sweep wave, a third sweep wave, a fourth sweep wave, and a fifth sweep wave are shown. (b), (c), and (f) of FIG. 10 are STM observation images obtained in Example 1-4. (d) and (e) of FIG. 10 are Raman spectra obtained in Example 1-4. (g) of FIG. 10 is a Fourier-transformed image of the STM observation image obtained in Example 1-4.

Figure 11:
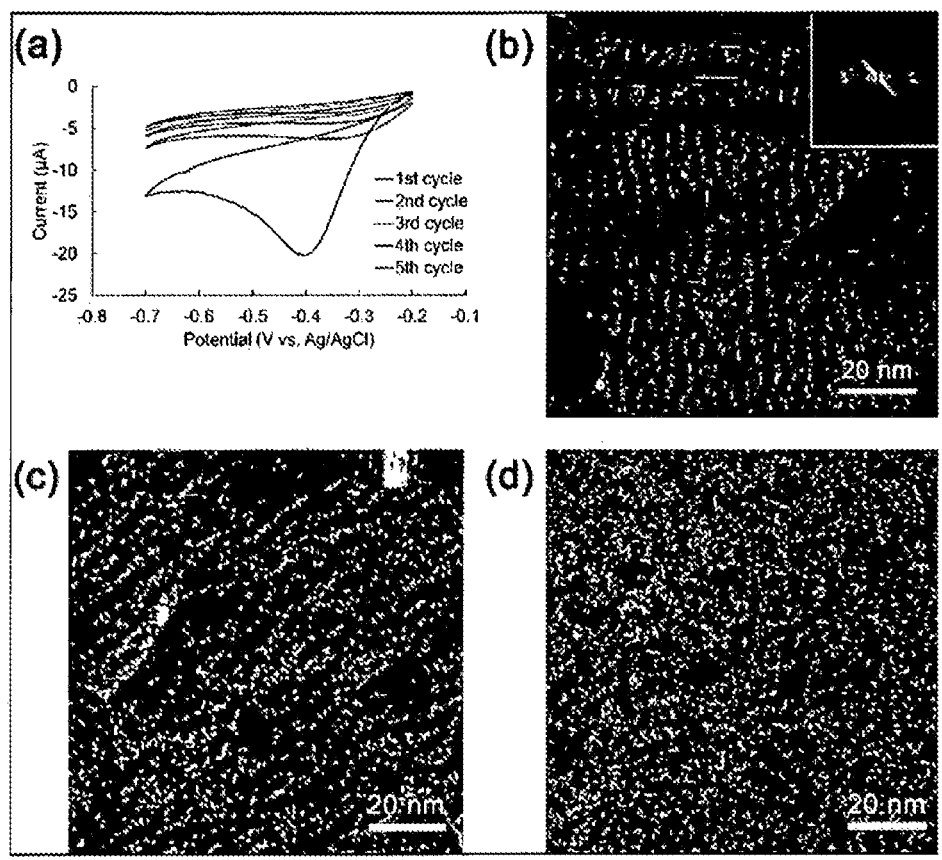

FIG. 11 is data corresponding to Example 1-5. (a) of FIG. 11 is a cyclic voltammogram obtained in Example 1-5; and (b), (c), and (d) of FIG. 11 are STM observation images obtained in Example 1-5. From the bottom of (a) of FIG. 11, a first sweep wave, a second sweep wave, a third sweep wave, a fourth sweep wave, and a fifth sweep wave are shown. An upper right image of (b) of FIG. 11 is a Fourier-transformed image of the STM observation image.

Figure 12:
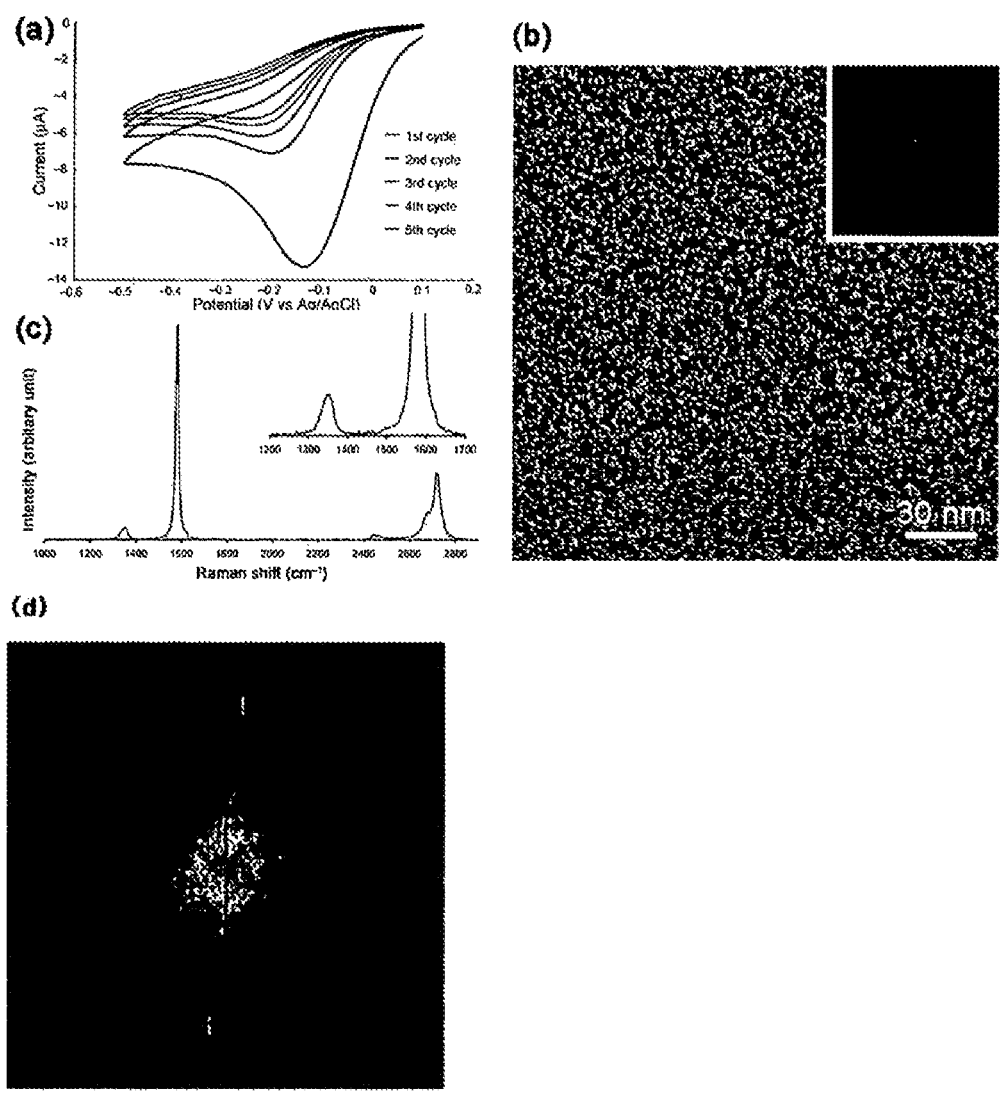

(a) of FIG. 12 is a cyclic voltammogram obtained in Comparative Example 1-1. From the bottom, a first sweep wave, a second sweep wave, a third sweep wave, a fourth sweep wave, and a fifth sweep wave are shown. (b) of FIG. 12 is an STM observation image obtained in Comparative Example 1-1. An upper right image of (b) of FIG. 11 is a Fourier-transformed image of the STM observation image. (c) of FIG. 12 is Raman spectra obtained in Comparative Example 1-1, and (d) of FIG. 12 is an enlarged view of the Fourier-transformed image.

Figure 13:
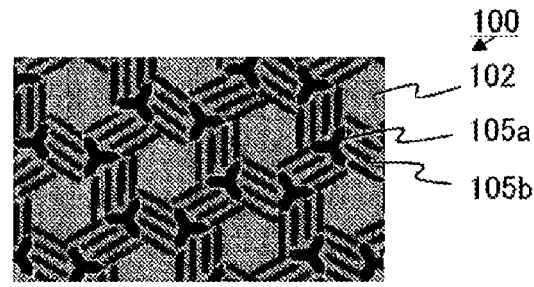

FIG. 13 is a schematic plan view showing a condition in which an assembly of organic compounds is formed on graphite, which is the related art according to International Publication No. WO 2007/118976.

Figure 14A:
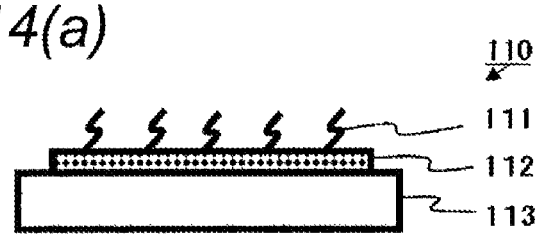

FIG. 14(a) is a schematic cross-sectional view showing a condition in which a graft chain is formed on a carbonaceous film, which is the related art according to Japanese Patent Document JP 2009-61725 A.

Figure 14B:
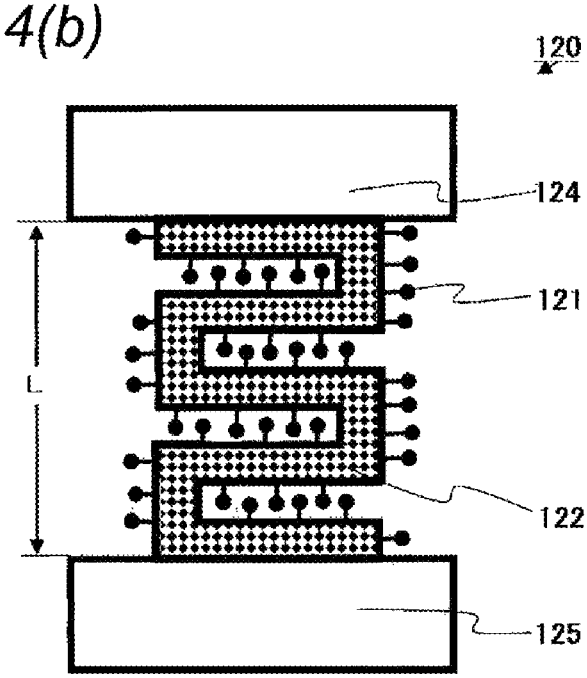

FIG. 14(b) is a schematic plan view showing a condition in which an edge of graphene is chemically modified in a graphene sensor using graphene having a zigzag overall shape as a sensing portion, which is the related art according to Japanese Patent Laid-Open No. 2012-247189.

Figure 14C:
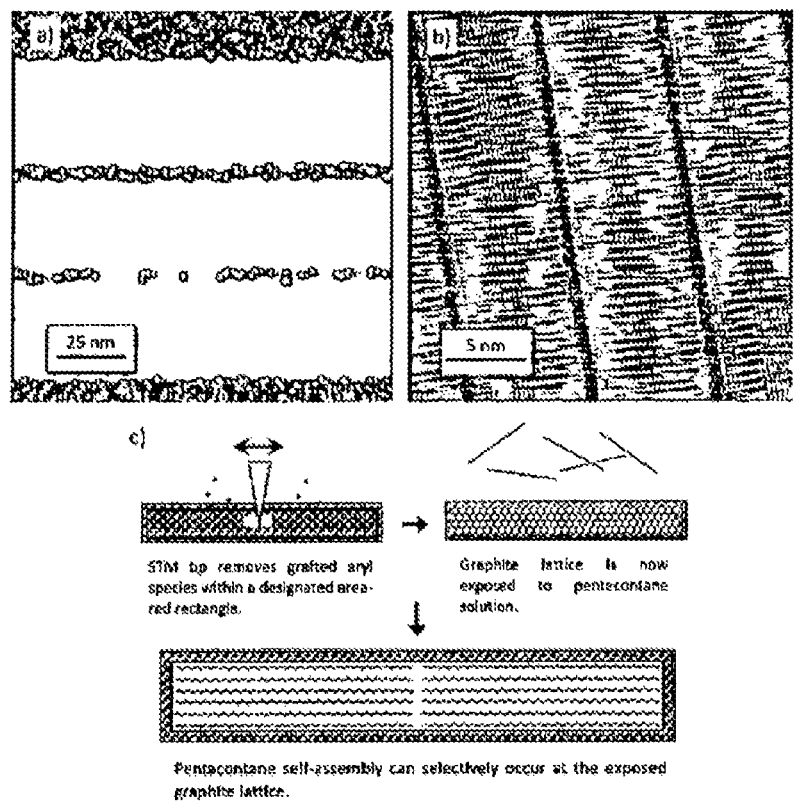

FIG. 14(c) is a photograph and illustration diagram of a case in which a predetermined region is exposed by nanoshaving a HOPG surface randomly and chemically modified with a large number of 3,5-TBDs in advance using an STM probe, which is a reference from Non-Patent Literature 11 (Greenwood et. al.).

Figure 15:
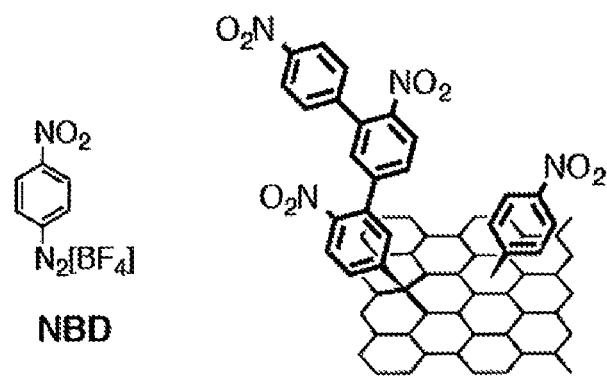

FIG. 15 is a schematic view showing a condition in which NBD is added as chemical addends so as to form a multi-layer on the surface of a carbon material, which is the related art.

Figure 16:
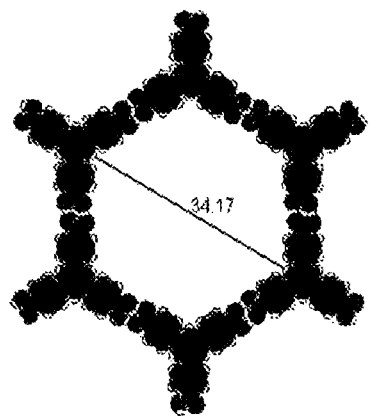

FIG. 16 is a structural schematic view of an example of a single unit using a known organic compound (H3BTB) which can be applied to the present invention.

Figure 17A:
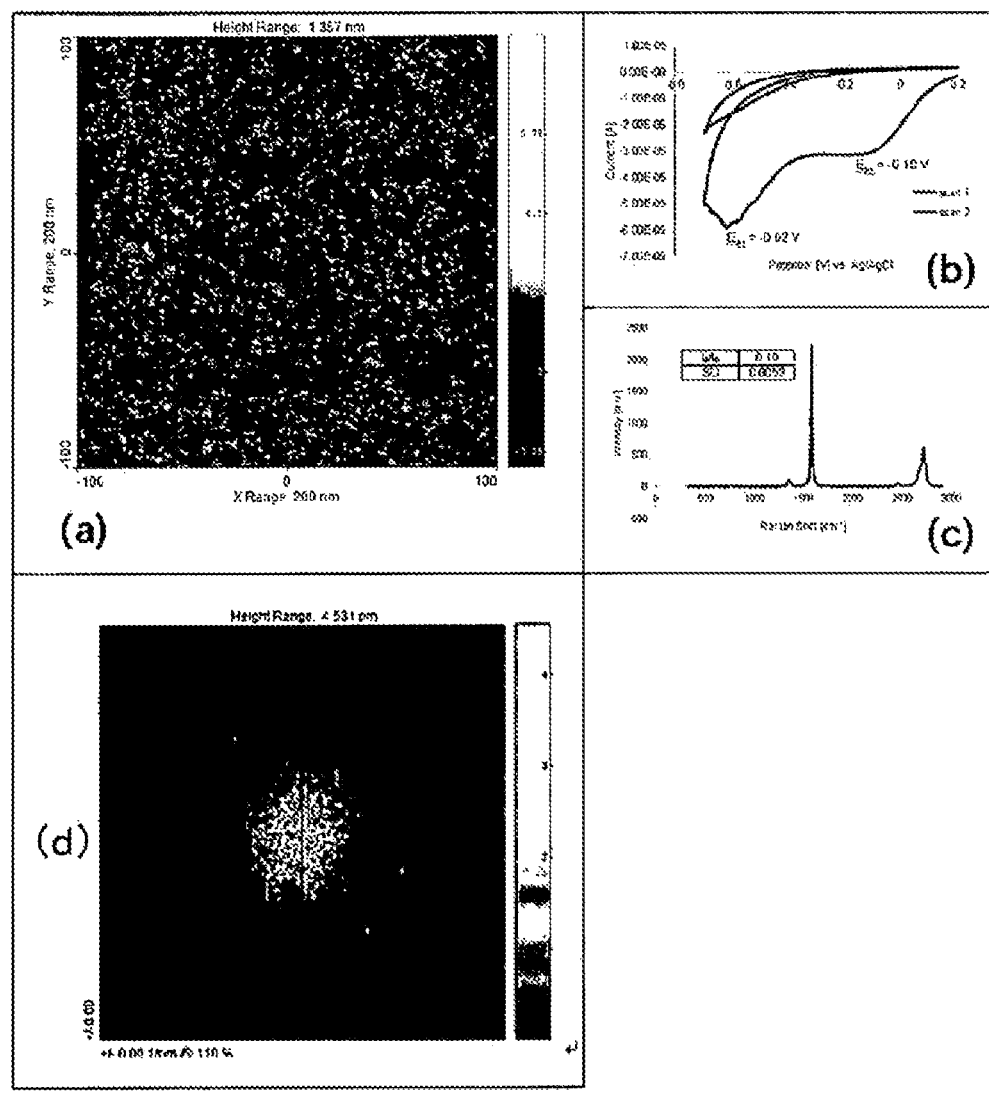

FIG. 17(a) is an STM observation image after the surface of a carbon material is chemically modified using H3BTB ((a) of FIG. 17(a)). (b) of FIG. 17(a) is a cyclic voltammogram. From the bottom, a first sweep wave and a second sweep wave are shown. (c) of FIG. 17(a) is Raman spectra data and (d) of FIG. 17(a) is a Fourier-transformed image.

Figure 17B:
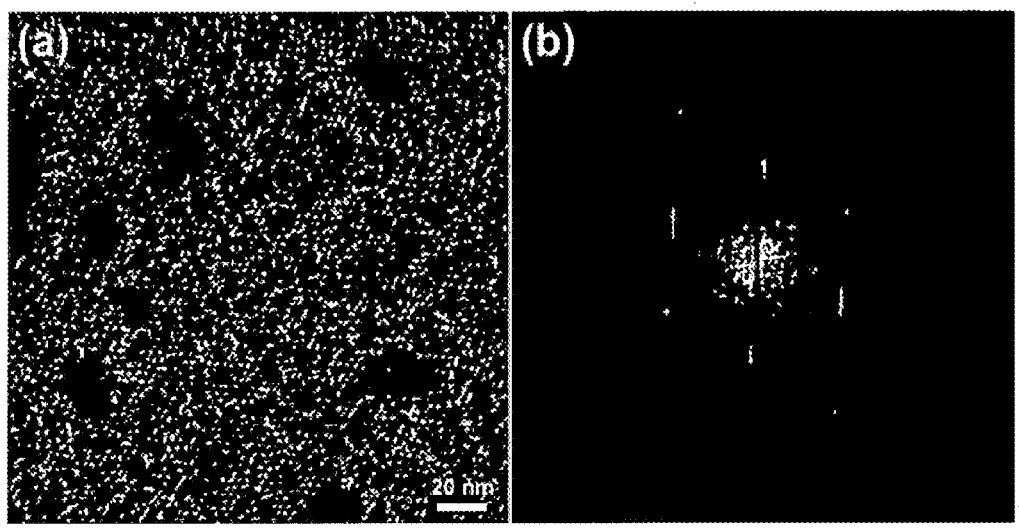

FIG. 17(b) is an STM observation image ((a) of FIG. 17(b)) and a Fourier-transformed image ((b) of FIG. 17(b)) after the surface of a carbon material is chemically modified using DBAOC6.

Figure 18:
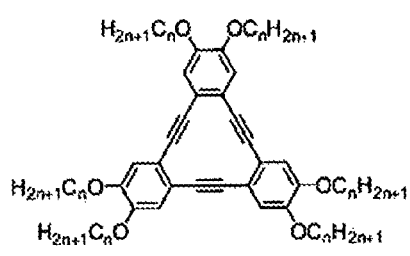

FIG. 18 is an illustration diagram of a modified example of the length of an alkyl side chain of DBA, which is a single unit of an assembly having hexagonal holes.

Figure 19:
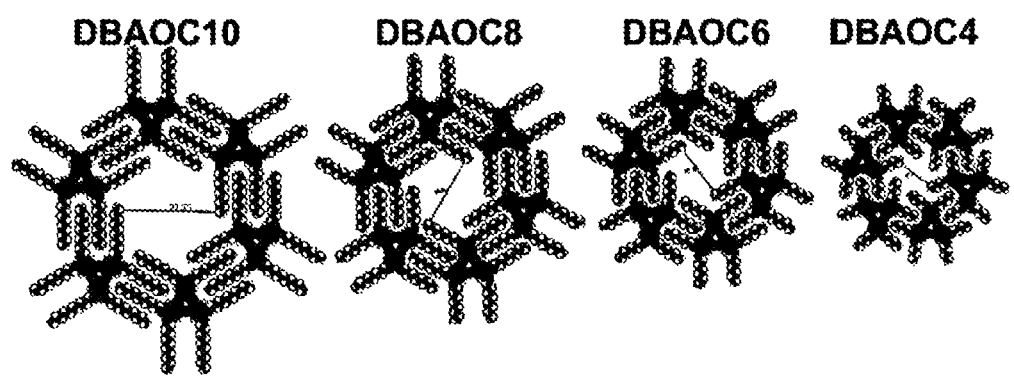

FIG. 19 is structural schematic views of DBAOC4 to DBAOC10 which can form an assembly.

Figure 20:
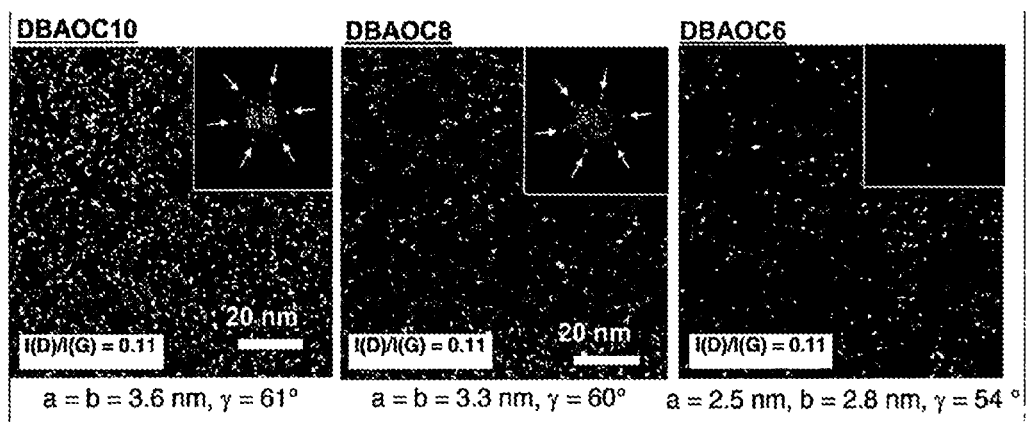

FIG. 20 is STM observation images and Fourier-transformed images of DBAOC10, DBAOC8, and DABOC6 exhibiting a periodicity.

Figure 21:
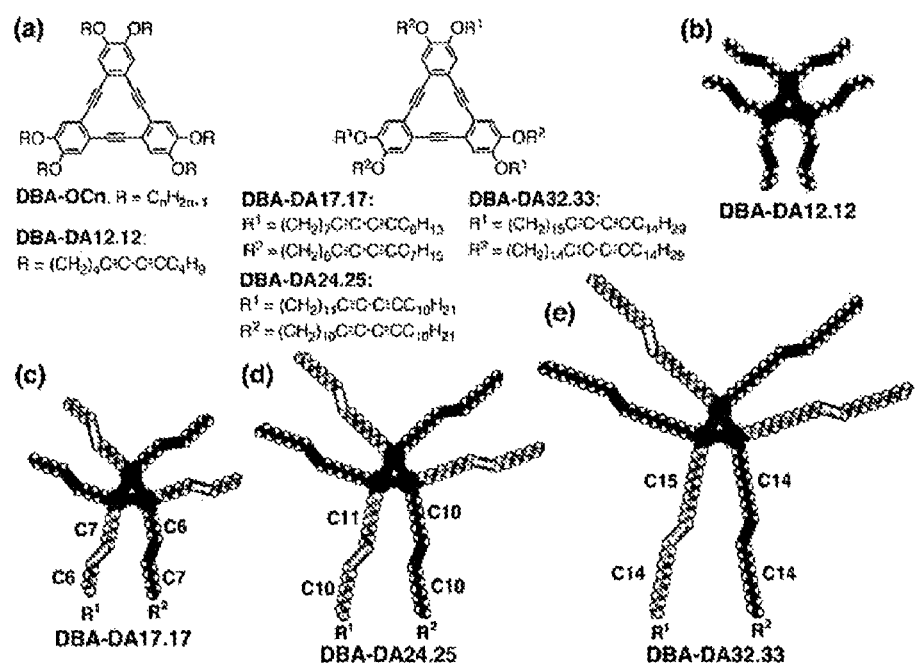

FIG. 21 is schematic views showing the structures of known organic compound groups which can be applied to the present invention. (a) of FIG. 21 is an illustration diagram showing the names and chemical formulae of single units having different branch lengths in a DBA-DA compound group as an example of the above organic compounds other than DBAOCn. (b) to (e) of FIG. 21 are structural schematic views of four kinds of organic compounds in DBA-DA12,12 to DBA-DA32,33.

Figure 22:
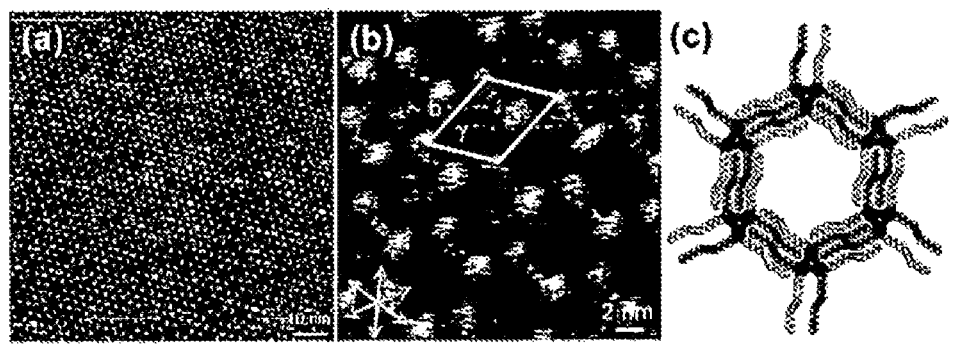

(a) of FIG. 22 is a wide-area STM image. (b) of FIG. 22 is an STM observation image. (c) of FIG. 22 is a structural schematic view of an assembly formed by assembling six organic compounds (single units).

Figure 23:
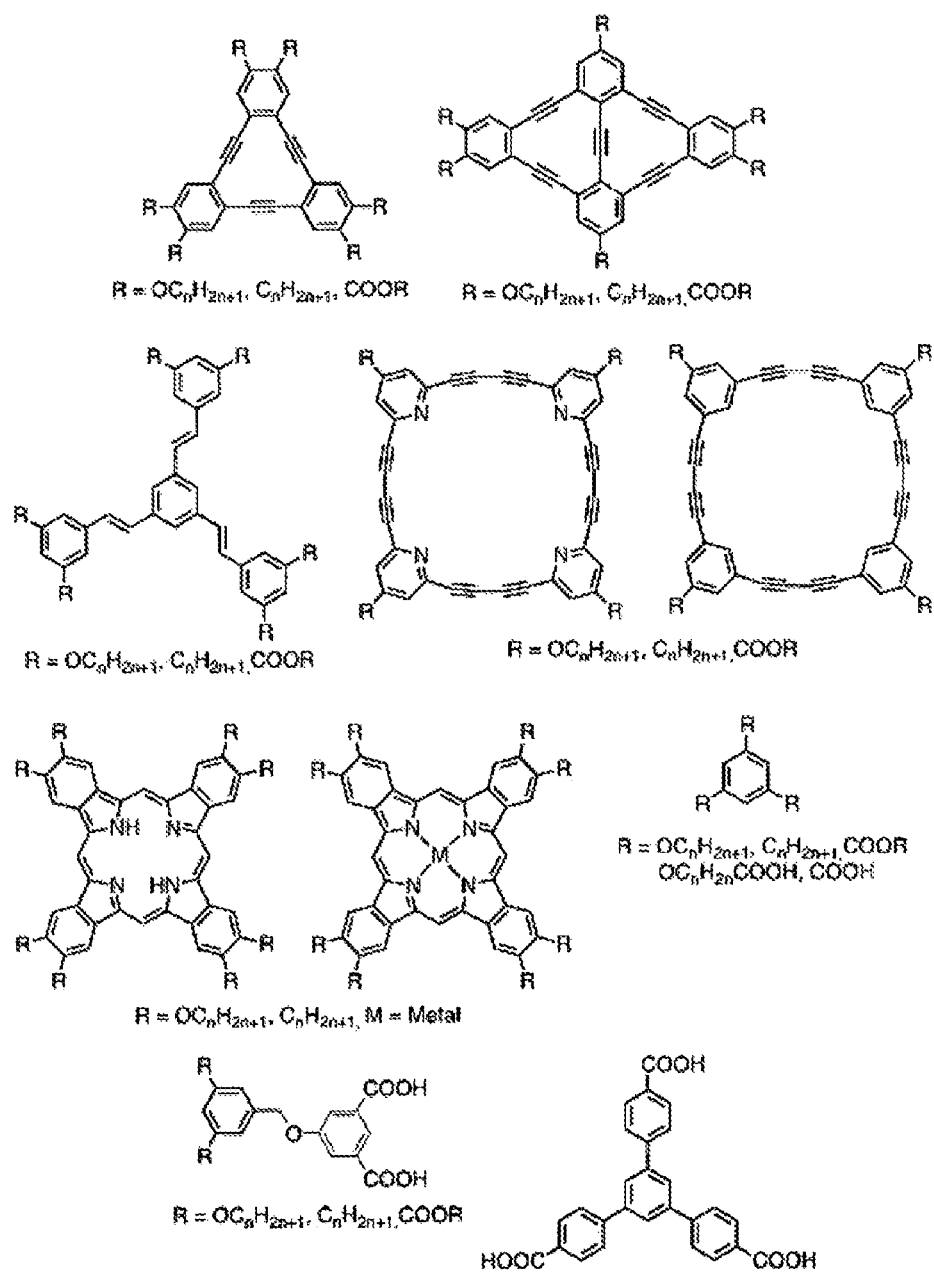

FIG. 23 is illustration diagrams showing the structures of another organic compound groups capable of forming a two-dimensional periodic structure. In the structural formula, n is an arbitrary integer.

Figure 24:
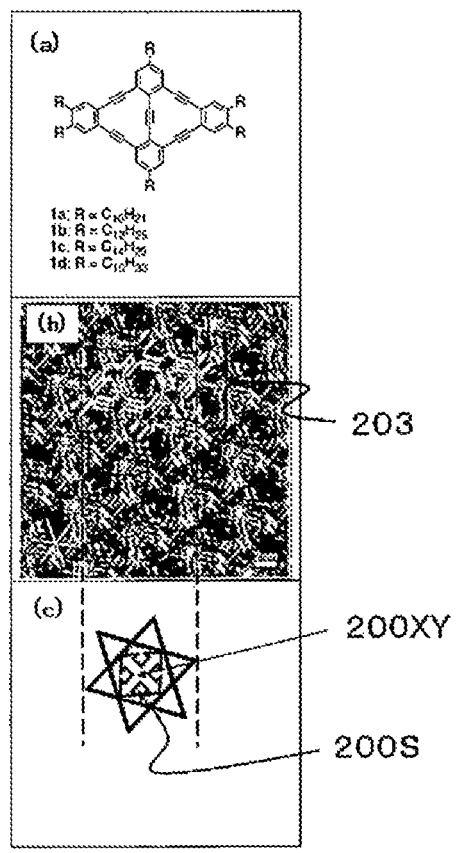

FIG. 24 is an illustration diagram in the case of a star regular hexagonal shape as an example of a two-dimensional periodic structure. (a) of FIG. 24 shows the chemical structural formula of an organic compound constituting a single unit; (b) of FIG. 24 shows the STM observation image of a thin film; and (c) of FIG. 24 is illustration diagram showing the position of a Kagome structure of the STM observation image.

Figure 25:
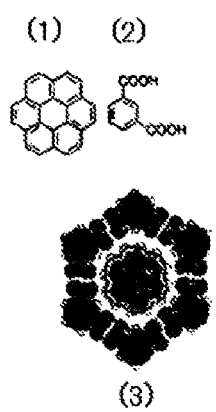

FIG. 25 is illustration diagrams showing compounds capable of forming a two-dimensional periodic structure assembly having a double annular structure.

Figure 26:
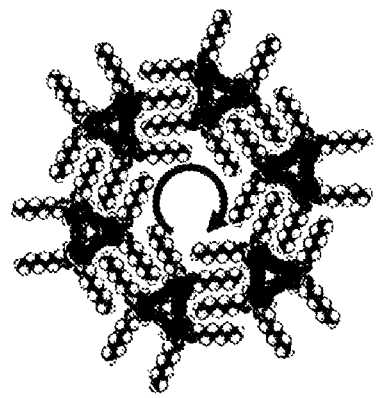
Figure 26:
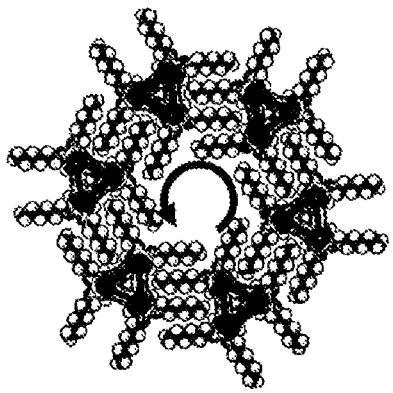

FIG. 26(a) is a diagram showing a clockwise (CW) structure in an assembly formed by assembling 6 molecules of DBAOC6 on the surface, and FIG. 26(b) is a diagram showing a counterclockwise (CCW) structure in an assembly formed by assembling 6 molecules of DBAOC6 on the surface.

Figure 27:
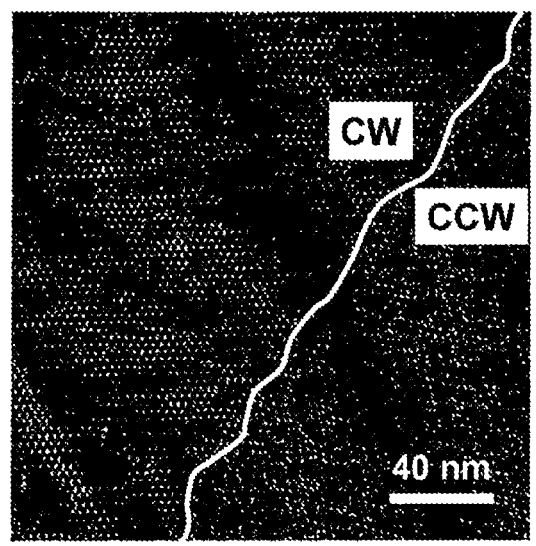
Figure 27:
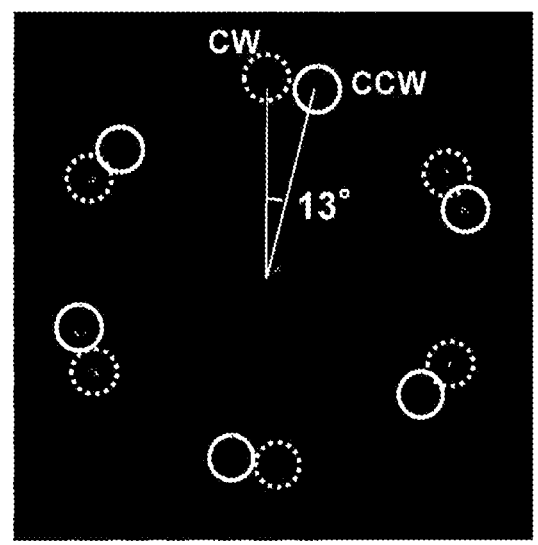

FIG. 27(a) is an STM image in the vicinity of the domain boundary of a honeycomb structure formed by DBAOC6, and FIG. 27(b) is a Fourier-transformed image of the STM image in the vicinity of the domain boundary of the honeycomb structure formed by DBAOC6.

Figure 28:
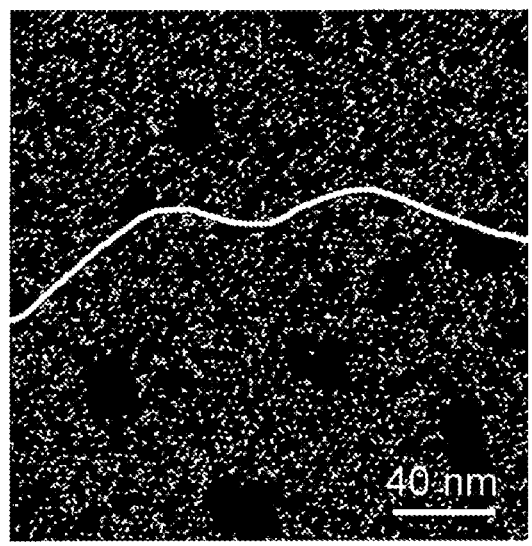
Figure 28:
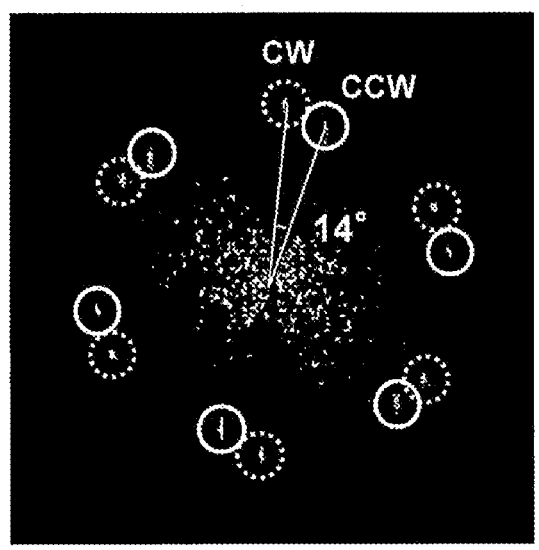

FIG. 28(a) is an STM image of the surface of modified graphite obtained by chemically modifying graphite with an aryl group using DBAOC6 as a template, and FIG. 28(b) is a Fourier-transformed image of the surface of modified graphite obtained by chemically modifying graphite with an aryl group using DBAOC6 as a template.

Figures 29, 30:
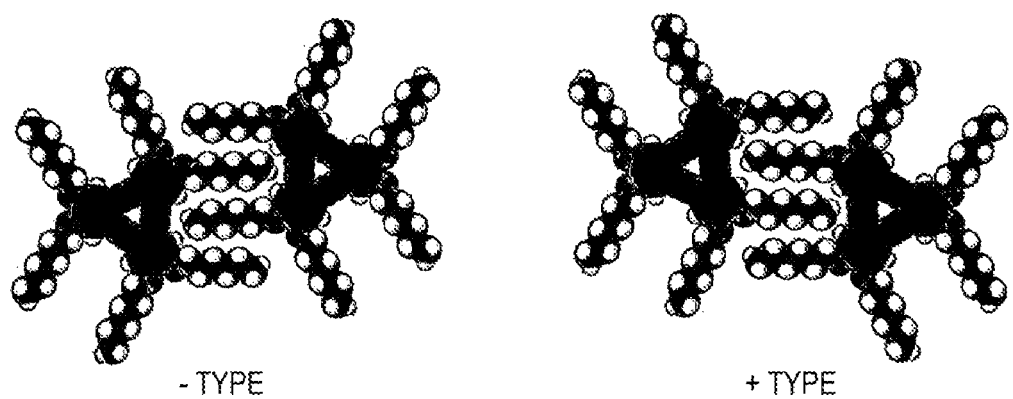

FIG. 29 is a diagram showing the relative arrangement aspect of two molecules of DBAOC6 on the surface.

FIG. 30 is a schematic showing the Fourier-transformed images and the surface-modified states of one-dimensional periodicity and two-dimensional periodicity (honeycomb-shaped).

DETAILED DESCRIPTION OF THE INVENTION

A surface-modified carbon material of the present invention is a surface-modified carbon material including a large number of chemical addends added to at least a part of a surface of a carbon material selected from the group consisting of graphene, graphite, a glassy carbon film, and film-like pyrolytic carbon, wherein a one-dimensional periodicity corresponding to a large number of addition positions of the chemical addends is observed in a Fourier-transformed image of a scanning probe microscopic image of the surface. It is generally known that the case where no periodicity is present in the Fourier-transformed image is the case where the Fourier-transformed image has a featureless halo pattern.

As the surface-modified carbon material of the present invention, the carbon material selected from the group consisting of graphene, graphite, a glassy carbon film, and film-like pyrolytic carbon is used. The surface-modified carbon material is obtained by adding a large number of chemical addends to at least a part of the surface of graphene or the like so as to exhibit a predetermined periodicity.

Graphene and graphite are carbon materials having a hexagonal lattice structure in which $sp^2$-bonded carbon atoms are bonded in a honeycomb shape. That is, the surface-modified carbon material of the present invention is a novel carbon material obtained by bonding chemical addends to $sp^2$-bonded carbon atoms constituting the above carbon material. A substrate made of, for example, $SiO_2$ or SiC or the like may be used as a base film of the carbon material.

In the surface-modified carbon material of the present invention, the carbon atoms to which the chemical addends are bonded are spa-bonded carbon atoms. In other words, the surface-modified carbon material of the present invention is a carbon material obtained by introducing spa-bonded carbon atoms into the surface of a carbon material such as graphene composed of $sp^2$-bonded carbon atoms. From the viewpoint of graphene and graphite having a chemically modified surface, the surface-modified carbon material is a carbon material containing "defects" of spa bonded carbon atoms.

Figure 1A:
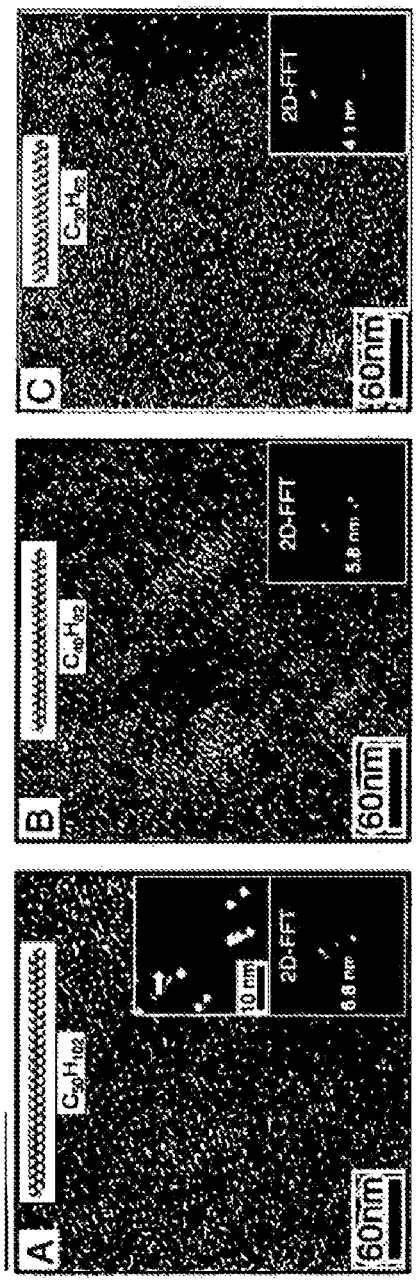
FIG. 1(a) is STM observation images of a surface-modified carbon material formed using a thin film exhibiting a one-dimensional periodicity according to the present invention. A lower right image of each of the STM observation images (square frame) is a Fourier-transformed image of the STM observation image. A photograph A is the case of $C_{50}H_{102}$; a photograph B is the case of $C_{40}H_{82}$; and a photograph C is the case of $C_{30}H_{62}$.

In the surface-modified carbon material of the present invention, the periodicity based on the large number of addition positions of the chemical addends, in other words, a periodicity corresponding to spa-bonded carbon atoms or defects is observed in a one-dimensional direction in the Fourier-transformed image of the observation image of the scanning probe microscope (SPM) of the surface (see FIG. 1(a)).

"The periodicity is observed in a one-dimensional direction" means that, in the Fourier-transformed image, the number of vector directions in which a periodicity appears is only one, and is not two or more. In the present invention, "the periodicity is observed in a two-dimensional direction" means that, in the Fourier-transformed image, the number of vector directions in which a periodicity appears are two or more. In the present invention, for example, the length direction of a channel when a carbon material having a chemically modified surface is formed as an electronic device is considered to be used as the reference of the direction when the periodicity is determined.

In an image obtained by Fourier transforming an STM observation image, light spots corresponding to a periodicity in a sample appear. For example, if the chemical modification of the sample has a one-dimensional periodicity, a reference axis of the Fourier-transformed image may be either the X-axis or the Y-axis of an image, but if the reference axis is assumed to be the X-axis, strong light spots are observed at symmetrical positions on the X axis with respect to the origin. In addition, when a light spot having low brightness appears, a double or triple period is exhibited at a position farther from the origin in a vector direction connecting light spots having high brightness from the origin of the Fourier-transformed image.

In the case of a two-dimensional periodicity, generally, light spot groups having a symmetry are observed on the X axis and the Y axis around the origin. When the surface of a carbon material is modified using a template which is continuously aligned on a plane with a periodic assembly as a unit, light spots having a rotational symmetry around the origin are observed in the Fourier-transformed image of the STM image. For example, in the Fourier-transformed image of the STM observation image of a carbon material having a surface modified so as to correspond to a template having a honeycomb shape, light spots located at least at the apexes of a hexagon around the origin are necessarily observed as the basic unit.

When two intersections on the X axis are strongly exhibited and other thin intersection is observed at a two-dimensional periodic position, the intersections are determined to correspond to one having a two-dimensional periodicity as a whole. The most basic case is schematically shown in FIG. 30. In the case of honeycomb-shaped two-dimensional periodic alignment, the light spot group of the Fourier-transformed image has a rotational symmetry of 60 degrees, but the six-member ring alignment of the carbon material is set to an armchair structure or a zigzag structure along a channel, so that the appearance of the light spot in the Fourier-transformed image is different by 30 degrees. Dashed arrows in FIG. 30 mean the directions of the channel.

The scanning probe microscope which can be applied in the present invention is not particularly limited, and examples thereof include a scanning tunneling microscope (STM) and an atomic force microscope (AFM). In Examples which will be described later, the surface of the carbon material is observed using the scanning tunneling microscope (STM).

Figure 1B:
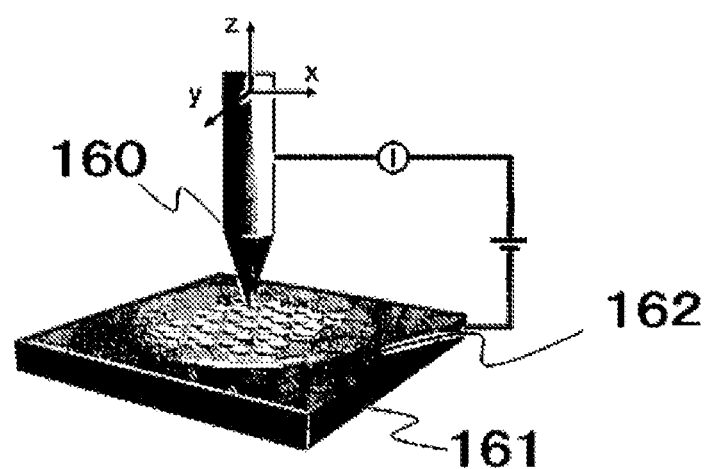
FIG. 1(b) is an illustration diagram of STM observation in a liquid.

The STM is a type of SPM which detects a tunnel current flowing even in a noncontact manner due to a tunnel effect operated at a close distance between a probe and a sample. FIG. 1(b) shows the schematic configuration of the STM. A voltage is applied to a sample 162 placed on a conductive substrate 161, whereby the surface of the sample can be three-dimensionally observed by a probe 160. As the probe used is sharper, the resolution of the probe is improved. A single atom or single molecule probe is generally used for atomic level observation.

In STM observation, atomic resolution can be obtained in ultra-high vacuum, and molecular resolution can be obtained even in the air or a liquid. In the present invention, the STM is used in order to obtain a real space image of the surface state or atomic structure or the like of the carbon material with high spatial resolution, and to specify the locations of adducts on the surface of the carbon material to detect the alignment state of the adducts on the entire surface.

In the present invention, in order to chemically modify the surface of the carbon material, a thin film formed of an organic compound which covers the surface is used. Using the thin film as a mask, chemical addends are caused to react with the surface of the carbon material at the positions of holes of the thin film. As a result, the addition positions of the chemical addends can be controlled in the surface. In the present invention, it is possible to use a thin film in which the alignment of voids (grooves) or a large number of holes present in the surface exhibits a one-dimensional periodicity or a two-dimensional periodicity.

In the one-dimensional periodicity, a period between molecular arrays constituting the thin film corresponds to a one-dimensional period, as can be read from the STM observation image. In contrast, a period parallel to the molecular arrays is random. That is, a period is present only in one vector direction. Meanwhile, in the two-dimensional periodicity, a periodicity is exhibited in two or more vector directions.

The Fourier-transformed image is an image obtained by subjecting the surface of the surface-modified carbon material to STM observation and Fourier transforming the obtained observed image. The Fourier-transformed image makes it possible to confirm the periodicity corresponding to the addition positions of the large number of the chemical addends in the surface-modified carbon material.

The STM observation is performed by the following technique. A surface-modified sample is subjected to the STM observation using a scanner which can observe one step of graphite within a range of about 100 pm to 500 pm at the interface between an organic solvent and graphite (carbon material) used in an electrochemical method which will be described later. The obtained STM image is subjected to tilt correction by SPIP image analysis software (registered trademark), and then subjected to FFT processing to evaluate the periodicity of the adducts. In the FFT processing, it is not necessary to set a threshold value for detecting the light spots. This is because the period of the above portions having a relatively high height, that is, portions of aryl groups added to the surface of the carbon material is reliably detected.

In this case, in Examples which will be described later, the height of an alkane used as the template is observed to be about 50 pm, and the height of the aryl groups is observed to be about 200 to 250 pm. Also in the case of DBA used as the template in other Examples, the height of the DBA can be measured to be about 50 pm, and the height of the aryl groups can be measured to be about 200 to 250 pm.

Alternatively, when it is necessary to detect individual adducts, a technique of detecting a component at a position higher than the height of a template molecule of an alkane or DBA or the like, that is, the surface of the carbon material is considered. Furthermore, when an effective value for a difference in height between the chemical addend and the template is required, for example, by the above calibrated scanner, an apparent height which is a threshold value for measurement can also set to 100 pm or more. The difference means a difference in height with the surface of the carbon material (graphite) itself when the surface is modified by using a shaving method which will be described later. For example, in the calibrated scanner, the difference is assumed to be about 500 pm to 2000 pm (see Non-Patent Literature 11 (Greenwood et. al.)).

The periodicity observed in the Fourier-transformed image has a pitch of 2 to 10 nm in the case of a one-dimensional periodic structure, for example. FIG. 1(a) shows STM observation images of thin films formed by using three types of alkanes having a one-dimensional periodic structure according to the present invention, and images in the lower rights of the STM observation images (square frame) contrastively show the Fourier-transformed images of the STM observation images.

In FIG. 1(a), an STM observation image A is the case where an organic compound used is $C_{50}H_{102}$. An STM observation image B is the case where an organic compound used is $C_{40}H_{82}$. An STM observation image C is the case where an organic compound used is $C_{30}H_{62}$.

The periodicities of the STM observation images are 6.8 nm, 5.8 nm, and 4.1 nm in the order of the STM observation images A, B, and C. That is, the length of one side of a film unit (block) is first determined by the number of carbon atoms of the organic compound (alkane) used and the physical size (molecular length) of the straight chain. Next, the one-dimensional periodicity of the alignment of the large number of chemical addends is considered to be formed in association with the alignment of the block and the position of the groove.

That is, in one aspect of the surface-modified carbon material of the present invention, the addition positions of the large number of chemical addends in the surface-modified carbon material, in other words, spa-bonded carbon atoms or defects are observed at a period of 2 to 10 nm in the one-dimensional direction in the Fourier-transformed image. The periodicity is preferably 2 to 9 nm. The confirmation of the periodicity by the Fourier-transformed image will be described in detail in Examples.

A method for producing a surface-modified carbon material having such a periodicity will be described later.

The chemical addend is not particularly limited as long as it can be added to the surface of the carbon material such as graphene, and an aryl group is preferable from convenience in confirming the periodicity. Examples of the aryl group include groups represented by the following formula (1).

[Chemical Formula 6]

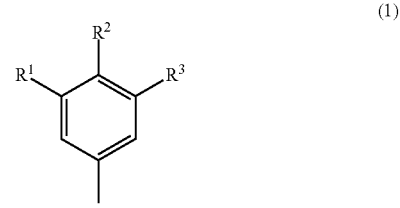

(1)

In the formula (1), $R^1$, $R^2$, and $R^3$ are each independently an alkyl group, an alkenyl group, an alkynyl group, an aryl group, OR, SOOH, SOONH$_2$, COOH, NO$_2$, COOR, SiR$_3$, H, F, Cl, Br, I, OH, NH$_2$, NHR, CN, CONHR, or COH, and R is an alkyl group, an alkenyl group, an alkynyl group, an aryl group, or a halogen substitution product thereof.

Examples of the alkyl group include a methyl group, an ethyl group, a propyl group, and a butyl group.

In the surface-modified carbon material of the present invention, it is preferable that a G band and a D band appear in the Raman spectra of the surface. Furthermore, in the surface-modified carbon material in which the chemical addends are added to at least a part of the surface of graphene, Id/Ig between the intensity Ig of the G band and the intensity Id of the D band is preferably 0.2 to 5.0, more preferably 0.3 to 4.0, and still more preferably 0.5 to 3.0.

In Non-Patent Literature 10 (Lian et. al.) above, the relationship between the density (distance) of $sp^3$ carbon in graphene and the value of Id/Ig is described. For example, if the distance between the $sp^3$ carbons is 5 nm, the value of Id/Ig is 2.9. It is also described that the modification of a certain density or higher stops the increase in the value of Id/Ig.

Next, in the surface-modified carbon material in which the chemical addends are added to at least a part of the surface of graphite, Id/Ig between the intensity Ig of the G band and the intensity Id of the D band is preferably 0.01 to 0.11, more preferably 0.01 to 0.08, and still more preferably 0.01 to 0.06. The surface-modified carbon material having Id/Ig within the above range has sufficient chemical addends, and can be effectively utilized as a novel carbon material. The chemical addends (adducts) added to the surface of the carbon material in the present invention can hold and maintain the added state even at an ambient temperature of about 200° C.

As an example of the method for producing a surface-modified carbon material of the present invention, a method may be mentioned, in which an alkane or an alkane derivative is deposited as a thin film having a one-dimensional periodic structure on at least a part of the surface of a carbon material selected from the group consisting of graphene, graphite, a glassy carbon film, and film-like pyrolytic carbon, and a chemical modification compound is caused to react with the carbon material using the thin film as a mask to add chemical addends to the surface.

As the alkane or the alkane derivative, it is preferable to use a linear alkane having 15 to 80 carbon atoms, and preferably 16 to 60 carbon atoms, or a linear alkane derivative having 10 to 80 carbon atoms, and preferably 12 to 60 carbon atoms.

The chemical modification compound in the present invention means a group of compounds having a reactive group which is covalently bonded to carbon constituting planar alignment of 6-membered rings. In addition, it is important that the chemical modification compounds do not form a chemical bond forming a layer. In order to achieve dense chemical modification, the chemical modification compound preferably has a relatively small molecular structure which is not complicated in structure but has a spatial symmetry. In each of Examples and Comparative Examples which will be described later, one kind of organic compound is used, but a plurality of compounds can also be simultaneously used in combination as long as the intended action and effect of the chemical modification are not lost.

The "thin film having a one-dimensional periodic structure" is a thin film composed of three or more film units (blocks) formed by aligning molecules of a linear alkane or alkane derivative in parallel. In the thin film, the molecular chain of an alkane or the like contained in each of the blocks is arranged in series with the molecular chain of an alkane or the like contained in the adjacent block.

At this time, the respective blocks are formed so as to be spaced from each other. Thus, the molecular chains of alkanes or the like are periodically aligned in a molecular chain direction, that is, in a one-dimensional direction. The thin film may be a unimolecular film made of an alkane or alkane derivative, or may be a multimolecular film in which two or more unimolecular films are laminated. The unimolecular film is preferable from the viewpoint of easiness of a reaction between the chemical modification compound and the carbon material. The thin film is, for example, a lamella type unimolecular film.

In order to align linear molecules of the alkane or the like in a predetermined manner, a slight flow may be caused in a solution containing the alkane or the like to naturally cause the alignment of the molecular chains which can be self-aligned along the flow direction. Alternatively, by processing a surface into a rectangular shape and the like outside a region to be formed, by a physical method to form a template in advance, the formation of the block of the molecular chains can also be induced along the inner shape of the template.

The linear alkane having 15 to 80 carbon atoms, which can be used in the present invention is not particularly limited, and any alkane can be used. Specific examples thereof include triacontane having 30 carbon atoms, tetracontane having 40 carbon atoms, and pentacontane having 50 carbon atoms. A linear alkane having 14 or less carbon atoms has a weak adsorption force, so that it is not appropriate to use the unimolecular film of the linear alkane as the mask in many cases, and periodic modification cannot be expected. A linear alkane having 81 or more carbon atoms has a too strong adsorption force, so that a modification rate is lowered in many cases.

Even if the number of carbon atoms is less than 15 in the alkane derivative, a strong intermolecular force can be obtained depending on the type of a functional group, which makes it possible to form a unimolecular film suitable as the mask, whereby, when the number of carbon atoms is 10 or more, compounds which can be used are present. The linear alkane having 15 to 80 carbon atoms and the linear alkane derivative having 10 to 80 carbon atoms can be represented by, for example, the following formula (2).

[Chemical Formula 7]

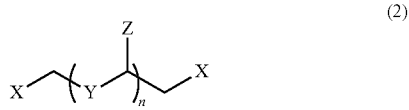

(2)

X represents H, $CH_3$, $CF_3$, $CH=CH_2$, $C\equiv CH$, an aryl group, F, Cl, Br, I, OH, SH, $NH_2$, COH, or COOH. Y represents one or more $CH_2$, $CF_2$, $CH=CH$, $C\equiv C$, aryl group, O, S, NH, CO, COO, CONH, NHCO, or NHCHX present in the molecule. Z represents one or more H, $CH_3$, aryl group, OH, SH, NH$_2$, COH, COOH, COOX, CONH, NHCOX, or NHCHX present in the molecule.

n is an integer satisfying a condition in which the number of carbon atoms in the formula (2) is 15 to 80 in the alkane, and 10 to 80 in the alkane derivative. In the formula (2), n Ys may be the same or different, and n Zs may also be the same or different.

The chemical modification compound is a compound which reacts with the surface of the carbon material such as graphene to induce the chemical addends added to the surface. The chemical modification compound is not particularly limited as long as it can react with the carbon material such as graphene to add the chemical addends to the surface of the carbon material such as graphene. At this time, an aryl compound is preferable from the viewpoint of convenience in confirming the periodicity of the added chemical addends. Examples of the aryl compound include compounds represented by the following formula (3).

[Chemical Formula 8]

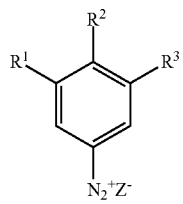

(3)

wherein: R$^1$, R$^2$, and R$^3$ are each independently an alkyl group, an alkenyl group, an alkynyl group, an aryl group, OR, SOOH, SOONH$_2$, COOH, NO$_2$, COOR, SiR$_3$, H, F, Cl, Br, I, OH, NH$_2$, NHR, CN, CONHR, or COH (R is an alkyl group, an alkenyl group, an alkynyl group, or an aryl group); and Z is a halogen atom, BF$_4$, BR$_4$, or PF$_6$ (R$_4$ is an alkyl group, an alkenyl group, an alkynyl group, an aryl group, or a halogen substitution product thereof).

Specific examples of the compound represented by the formula (3) include 3,5-di-tert-butylbenzenediazonium chloride (TBD), 3,4,5-trialkoxybenzenediazonium chloride, and 4-nitrobenzenediazonium chloride (NBD).

The reaction of TBD with graphene and graphite proceeds as follows, for example.

[Chemical Formula 9]

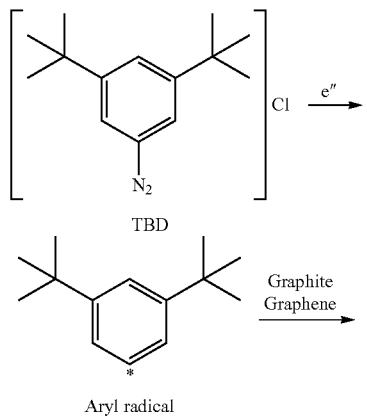

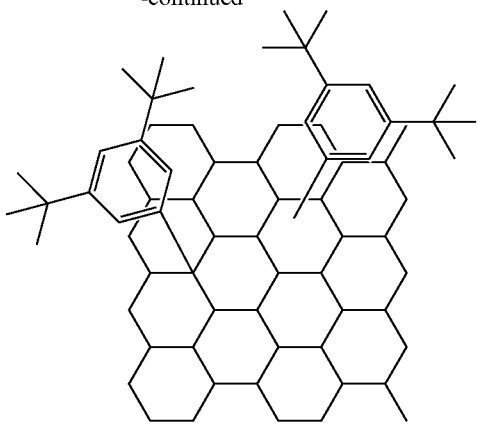

First, TBD is reduced to generate an aryl radical. The aryl radical is added to the surface of the carbon material such as graphene. The reaction provides a surface-modified carbon material in which chemical addends derived from TBD are added to the surface of the carbon material such as graphene. Carbon atoms to which the chemical addends derived from TBD are added become spa-bonded carbon atoms.

Figure 1C:
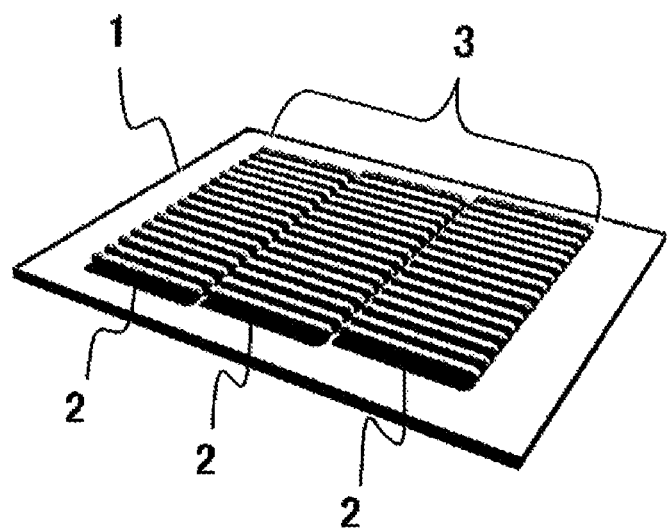
FIG. 1(c) is a schematic view showing a state where the surface of a carbon material is covered with a thin film composed of an alkane as an example of an organic compound.

FIGS. 1(c) and (d) are schematic views showing the method for producing a surface-modified carbon material. FIG. 1(c) shows a state where a linear alkane 2 is deposited as a thin film 3 having a one-dimensional periodic structure on the surface of a carbon material 1 which is graphene or graphite.

In FIG. 1(c), the thin film 3 is composed of three blocks (film units). In the thin film 3, the linear alkanes 2 are aligned in parallel to form blocks. The blocks are disposed at intervals so that the molecular chain of the linear alkane 2 included in each of the blocks is arranged in series with the molecular chain of the linear alkane 2 included in the adjacent block. That is, in the thin film 3, the linear alkanes 2 aligned in parallel are periodically aligned in a molecular chain direction, that is, in a one-dimensional direction.

Figure 1D:
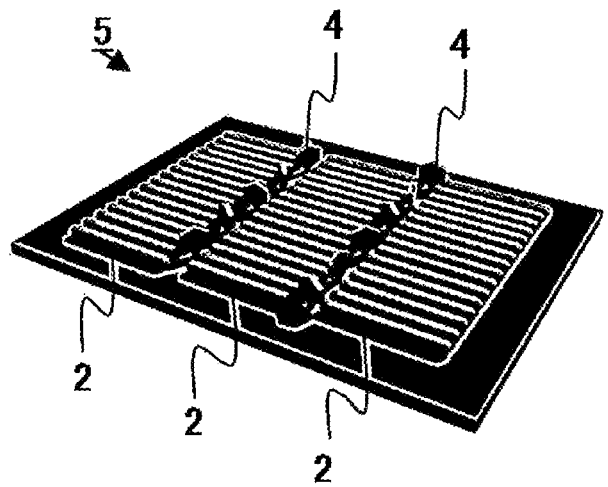
FIG. 1(d) is a schematic view showing a state where adducts are added to grooves of alignment of organic compounds covering the surface of a carbon material to form a surface-modified carbon material.

When the aryl compound as the chemical modification compound is caused to react with the carbon material 1 shown in FIG. 1(c), the thin film 3 functions as a mask. As shown in FIG. 1(d), the aryl radical derived from the aryl compound is added to the surface of the carbon material 1 so as to sandwich each of the blocks made of the linear alkane 2 between groove portions. The reaction provides a surface-modified carbon material 5 in which chemical addends 4 derived from the chemical modification compound are added to the surface of the carbon material 1.

As can be read from FIG. 1(d), in the method for producing a surface-modified carbon material, the addition positions of the large number of chemical addends 4 can be controlled by the thin film 3 used as a mask. The chemical addends 4 are added so as to sandwich the linear alkane 2 constituting the thin film 3. As a result, the chemical addends 4 are linearly added to the carbon material 1 in two or three or more rows at intervals corresponding to the molecular length of the linear alkane 2. That is, the addition positions of the chemical addends 4 have a periodicity in the molecular chain direction of the thin film 3 used as a mask, that is, in the one-dimensional direction.

Figure 1E:
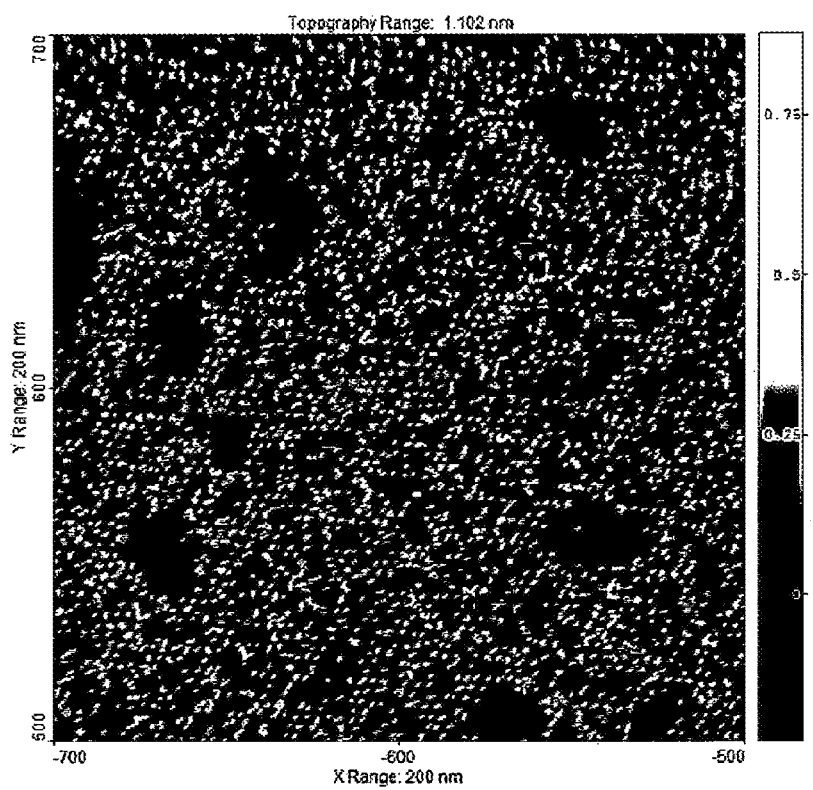
FIG. 1(e) is a photograph (low magnification) showing the surface of a surface-modified carbon material according to the present invention.

Thus, the addition positions of the large number of chemical addends have a predetermined periodicity on the surface. Therefore, in the Fourier-transformed image of the scanning probe microscope image of the surface of the surface-modified carbon material 5, a one-dimensional periodicity corresponding to the addition positions of the large number of chemical addends 4 is observed. FIG. 1(e) shows a photograph showing the surface of the surface-modified carbon material according to the present invention. The size of the field of view is 200 nm in an X direction, and 200 nm in a Y direction.

As described above, in the method for producing a surface-modified carbon material, a periodicity corresponding to the molecular length of the linear alkane or alkane derivative used can be obtained. That is, if an alkane or alkane derivative having a long molecular length is used, a long periodicity can be obtained, and if an alkane or alkane derivative having a short molecular length is used, a short periodicity can be obtained.

For example, when triacontane having 30 carbon atoms is used, a periodicity of about 3.5 to 4.5 nm can be obtained. When tetracontane having 40 carbon atoms is used, a periodicity of about 5.0 to 6.0 nm can be obtained. When pentacontane having 50 carbon atoms is used, a periodicity of about 6.5 to 7.5 nm can be obtained (see FIG. 1(a)).

In the method for producing a surface-modified carbon material, the amount of the chemical addends added to graphene and the like can be adjusted by increasing or decreasing the amount of the chemical modification compound caused to react with graphene and the like. It is preferable that the surface of graphene and the like, which is the carbon material, has a flat surface because modification with a high periodicity is likely to occur. Even a surface having irregularities can be subjected to periodic modification. However, when the chemical modification compound is caused to react with the surface having irregularities, the chemical modification compound first reacts with portions having large irregularities. If the irregularities of the surface are too large, the periodical modification is less likely to occur.

Figure 2A:
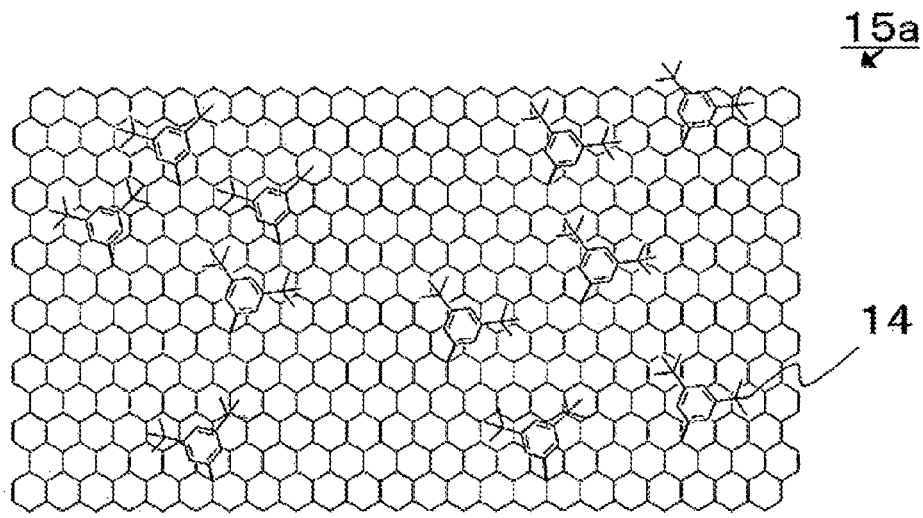
FIG. 2(a) is a schematic view showing a surface-modified carbon material obtained by a conventional method for producing a surface-modified carbon material.

FIGS. 2(a), (b), and (c) are schematic views of the surface-modified carbon material. FIG. 2(a) relates to a surface-modified carbon material according to the related art, and shows a surface-modified carbon material 15a obtained without using a thin film made of an alkane or the like as a mask. Chemical addends 14 are found to be randomly added to the surface of the carbon material.

Figure 2B:
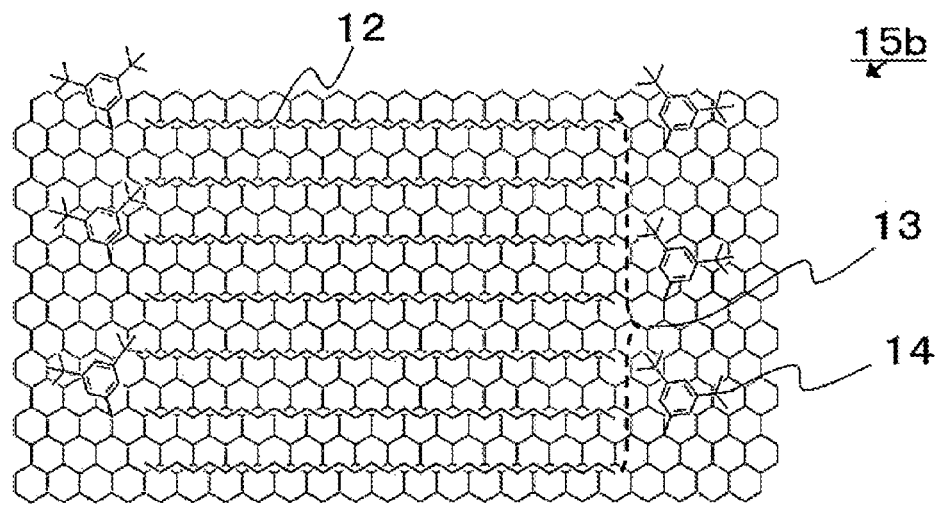
FIG. 2(b) is a schematic view showing a surface-modified carbon material obtained by a method for producing a surface-modified carbon material of the present invention.
Figure 2C:
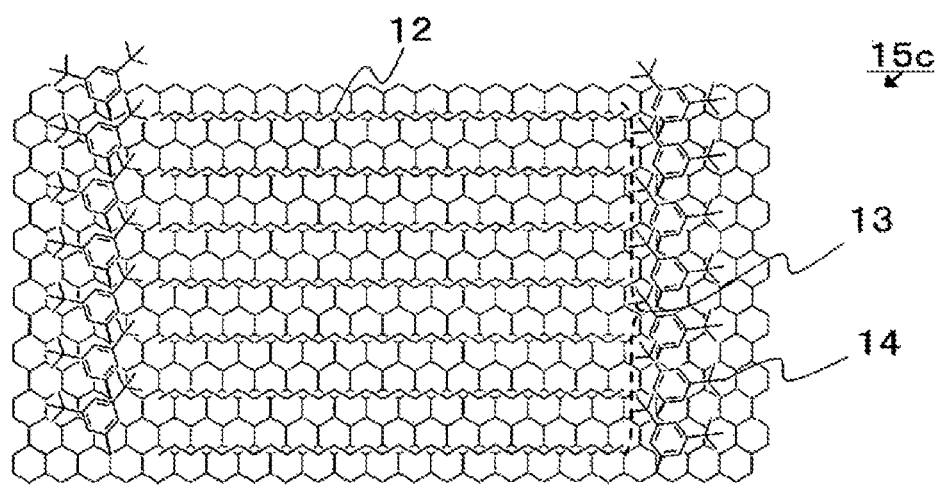
FIG. 2(c) is a schematic view showing a surface-modified carbon material (high-density type) obtained by a method for producing a surface-modified carbon material of the present invention.

FIGS. 2(b) and 2(c) relating to the surface-modified carbon material according to the present invention show surface-modified carbon materials produced by using a thin film made of an alkane or the like as a mask. The surface-modified carbon materials shown in FIGS. 2(a), (b), and (c) are surface-modified carbon materials produced by causing graphene or graphite to react with TBD.

The surface-modified carbon material 15a shown in FIG. 2(a) has a large number of chemical addends 14, but the addition positions of the chemical addends 14 are not controlled. The addition positions in the in-surface direction of the chemical addends 14 are random, and have no periodicity. Therefore, in the Fourier-transformed image of the scanning tunneling microscope image of the surface of the surface-modified carbon material 15a, a periodicity corresponding to the addition positions of the chemical addends 14 is not observed.

Both a surface-modified carbon material 15b shown in FIG. 2(b) and a surface-modified carbon material 15c shown in FIG. 2(c) are the most ideal materials produced by using a thin film 13 formed by aligning linear alkanes 12 in parallel as a mask, and a large number of chemical addends 14 are linearly added along grooves between blocks of the linear alkanes 12 constituting the thin film 13 so as to sandwich the linear alkanes 12.

That is, the large number of chemical addends 14 are added at intervals corresponding to the molecular length of the linear alkane 12. As a result, the addition positions of the large number of chemical addends 14 are controlled. In FIGS. 2(b) and (c), only one block (film unit) is shown. In FIGS. 1(c) and (d), the thin film 13 is schematically shown as having three blocks disposed on the surface of the carbon material.

Therefore, in the Fourier-transformed image of the scanning tunneling microscope image of the surface of each of the surface-modified carbon materials 15b and 15c, a periodicity corresponding to the addition positions of the large number of chemical addends 14 is observed. The period is a length corresponding to the molecular length of the linear alkane 12. The surface-modified carbon material 15c has the chemical addends 14 added thereto at a higher density than that of the surface-modified carbon material 15b. Dotted lines shown in FIGS. 2(b) and (c) indicate the alignment of the linear alkanes 12 constituting the thin film 13.

The present invention is not limited to the case where the alignment of the chemical addends can be visually recognized as being substantially linearly arranged on the STM observation image. For example, the present invention includes the case where the addition positions of the large number of chemical addends are disposed in a band-shaped region having a width of, for example, 2 to 3 nm, and preferably 1 to 2 nm in a predetermined direction exhibiting a periodicity. As long as portions to which the chemical addends are added macroscopically exhibit periodic alignment, the portions are naturally considered to be included in the present invention. The band-shaped region corresponding to the gap of the "mask" is, so to speak, an unstable region, but the shape on the surface may be linear or curved as long as the condition of the periodicity is not deviated.

In a direction perpendicular to the predetermined direction exhibiting the periodicity, that is, a direction perpendicular to the long axis direction of the alkane, the interval between the added chemical addends is more than about 1 nm, and the periodicity is not exhibited. Such a one-dimensional periodicity is spread over the entire grain of the thin film made of an alkane or the like at the maximum. The area of a typical grain is larger than about 1 $\mu m^2$.

The surface-modified carbon materials of FIG. 1(d) and FIG. 2(b) and FIG. 2(c) show a state where the thin film made of an alkane or the like used as a mask remains deposited on the surface of the carbon material. However, the thin film can be removed from the surface of the surface-modified carbon material. In some cases, the thin film can be left as it is without being removed as a protective layer for protecting the surface of the carbon material, provided that it does not affect device characteristics.

A specific example of the above method for producing a surface-modified carbon material is a method using an electrochemical cell (hereinafter, also referred to as an electrochemical method). The method using an electrochemical cell will be described with reference to FIGS. 3(a) to (g). The chemical modification compound is caused to electrochemically react with the carbon material using the above electrochemical cell to produce the surface-modified carbon material. As an electrolyte aqueous solution, an aqueous solution containing a chemical modification compound is used, and a liquid medium containing a compound exhibiting a periodic self-assembling property is disposed between a working electrode and the electrolyte aqueous solution. At this time, the electrolyte aqueous solution and the liquid medium are immiscible with each other.

Figure 3A:
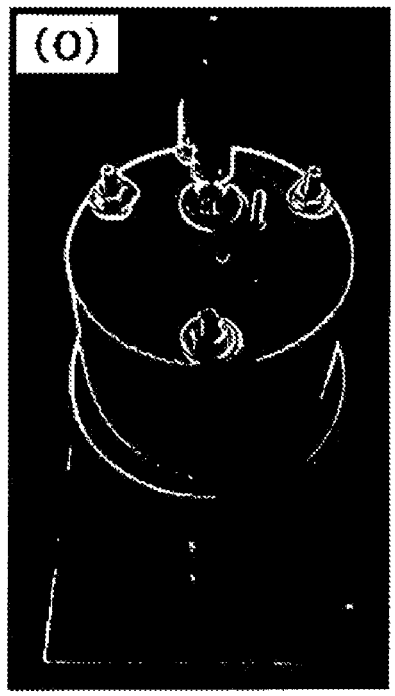
FIG. 3(a) is an appearance photograph of an example of an electrochemical cell used in a method for producing a surface-modified carbon material of the present invention. (O) of FIG. 3(a) is a photograph seen from an upward oblique direction; (S) of FIG. 3(a) is a photograph seen from a transverse direction; and (T) of FIG. 3(a) is a photograph seen from a directly above direction.
Figure 3A:
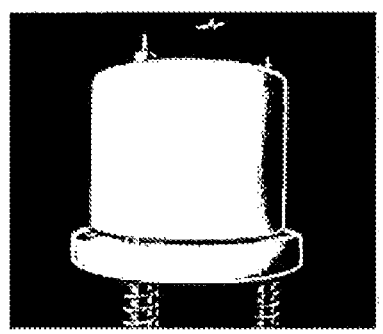
Figure 3A:
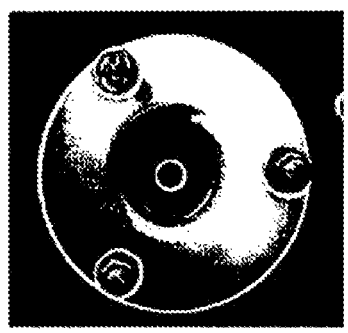
Figure 3B:
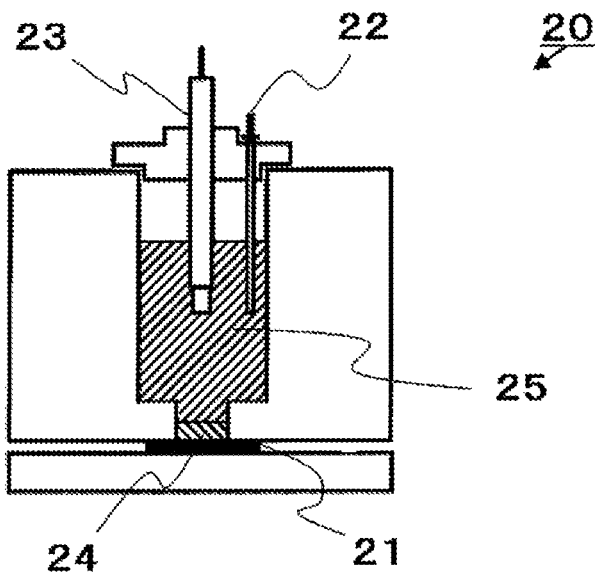
FIG. 3(b) is a schematic cross-sectional view showing a state where an electrochemical cell used in each of Examples and Comparative Examples is used.

First, FIG. 3(a) is an appearance photograph of an example of the electrochemical cell used in the method for producing a surface-modified carbon material. The material of a body of the electrochemical cell is, for example, PTFE. FIGS. 3(b) and (c) are schematic cross-sectional views of the electrochemical cell. FIGS. 3(d) to 3(g) are references from Non-Patent Literature 11 (Greenwood et. al.) above, and FIG. 3(d) shows a graph of voltage-current characteristics when a CV method is applied to the surface modification of the carbon material using NBD or TBD. FIGS. 3(e) and (f) are graphs comparatively showing the results of Raman spectra after surface modification with NBD and TBD. In the present invention, these techniques are directly or indirectly utilized as basic producing elements.

Figure 3C:
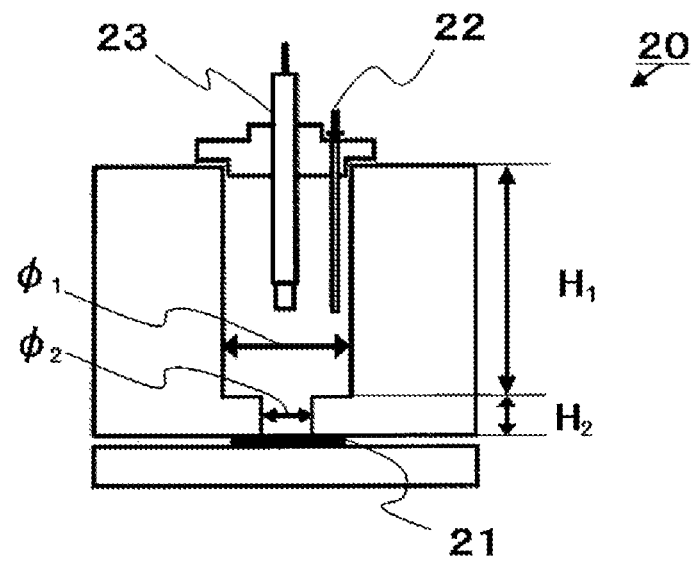
FIG. 3(c) is a schematic cross-sectional view showing the size of each of parts of the electrochemical cell.
Figure 3D:
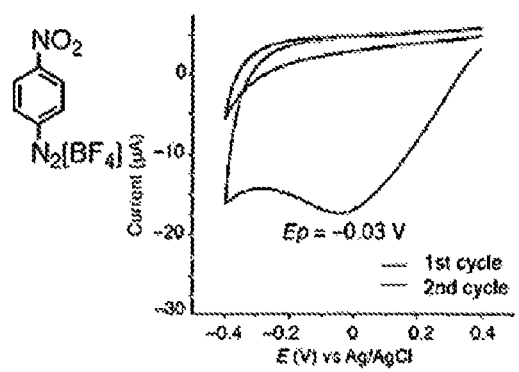
FIG. 3(d) is an experimental result according to the related art (referenced figure from Non-Patent Literature 11 (Greenwood et. al.)), and is a graph of voltage-current characteristics by a CV method when NBD and TBD are used as chemical addends. (1) of FIG. 3(d) is the case of NBD and (2) of FIG. 3(d) is the case of TBD. From the bottom, a first sweep wave and a second sweep wave are shown.
Figure 3D:
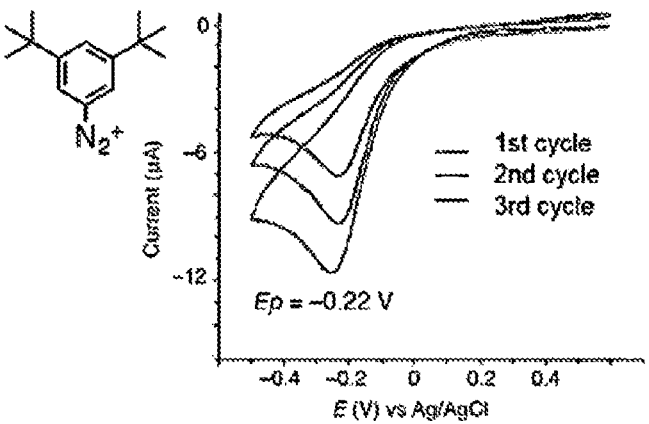
Figure 3E:
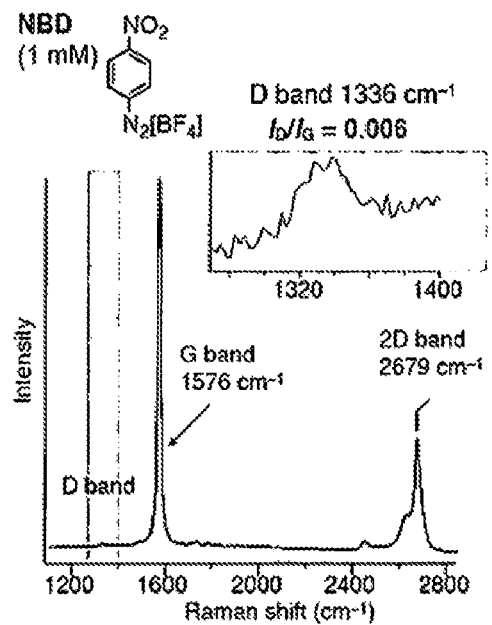
FIG. 3(e) is an experimental result according to the related art (referenced figure from Non-Patent Literature 11 (Greenwood et. al.)), and is a graph of Raman spectra when NBD is used as chemical addends.
Figure 3F:
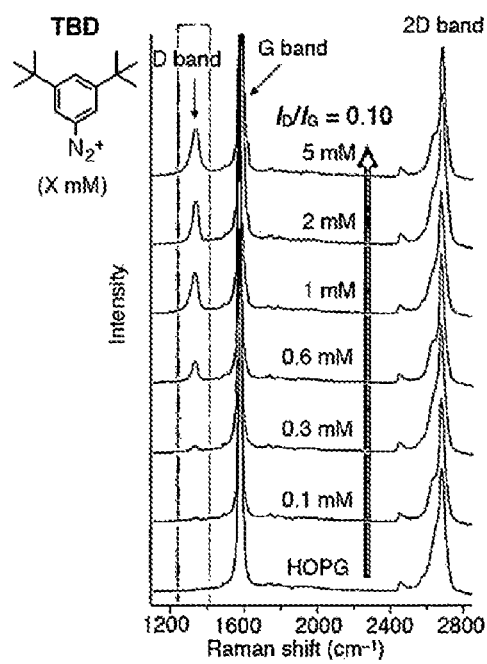
FIG. 3(f) is an experimental result according to the related art (referenced figure from Non-Patent Literature 11 (Greenwood et. al.)), and is a graph of Raman spectra when TBD is used as chemical addends.
Figure 3G:
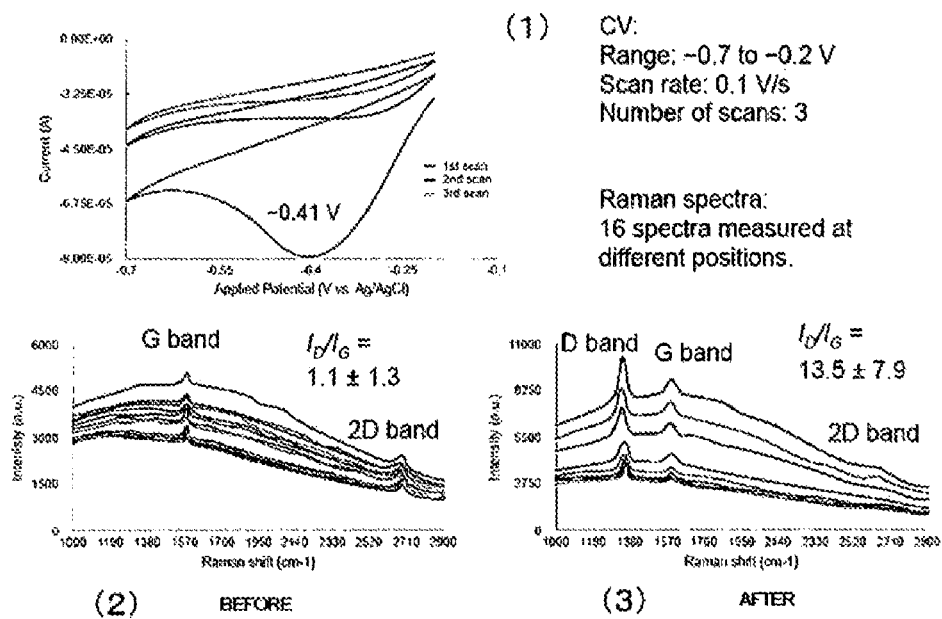
FIG. 3(g) is an experimental result according to the related art (referenced figure from Non-Patent Literature 11 (Greenwood et. al.)), and is an illustration diagram showing a surface chemical modification method of a carbon material by cyclic voltammetry. (1) of FIG. 3(g) is a graph showing an applied voltage waveform during the sweep of a CV method. (2) of FIG. 3(g) is a graph showing Raman spectra before sweep by a CV method. (3) of FIG. 3(g) is a graph of Raman spectra after sweep by a CV method. From the bottom, a first sweep wave, a second sweep wave, and a third sweep wave are shown.

FIG. 3(g) is a graph showing voltage-current characteristics when a reduction treatment is performed by cyclic voltammetry (CV method) for chemical modification using TBD, and a graph showing Raman spectra before and after a treatment by the CV method.

(1) of FIG. 3(g) shows voltage-current characteristics during three sweeps, and shows the first, second, and third sweeps in order from the lower side of a curve line intersecting a vertical axis. In the first sweep, most of the electrochemical reaction, that is, the reduction reaction of an aryl diazonium salt proceeds, and the current decreases as the number of sweeps increases, which means that the reaction tends to be completed. (2) and (3) of FIG. 3(g) show Raman spectra before and after modification.

An electrochemical cell 20 shown in FIGS. 3(b) and (c) includes a working electrode 21, a counter electrode 22, and a reference electrode 23. The working electrode 21 is graphene or graphite. In the method for producing a surface-modified carbon material, the surface-modified carbon material is produced by causing graphene or graphite serving as the working electrode to electrochemically react with a chemical modification compound. The counter electrode 22 is, for example, a platinum electrode, and the reference electrode 23 is, for example, a silver/silver chloride electrode. As an example, in FIG. 3(c), in the height direction of a cylindrical part of a device, $H_1$ of an upper part is 35 mm, and $H_2$ of a lower part is 3 mm. $\varphi_1$ and $\varphi_2$ are the inner diameters of an internal reaction tank. For example, $\varphi_1$ in the upper part is 20.4 mm, and $\varphi_2$ in the lower part is 7 mm.

In the electrochemical cell 20, a liquid medium 24 containing a compound exhibiting a periodic self-assembling property is disposed on the working electrode 21, and an electrolyte aqueous solution 25 is disposed on the liquid medium 24. The liquid medium 24 has a property of being separable from the electrolyte aqueous solution 25, and is not mixed with the electrolyte aqueous solution 25.

Regarding the size of graphite as the carbon material, for example, length: 12 mm×width: 12 mm×thickness: 2 mm is set. There is no lower limit to the thickness, and even thin graphite can be treated. The upper limit of the thickness can also be set up to several cm. In the case of graphene, for example, length: 10 mm×width: 10 mm×thickness: 1 mm is set. In the present Example, commercially available single layer graphene placed on a copper film (thickness: 35 μm) on a plastic substrate is used. Alternatively, a graphene ribbon in which electrodes and the like have been formed in advance as terminals on a silicon substrate can also be subjected to an electrochemical treatment.

In the method for producing a surface-modified carbon material according to the present invention, a liquid medium which contains an alkane or the like and is a compound exhibiting a periodic self-assembling property is disposed between the working electrode and the electrolyte aqueous solution. In a conventional method for producing a surface-modified carbon material using an electrochemical cell, the above-mentioned liquid medium is not disposed between graphene or graphite serving as the working electrode and the electrolyte aqueous solution.

For the cyclic voltammetry (CV) used in the present invention, an arbitrary voltage generator (function generator), a precision voltage source (potentiostat), an electrochemical cell, an X-Y recorder, and a waveform observation device (oscilloscope) and the like may be prepared. A scan speed can be set to 0.01 V to 0.50 V/sec, and a voltammogram can be recorded on the X-Y recorder. On the electrode of the working electrode, an electrochemical action on the intended sample is generated. In the reaction tank, a potential is swept in a negative direction to generate a reduction wave. A cyclic voltammogram can be recorded for each sample, with an applied potential as a horizontal axis and a response current value as a vertical axis. Examples of the cyclic voltammetry include a PGSTATION 101 potentiostat manufactured by Autolab and ALS electrochemical analyzer series (600 series) manufactured by ALS/CH instruments.

In the present invention, the electrolyte aqueous solution 25 in the electrochemical cell is an aqueous solution containing a chemical modification compound. The electrolyte aqueous solution 25 contains an electrolyte such as sodium nitrite or hydrochloric acid in addition to the chemical modification compound.

When an electrode potential is swept in the electrochemical cell 20, the chemical modification compound contained in the electrolyte aqueous solution 25 reacts with the carbon material such as graphene or graphite which is the working electrode 21, so that the chemical addends are added to the surface of graphene or the like which is the working electrode 21. When the chemical modification compound is a compound represented by the above formula (3), the chemical modification compound is reduced to generate an aryl radical, and the aryl radical is added to the surface of graphene or the like which is the working electrode 21. Using such an electrochemical reaction mechanism, the chemical addends are controllably added to the surface of the carbon material.

The important element which leads to the discovery of the present invention is to dissolve molecules of an organic compound serving as a mask in a non-polar organic solvent having a small dielectric constant, dispose the organic solvent on the surface of a carbon material such as graphite, and further dispose an electrolyte aqueous solution containing an aryl diazonium salt thereon.

By constructing the novel technique which has never been known so far, the formation of the thin film serving as the mask (molecules of an organic compound) with the organic solvent could be accelerated while the formation is controlled on the surface of the carbon material.

It is not possible to completely elucidate how the periodicity is exhibited when the chemical addends are added to the surface of the carbon material. As one action/mechanism which can be envisaged, it is considered that dynamic fluctuation can be caused in the mask as the chemical reaction proceeds. According to the constitution of the present invention, the chemical addends (adducts) can be formed on the surface of the carbon material so as to surely exhibit the periodicity. Thus, it is of a great significance to be able to pay attention to the adoption of the configuration in which the thin film and the organic solvent are combined.

FIG. 3(d) contrastively shows the case where NBD is used as the chemical addends and the case where TBD is used, when the reduction treatment is performed by the CV method. In both the cases, the first sweep is performed from the lower side of the vertical axis of the graph. When TBD is used as the chemical addends, a condition in which the voltage-current characteristics gradually change can be read, as a result of the treatment by the CV method.

Next, in order to compare the case where NBD is used as the chemical addends with the case where TBD is used, an example of Raman spectra when NBD is used as the chemical addends is shown in FIG. 3(e), and an example of Raman spectra when TBD is used is shown in FIG. 3(f). It is found that, in the case of NBD in FIG. 3(e), no noticeable change in Id/Ig occurs.

In contrast, when TBD of FIG. 3(f) is used, a large change can be confirmed to occur in Id/Ig depending on a TBD content. When the TBD content is 5 mM, Id/Ig of the Raman spectra is about 0.10.

In the present invention, a cyclic voltammetry method (CV method) is used as an electrochemical method in Examples which will be described later. However, the present invention is not limited to the CV method, and any method capable of causing a reduction reaction such as a differential pulse voltammetry method, a chronoamperometry method, and a chronocoulometry method can basically be applied to the present invention.

When the thin film used in the production method of the present invention is formed, the compound exhibiting a periodic self-assembling property and contained in the liquid medium 24 periodically self-assembles to be deposited as a thin film having a periodic structure, that is, a one-dimensional periodicity or a two-dimensional periodicity on the surface of graphene or the like which is the working electrode 21. The thin film functions as a mask in the reaction between the chemical modification compound and the surface of graphene or the like which is the working electrode 21. As described above, the chemical addends are periodically added to graphene or graphite which is the working electrode 21. An organic compound-carbon material composite 26 according to the present invention is present in this process.

The compound used in the present invention may be any compound as long as it can periodically self-assemble to form a thin film having a periodic structure, and the chemical modification compound can be periodically bonded to the surface of graphene or the like according to the periodicity. The compound is not particularly limited as long as it exhibits such a property. In the present invention, the compound exhibiting a periodic self-assembling property includes a compound which assembles with a one-dimensional periodicity and a compound which assembles with a two-dimensional periodicity (see "A Electrochemical treatment" in FIG. 4(e) which will be described in detail later).

Therefore, if the compound which assembles with a one-dimensional periodicity is used as the compound exhibiting a periodic self-assembling property, a surface-modified carbon material can be obtained, in which a periodicity corresponding to the addition positions of a large number of chemical addends is observed in a one-dimensional direction. If the compound which assembles with a two-dimensional periodicity is used, a surface-modified carbon material can be obtained, in which a periodicity corresponding to the addition positions of a large number of chemical addends is observed in a two-dimensional direction.

Examples of the compound which assembles with a one-dimensional periodicity include the linear alkane having 15 to 80 carbon atoms, and preferably 16 to 60 carbon atoms, and the linear alkane derivative having 10 to 80 carbon atoms, and preferably 12 to 60 carbon atoms.

In the present invention, when these linear alkanes or linear alkane derivatives are used, these organic compounds periodically self-assemble to be deposited as the above-mentioned thin film having a one-dimensional periodic structure, for example, the lamella type unimolecular film on the surface of the carbon material such as graphene which is the working electrode 21.

The honeycomb structure has predetermined periodic alignment along the main axis direction of carbon constituting the carbon material such as graphene. The honeycomb structure does not cover the entire surface, and may exhibit a periodicity over an approximately constant region. Thus, the linear alkane or the linear alkane derivative can be used as the compound exhibiting a periodic self-assembling property. As described above, the surface-modified carbon material can be obtained, in which the periodicity corresponding to the addition positions of the large number of chemical addends is observed in the one-dimensional direction in the Fourier-transformed image of the scanning probe microscopic image of the surface.

Examples of the compound which assembles with a two-dimensional periodicity include a dehydrobenzo[12]annulene derivative.

When the dehydrobenzo[12]annulene derivatives are used, these periodically self-assemble in a hexagonal shape to be deposited as a thin film having a hexagonal continuous structure, that is, a so-called honeycomb structure on the surface of the carbon material such as graphene which is the working electrode 21 of the electrochemical cell. Therefore, when the dehydrobenzo[12]annulene derivative is used as the compound exhibiting a periodic self-assembling property, the surface-modified carbon material can be obtained, in which the periodicity corresponding to the addition positions of the large number of chemical addends is observed in the two-dimensional direction in the Fourier-transformed image of the scanning probe microscopic image of the surface.

The dehydrobenzo[12]annulene derivative is represented by, for example, the following formula (4).

[Chemical Formula 10]

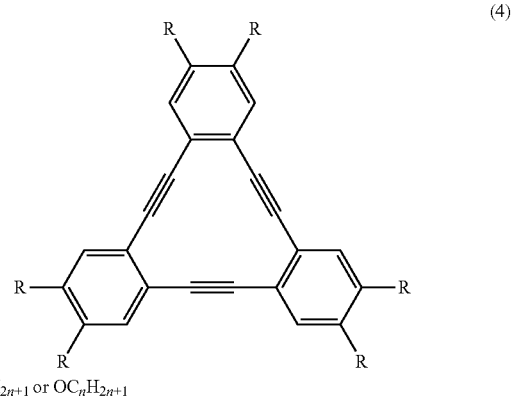

$R = C_nH_{2n+1}$ or $OC_nH_{2n+1}$

In the formula (4), n is an integer of 4 to 30.

Figure 4A:
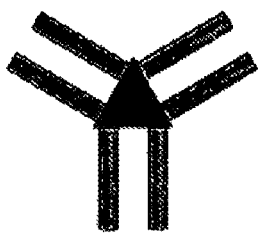
FIG. 4(a) is an illustration diagram schematically showing the structure of a dehydrobenzo[12]annulene derivative.
Figure 4B:
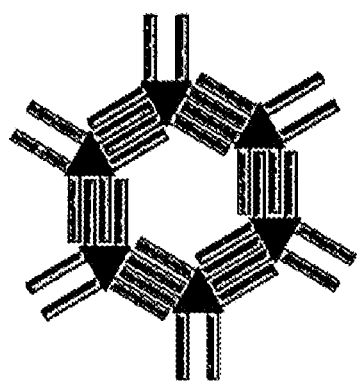
FIG. 4(b) is an illustration diagram showing a hexagonal periodic structure (assembly) composed of six molecules of a dehydrobenzo[12]annulene derivative.
Figure 4C:
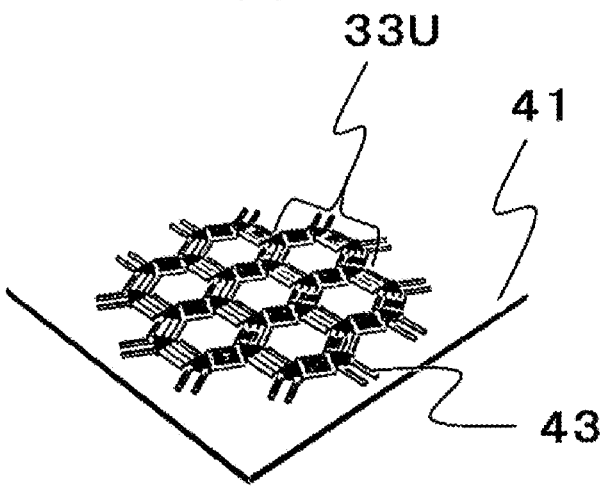
FIG. 4(c) is an illustration diagram showing a state where a thin film formed by assembling many dehydrobenzo[12]annulene derivative molecules so that hexagonal structures are continuously formed is deposited on the surface of a carbon material.
Figure 4D:
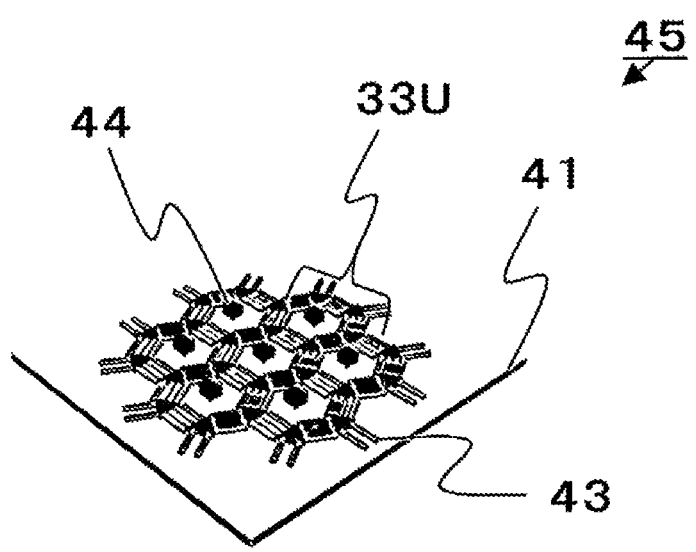
FIG. 4(d) is an illustration diagram showing a surface-modified carbon material obtained by adding chemical addends to the surface of a carbon material so as to have a periodicity in a two-dimensional direction.
Figure 4E:
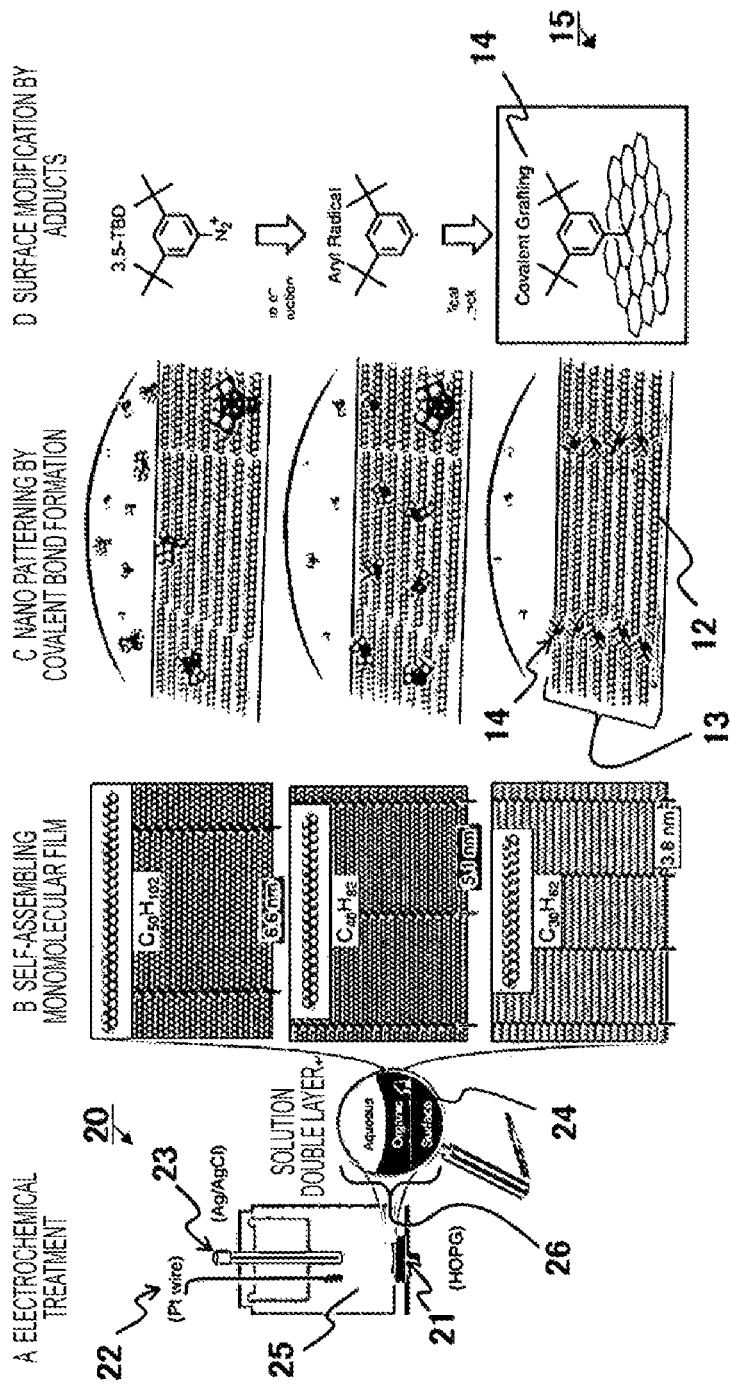
FIG. 4(e) is an illustration diagram showing a relationship among steps of an electrochemical treatment [A], a self-assembling unimolecular film (alkane thin film) [B], nano patterning by covalent bond formation [C], and surface modification by adducts [D] in the production method of the present invention.

The periodic self-assembly of the dehydrobenzo[12]annulene derivative will be described with reference to FIGS. 4(a) to (d). FIG. 4(a) is a diagram schematically showing the structure of a dehydrobenzo[12]annulene derivative which may be an example of a basic framework 30.

A triangular structure formed by bonding three benzene rings in the above formula (4) corresponds to a central triangle in FIG. 4(*a*). An alkyl chain or alkoxy group R bonded to each of the benzene rings is shown as six elongated rectangles which branch out from the triangular portion. As shown in FIG. 4(*b*), six molecules of the dehydrobenzo[12]annulene derivative contained in the liquid medium 24 assemble, so that the mutual alkyl chains or alkoxy groups are juxtaposed to form a hexagonal periodic structure 33U.

Furthermore, as shown in FIG. 4(*c*), many molecules assemble to form a continuous hexagonal structure. As a result, a thin film 43 is formed on the surface of a carbon material 41 so that the assembly 33U having a honeycomb structure assembles. Thus, the thin film 43 is deposited on the surface of the carbon material 41 such as graphene which functions as the working electrode. When the chemical modification compound is caused to react with the carbon material 41 in this state, the thin film 43 functions as a mask, and the chemical modification compound reacts with the surface of the carbon material 41 in the void part (holes) of the hexagonal assembly 33U of the thin film 43.

As shown in FIG. 4(*d*), a surface-modified carbon material 45 can be obtained, in which chemical addends 44 are added with a periodicity in a two-dimensional direction corresponding to the periodicity of the continuous hexagonal structure (assembly 33U) of the thin film. FIG. 4(*d*) shows a condition in which the chemical addends 44 are respectively added into seven hexagonal holes. As the six alkyl chains or alkoxy groups of the dehydrobenzo[12]annulene derivative are longer, larger hexagonal voids are formed in the thin film, whereby a larger chemical modification compound can react with the carbon material. However, if the hexagonal voids are too large, the function of the thin film as a mask is weakened, which makes it impossible to sufficiently control the addition positions of the chemical addends, so that the periodicity of the addition positions of a large number of chemical addends is deteriorated.

Meanwhile, as the six alkyl chains or alkoxy groups of the dehydrobenzo[12]annulene derivative are shorter, smaller hexagonal voids are formed in the thin film, which is likely to control the addition positions of a large number of chemical addends. Therefore, the periodicity of the addition positions of the chemical addends on the entire surface is improved. However, a surface-modified carbon material having a short period is likely to be obtained, but a surface-modified carbon material having a long period is less likely to be obtained. If the hexagonal voids are too small, a large chemical modification compound cannot react with the carbon material, and only a small chemical modification compound can react with the carbon material.

For the above reasons, the lengths of the six alkyl chains or alkoxy groups of the dehydrobenzo[12]annulene derivative are appropriately determined depending on the periodicity to be required and the chemical addends to be added. In the formula (4), n is preferably an integer of 5 to 30, and more preferably 6 to 14. For example, when TBD is used as the chemical modification compound, the use of a dehydrobenzo[12]annulene derivative in which n in the formula (4) is an integer of 6 to 10, and preferably an integer of 6 to 8 can provide a surface-modified carbon material having a high periodicity.

The six alkyl chains or alkoxy groups of the dehydrobenzo[12]annulene derivative may not have the same length, and may have different lengths as long as the above properties can be obtained. Rs in formula (4) may be the same or different.

The dehydrobenzo[12]annulene derivative may be a compound represented by the formula (4) in which R is a group containing a triple bond, a double bond, a branched chain, or a functional group.

Next, FIG. 4(*e*) is an illustration diagram integratedly showing flows of steps of an electrochemical treatment [A], a self-assembling unimolecular film [B], nano patterning by covalent bond formation [C], and surface modification by adducts [D], and a relationship among the steps in the production method according to the present invention. A working electrode 21, a liquid medium 24, an electrolyte aqueous solution 25, and an organic compound-carbon material composite 26 are provided in an electrochemical cell 20. The producing method according to the present invention includes, as an essential condition, a first step of forming a self-assembling unimolecular film and a second step of chemically modifying the surface of a carbon material using the self-assembling unimolecular film as a mask.

Furthermore, an aspect of using an organic compound which can assemble with a two-dimensional periodic structure in the present invention will be described. As described above, as long as the chemical addends can be periodically added, the organic compound may be a compound capable of forming a thin film having a continuous symmetrical structure on a plane such as a triangle, a tetragon, an octagon, or a star polygonal shape (including a regular star polygonal shape such as a Kagome structure) in addition to a compound which form a hexagonal periodic structure such as a dehydrobenzo[12]annulene derivative.

That is, the organic compound may be a compound which continuously assembles in a plane direction based on a single unit to form a thin film having a periodic structure as a whole. Basically, it is preferable to use a compound which has a cyclic structure having a symmetry, and can continuously assemble to exhibit a periodic structure on the surface of the carbon material.

That is, the organic compound assembly may be one in which a central structure part and a peripheral structure part are connected by an intermolecular interaction with one organic compound as a unit, to exhibit a periodic structure as a whole. In addition to the above dehydrobenzo[12]annulene derivative, for example, an aspect is also preferable, in which 1,3,5-tris(4-carboxyphenyl)benzene (H3BTB) is caused to be assembled in a honeycomb shape to provide a two-dimensional periodic structure.

Figure 5A:
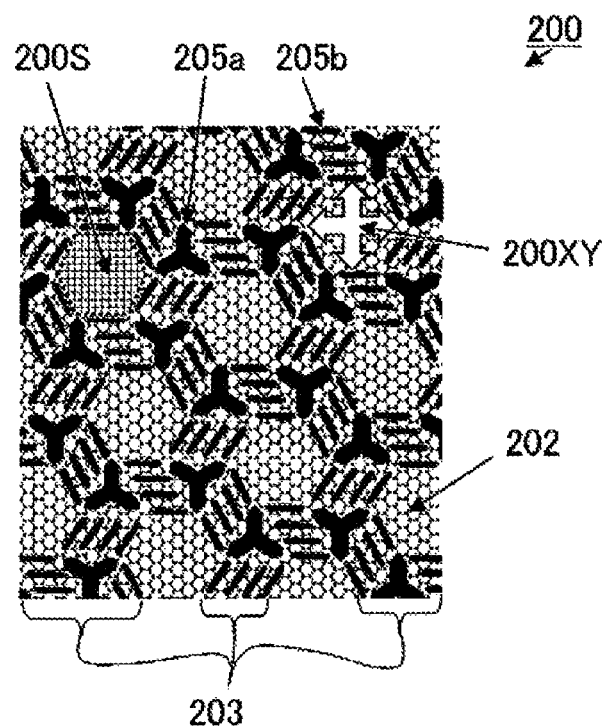
FIG. 5(a) is a schematic plan view of a basic form (an example) of an assembly having a two-dimensional periodic structure according to the present invention.
Figure 5B:
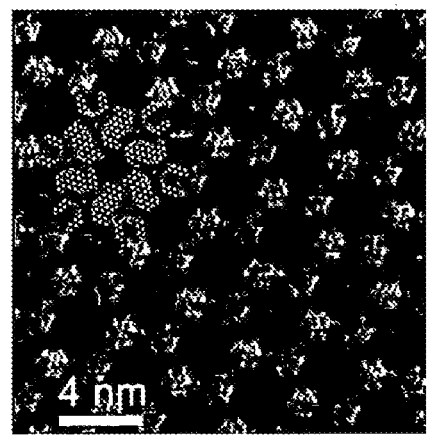
FIG. 5(b) is an illustration diagram showing the relative size of an assembly single unit of a dehydrobenzo[12]annulene derivative on the surface of a carbon material in an STM observation image.
Figure 5C:
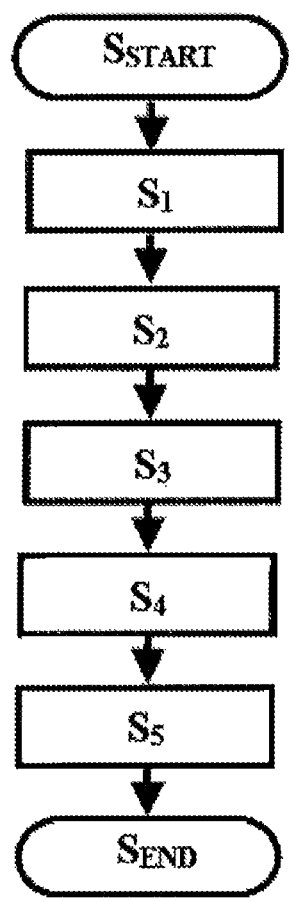
FIG. 5(c) is a flowchart showing steps for producing a surface-modified carbon material of the present invention.

FIG. 5(*a*) shows an example of a basic form of a carbon material 200 covered with a two-dimensional periodic mask used when a surface-modified carbon material having a two-dimensional periodicity in the present invention is produced. A thin film 203 is formed on the surface of planar alignment of 6-membered rings 202 of the carbon material. The thin film 203 is composed of an assembly in which a large number of basic frameworks 205*a* made of an organic compound are connected by grafted parts 205*b* to cover the surface. A large number of assemblies are aligned so as to have a periodic structure on the surface. The size of the holes can be approximated by a polygon 200S inscribed therein. For example, it is preferable to set the size of the holes in the assembly to about 2.6 to 12.3 $nm^2$. In that case, the shape of the holes is preferably hexagonal, and more preferably regular hexagonal.

Alternatively, the size of the holes in the assembly may also be approximated by the lengths of the holes in X and Y directions with reference to a predetermined direction, for example, the main axis direction of the carbon material (cross symbol 200XY). In order to maintain the alignment state of adducts having an order property and to dispose the adducts in a high density when the surface of the carbon material is modified, for example, it is preferable that the length of the holes in the assembly in the X direction is set to be within a range of 1.6 to 3.5 nm, and the length of the holes in the Y direction is set to be within a range of 1.6 to 3.5 nm.

The size of holes in a two-dimensional periodic structure composed of an assembly of single units is set to 5 nm or less. This is because, when the size of the holes is 5 nm or less, the holes are small, which provides high density exhibition of the adducts per unit area of the surface of the carbon material. The size of the holes is more preferably 3 nm or less (see FIG. 5(b)). For example, when the holes are polygonal or star polygonal, the size of the holes corresponds to the case where the longest diagonal line in the inscribed shape is 5 nm or less.

In the present invention, the thin film having a two-dimensional periodic structure having a hole size is used as a mask to modify the surface of the carbon material with the adducts. At this time, the number of the adducts which can enter the positions of the holes is considered to change with respect to the predetermined size of the holes. In the case of small holes, it is considered that the number of the adducts is 1 to 2 in DBA-OC4, and 1 to 4 in DBA-OC10. That is, the relative relationship between the size of the holes and the adducts (chemical addends) can change the ratio of the adducts added to a section corresponding to a predetermined unit area in a surface area.

In the present invention, it is preferable that, in a surface-modified carbon material obtained by adding chemical addends to at least a part of a surface of a carbon material selected from the group consisting of graphene, graphite, a glassy carbon film, and film-like pyrolytic carbon, a two-dimensional periodicity corresponding to the addition positions of the large number of chemical addends is provided in the Fourier-transformed image of the scanning probe microscope image of the surface, and the presence percentage of one or more adducts (light spots) for a predetermined unit area of 5 to 15 nm$^2$ on the surface, that is, the ratio of the adducts in a surface direction is 70% or more. The ratio is more preferably 75% or more, and still more preferably 90% or more.

The ratio of the adducts in the surface direction can be obtained by dividing the total area of the visual field to a predetermined unit area, and confirming whether or not one or more adducts (light spots) are present for each unit area when several tens of adducts (surface chemical addends) are present in the visual field in the STM observation image. For example, the total number of the adducts may be counted when the predetermined unit area is assumed to be about 5 to 10 nm$^2$ and about 5 to 15 nm$^2$. Thus, when the adducts are almost uniformly formed with respect to the intended surface area, the ratio of the adducts can also be substantially substituted by the total number of the adducts (number per area) in the STM observation image.

An example of a method for evaluating the in-surface density and modification rate and the like of the adducts in the present invention will be described below. Specifically, the method is a method for approximately analyzing a large number of light spots in an STM observation image using image analysis software.

Using the above DBA-006 as a mask, the number of light spots appearing in the field of view of one STM observation image (200 nm×200 nm, 40,000 nm$^2$) is analyzed using image analysis software in graphite in which the chemical addends are added to the surface of the carbon material so as to exhibit a two-dimensional periodicity. Here, the light spots are considered to correspond to the positions of a large number of adducts (aryl groups) added to the surface of the carbon material.

For this STM observation image, a particle/hole analysis module of SPIP image analysis software (Image Metorology) is applied; the surface of graphene is assumed to be a basic plane; and the presence of the light spots is detected with a height of 150 pm or more as a reference value. As a result, about 3,500 light spots are assumed to be detected in the intended region.

The unit area per light spot is 40,000 nm$^2$/3,500=11.4 nm$^2$. The area of the unit cell of the honeycomb structure of DBA-006 is 8.87 nm$^2$, whereby, when a two-dimensional periodicity (honeycomb-shaped alignment in a surface direction) is assumed to be completely present taking the area of the unit cell as a predetermined unit area, the ratio is 8.87 nm$^2$/11.4 nm$^2$=78%.

To increase the ratio to 90% or more, the size of holes of a thin film assembly and the spatial size of adducts may be adjusted, and a chemical reaction may be caused to repeatedly proceed by a CV method so that chemical addends are efficiently added in a plane.

Thus, the surface of the carbon material is chemically modified by the electrochemical treatment using the electrochemical cell to form the self-assembling unimolecular film on the surface, and the chemical addends are subjected to nano patterning by covalent bond formation. Changes in steps when the surface of the carbon material is chemically modified by the adducts are shown in FIGS. 4(a) to (e) described above.

In the above assembly formed by assembling of DBAs, two molecules of DBA adjacent to each other have two alkyl groups alternately aligned in parallel. FIG. 29 shows the relative arrangement aspect of two molecules of DBAOC6 on the surface. A left view in FIG. 29 shows a − type, and a right view shows a + type. Due to the difference in relative arrangement aspect of the two molecules, the assembly may have two types of structures having a chiral relationship with each other, that is, a clockwise (CW) structure and a counterclockwise (CCW) structure. The CCW structure and the CW structure are each composed of interactions between two different molecules. The CW structure is the − type, and is composed of only 6 molecules interacting with each other, and the CCW structure is the + type, and is composed of only 6 molecules interacting with each other. A distorted hexagonal structure in which the + type and the − type are mixed in one hexagonal structure is also conceivable, but they are disadvantageous structures from the viewpoint of a surface molecular density and an interaction between molecules. FIG. 26(a) shows the CW structure in the assembly formed by assembling of six molecules of DBAOC6, and FIG. 26(b) shows the CCW structure. Arrows shown in the assemblies in FIGS. 26(a) and (b) indicate rotation directions corresponding to CW (clockwise) and CCW (counterclockwise). The CW structure and the CCW structure form different domains, and appear on the surface with equal probability. Therefore, the domains of the CW structure and CCW structure have the same area over the entire surface.

The unit cell vector of the honeycomb structure formed by assembling of DBAs is tilted in a counterclockwise direction in the CCW structure, and in a clockwise direction in the CW structure, with respect to the graphite main symmetric axes closest thereto. That is, the CCW structure and the CW structure have different relative angles with respect to the graphite substrate.

FIG. 27(a) shows an STM observation image in the vicinity of the domain boundary of the honeycomb structure (template) formed by DBAOC6, and FIG. 27(b) shows a Fourier-transformed image thereof. A white line shown in the STM image of FIG. 27(a) corresponds to the domain boundary. The white line is a line drawn on a visually defined boundary where a grain of the alignment of bright points is switched on the image. The CW structure is formed in the left region of the white line, and the CCW structure is formed in the left region. In the Fourier-transformed image of FIG. 27(b), two types of 6-fold symmetrical periods are observed. One of them is a period which is surrounded by a dotted circle, and is represented by light spots due to the honeycomb structure of the CW structure. The other is a period which is surrounded by a solid circle, and is represented by light spots due to the honeycomb structure of the CCW structure. The difference in angle between the periods of the CW structure and CCW structure is about 13°.

FIG. 28(a) shows an STM observation image of the surface of modified graphite obtained by chemically modifying graphite with aryl groups using DBAOC6 as a template, and FIG. 28(b) shows a Fourier-transformed image thereof. Two types of 6-fold symmetry periods are observed in the Fourier-transformed image of FIG. 28(b) with a white line shown in the STM observation image of FIG. 28(a) as a boundary. The white line is a line drawn on a visually defined boundary where a grain of the alignment of bright points is switched on the image. One of the periods is a period represented by light spots surrounded by a dotted circle. The other period is a period represented by light spots surrounded by a solid circle. The difference in angle between the two periods is about 14°.

The difference in angle between the two periods observed in the surface-modified graphite (about 14°) approximates the difference in angle between the periods of the CW structure and the CCW structure in the template of DBAOC6 (about 13°). When the standard deviation is calculated from the average of several experimental values, the standard deviation is 2° at the maximum, and no difference can be evaluated to be present between the two values.

This strongly suggests that the two types of periods observed on the surface of modified graphite are due to the chiral structure formed by DBAOC6, that is, the CW structure and the CCW structure. That is, information on the chiral honeycomb structure of DBAOC6 propagate to the positions of the aryl groups added to graphite. This corresponds to the introduction of defects (spa carbon) on the surface of graphite in a chiral positional relationship.

Furthermore, based on the positional relationship among the signals of the Fourier-transformed image, it is considered that, in a region above the white line shown in the STM observation image of FIG. 28(a), chemical modification which reflects the period of the CCW structure of the template occurs, and in a region above the white line, chemical modification which reflects the period of the CW structure occurs.

As described above, the surface modification of the carbon material using DBA or the like as the template also makes it possible to control the periodicity of the chemical addends based on the chirality of the assembly of DBA or the like.

Comparative Discussion Example

Next, comparative description will be given for the case where no liquid medium is applied in the electrochemical treatment step. The same operation as above is performed under a condition in which the surface of the carbon material such as graphene serving as the working electrode is coated with a dried unimolecular film made of an alkane or the like prepared in advance, without the liquid medium being disposed between the working electrode and the electrolyte aqueous solution. The addition reaction of the chemical modification compound to graphene or graphite is suppressed, but the periodicity is not obtained at the addition positions of the large number of chemical addends.

[Action]

In contrast, when the above operation is performed in a state where the liquid medium is disposed between the working electrode and the electrolyte aqueous solution, the periodicity can be obtained at the addition positions of the large number of chemical addends. This is considered to be because, in the coating method using the unimolecular film made of an alkane or the like prepared in advance, alkane molecules do not dynamically fluctuate in the coated thin film made of an alkane or the like, by contrast, in the method for disposing the liquid medium between the working electrode and the electrolyte aqueous solution, the alkane molecules can dynamically fluctuate in the thin film made of an alkane or the like deposited on the surface of graphene or the like.

In the method for disposing the liquid medium between the working electrode and the electrolyte aqueous solution, the following action is considered to be exhibited to obtain the thin film made of an alkane or the like having a one-dimensional periodic structure.

In the present invention, the liquid medium is disposed between the working electrode and the electrolyte aqueous solution. Therefore, it is considered that the unimolecular film made of an alkane or the like to be formed is in a dynamic state, which causes fluctuation to occur, so that gaps having a low potential barrier are formed in the unimolecular film.

The liquid medium 24 can be obtained, for example, by dissolving the alkane or the like in a non-polar organic solvent or a low-polarity organic solvent. The alkane or the like contained in the liquid medium 24 is as described above. The non-polar organic solvent or the low-polarity organic solvent is not particularly limited as long as it can dissolve the alkane or the like, and the liquid medium 24 obtained by dissolving the alkane or the like is immiscible with the electrolyte aqueous solution 25. For example, 1-octanoic acid, 1-phenyloctane, tetradecane, 1-octanol, and 1,2,4-trichlorobenzene and the like can be suitably used.

The concentration of the alkane or the like in the liquid medium 24 is preferably 1 micromol/L or more, and more preferably 1 mmol/L or more. When the concentration of the alkane or the like is within the above range, the above-mentioned thin film having a one-dimensional periodic structure is likely to be formed, which is suitable for producing a surface-modified carbon material having a periodicity. The upper limit of the concentration of the alkane or the like is not particularly limited, and is 1 mol/L, for example.

In the case of the treatment in the electrochemical cell used in the present invention (see FIGS. 3(a) to (c)), the amount of the liquid medium 24 is not particularly limited as long as the above-mentioned thin film having a one-dimensional periodic structure is formed, and it can be appropriately determined depending on the size and the like of the electrochemical cell 20.

The chemical modification compound contained in an electrolyte aqueous solution 24 is as described above. The concentration of the chemical modification compound in the electrolyte aqueous solution 24 is preferably 0.1 to 20 mmol/L, and more preferably 0.2 to 10 mmol/L. When the concentration of the chemical modification compound is within the above range, the reaction between the chemical modification compound and the carbon material such as graphene which is the working electrode 21, suitably proceeds, whereby an amount of the chemical addends sufficient to exhibit a periodicity are likely to be added to the surface of the carbon material such as graphene.

Furthermore, the concentration is more preferably 1 to 5 mmol/L. When the concentration of the chemical modification compound is within the above range, the reaction between the chemical modification compound and the surface of the carbon material such as graphene which is the working electrode 21, suitably proceeds, whereby a sufficient amount of chemical addends is likely to be added to the surface of graphene or the like while a periodicity is exhibited.

A flow chart of an example of the invention relating to the producing method of the present invention is shown in FIG. 5(*c*) (steps: $S_{START}$ to $S_{END}$). First, a single compound which can assemble due to an interaction to form a unimolecular film is selected. An organic compound which can have a basic structural unit and a periodic structure in the entire structure of the assembly is prepared (step: $S_1$). Next, a thin film made of the organic compound is formed on the surface of a carbon material (step: $S_2$). The thin film is formed and disposed so as to cover at least a part of the surface of the carbon material.

The thin film is disposed on the surface of the carbon material, and it then functions as a mask in subsequent steps. First, in the formation of a one-dimensional periodic structure, fluctuations occur in the alignment structure of the organic compound constituting the thin film, so that gaps having a low potential barrier occur in a part of the thin film. Therefore, the one-dimensional periodic structure derived from the periodic structure is considered to be formed in the surface direction of the carbon material. In the formation of a two-dimensional periodic structure, it is considered that the thin film contains holes having a low potential barrier in advance, so that a two-dimensional periodicity derived from the two-dimensional periodic structure is considered to be exhibited in the surface direction of the carbon material.

Next, using the thin film as a mask, a chemical modification compound is added from the surface side of the carbon material (step: $S_3$). At this time, the chemical modification compound may be disposed on the entire surface so as to correspond to the gaps and holes. Next, the chemical modification compound is caused to react with the carbon material to add and fix chemical addends on the surface. As a result, the adducts are disposed so as to have a predetermined periodic structure on the entire surface (step: $S_4$).

Finally, the thin film used as a mask is removed by a solvent or the like (step: $S_5$). Thus, the surface of the carbon material can be chemically modified with the adducts having a predetermined periodic structure (step: $S_{END}$).

The gist of the present invention will be described again with reference to FIG. 4(*e*). A solution double layer is formed at the bottom part of an electrochemical cell, and an organic compound-carbon material composite 26 is once formed. Then, a thin film made of an organic compound such as an alkane is formed on the surface of a carbon material. In the thin film, blocks (film units) with the molecular length of an alkane as a unit are formed, and grooves are formed between the plurality of blocks. Depending on the difference in the molecular length of the alkane, lengths between the adjacent grooves, that is, pitches are different. Furthermore, no organic compound is present in the groove portion, and the surface of the carbon material is exposed. The chemical modification of the adducts by covalent bond formation to the carbon material occurs, so that nano patterning is generated on the surface of the carbon material.

Finally, the thin film is removed from the entire surface of the carbon material, and a large number of adducts (chemical addends) having a predetermined order property in a plane direction are then formed on the surface of the carbon material. The relative size of the assembly (single unit) in the STM observation image of the surface of the carbon material is shown in FIG. 5(*b*).

In the method for producing a surface-modified carbon material according to the present invention, as described above, the thin film is formed on the carbon material which is the working electrode, by the compound exhibiting a periodic self-assembling property, and a polar organic solvent or a low-polarity organic solvent is disposed on the thin film. That is, the organic compound-carbon material composite is formed, which includes the carbon material such as graphene, the thin film which covers the surface of the carbon material and is formed by the compound exhibiting a periodic self-assembling property, and the non-polar organic solvent or the low-polarity organic solvent which is present on the thin film.

In the organic compound-carbon material composite, the carbon material is a portion which later serves as a surface-modified carbon material provided by adding chemical addends, and the thin film is a portion which functions as a mask as described above. The non-polar organic solvent or the low-polarity organic solvent is a portion which can contain the chemical modification compound which supplies the chemical addends to the carbon material. That is, the organic compound-carbon material composite can be regarded as a material used for producing a surface-modified carbon material.

Next, another configuration example 1 (FIG. 5(*d*): uniform pitch type electronic device 90F) and configuration example 2 (FIG. 5(*e*): different pitch type electronic device 90P) of the surface-modified carbon material according to the present invention will be described with reference to the drawings. These are techniques which can prepare a surface-modified carbon material having a desired configuration without using the above-mentioned additional step utilizing a mask. In the above-mentioned electrochemical method, it is considered that a surface-chemically modified carbon material exhibiting a one-dimensional periodicity having different pitches can be formed by using a template in which a plurality of molecules having different molecular lengths are mixed. For example, it is considered that, when molecules having molecular lengths of 3 nm and 5 nm are mixed, pitch lengths of 3,5,3,5 and 3,3,5,5 (unit: nm) and the like can be realized.

First, the entire surface of a carbon material is randomly and chemically modified in advance, and chemical addends are then gradually removed with positional accuracy within a few nanometers using an STM probe, to expose a part of the surface of the carbon material, thereby preparing a void section 92. Electrodes 95 and 96 are formed in advance on both ends of a channel. Thus, on the surface of the carbon material, a large number of chemical addends 94 added to 6-membered ring carbon positions remain at desired positions. In addition to the processing of the void section 92 into a rectangular shape, the void section 92 can be processed into, for example, a circular shape, an elliptical shape, an oval shape, or an arbitrary shape partially including a curved line except a straight line part. It is also possible to form comb teeth from both the electrodes with respect to the channel so as to mesh with each other.

A region where the chemical addends have been removed is a plurality of void areas 92 having a rectangular shape. As described above, this is because the chemical addends at aimed positions can be removed by operating the STM probe. As a result of the removing operation, the pitches of the void areas 92 in a channel direction can be arbitrarily made to have a uniform pitch size ($W_F$) and different pitch sizes ($W_P$). The periodic structure can be freely formed. Thus, it is considered that the addition positions of the chemical addends can be designed and prepared with high accuracy, whereby the size of the bandgap of the carbon material can be controlled.

The present configuration example is a technique using a nanoshaving method, which requires a considerable time to directly prepare a channel having a large area. However, if the channel size is about 10 to 30 nm×20 to 60 nm, a surface-modified carbon material exhibiting a one-dimensional periodicity of a desired pitch can be easily prepared without any problem. Furthermore, chemical addends having a two-dimensional periodicity can also be theoretically aligned, but the working time is considered to be increased as compared with the case of the one-dimensional periodicity. A technique of performing fine secondary processing by applying a nanoshaving method can also be applied after chemical modification having a periodic structure using a mask.

In the present invention, even if the nanoshaving method is used, it will be difficult to process a surface with a row of very long and narrow adducts, for example, the size of one aryl group as a width unit. This is because the nanoshaving method uses a fine probe of STM or AFM (the size of an apex portion is not necessarily an atomic size) to physically scrape the adducts (chemical addends), so that an extremely advanced experimental technique is required in order to process the surface so as to surely leave only one thin row, which makes it generally difficult to provide constant and sure surface processing.

Next, how to grasp the periodic structure in the present invention will be described. FIG. 6(*a*) is a schematic view showing the case where chemical addends are aligned on the surface of a carbon material so as to have a one-dimensional periodicity. This corresponds to the case of observing an STM observation image with a predetermined visual field size of 60. As for whether or not the chemical addends are aligned so as to have a one-dimensional periodicity, by assuming one-dimensional alignment 61 having one rectangular unit, and regarding it as a kind of gauge, whether or not the alignment state of a plurality of adducts 64 can correspond to the one-dimensional alignment 61 may be determined. When it can be read that the plurality of adducts 64 generally form one-dimensional alignment having pitches 63, the chemical modification can be determined to be performed in the one-dimensional alignment.

At this time, the connection points of the adducts to the surface of the carbon material may be in a space 62 having a slight width. The alignment density of the chemical addends in the present case can be specified by the number of the one-dimensional alignments. For example, when a channel is formed of a carbon material, the alignment density of the chemical addends can be evaluated by the number of rows of the chemical addends formed in a predetermined length. The number of the alignments in the entire length of the channel to be produced can be easily set to 50 or more, 100 or more, and 200 or more. In the present invention, those having at least 10 or more alignments for a predetermined channel length are preferable.

Next, FIG. 6(*b*) is a schematic view showing the case where chemical addends are aligned on the surface of a carbon material so as to have a two-dimensional periodicity (lattice-like alignment). This corresponds to the case of observing an STM observation image with a predetermined visual field size of 70. In FIG. 6(*b*), one unit area has a rectangular shape 72, which is one form of two-dimensional alignment. One or two of a plurality of adducts 74 are schematically shown to be present in a rectangular section. Alternatively, the section is schematically shown to be vacant due to the absence of the adducts 74. A portion where the adducts are present is a presence section 73. In contrast, a portion where the adducts are not present is a blank section 76.

The ratio of the adducts in a surface direction in the present example is 13/16, which is about 82%. The ratio is preferably 85% or more, and more preferably 90% or more. Three places of the 13 places where the adducts are present are overlapping addition areas 75 where the two adducts are present. That is, in the present invention, the ratio of the adducts in the surface direction means the ratio of the adducts added to one section having a size of at least 5 to 15 nm² with respect to the total surface area to be surface-modified.

FIG. 6(*c*) is a schematic view showing the case where chemical addends are aligned on the surface of a carbon material so as to have a two-dimensional periodicity (honeycomb-shaped alignment). This corresponds to the case of observing an STM observation image with a predetermined visual field size of 80. One unit area has a hexagonal shape 82. This case also forms one form of two-dimensional periodic alignment. Also in the figure, one or two of a plurality of adducts 84 are schematically shown to be present in the section of the hexagonal shape 82. Alternatively, the section is schematically shown to be vacant due to the absence of the adducts 84. A unit area where the adducts are present is a presence section 83.

The ratio of the adducts in the surface direction in the present example is 31/42, which is about 74%. The ratio is preferably 80% or more, and more preferably 90% or more. Four places of the 31 places where the adducts are present are overlapping addition areas 85 where the two adducts are present.

In both the above cases of FIG. 6(*b*) and FIG. 6(*c*), the number of the adducts (surface chemical addends) added per predetermined unit area is considered to be determined by a relative relationship between the size of holes in a thin film which functions as a mask and the size of an organic compound used as the adducts, and the like.

In the present invention, it is considered that desired physical properties can be imparted to the carbon material such as graphene by skillfully position-controlling and chemically modifying the surface of the carbon material (see Non-Patent Literature 10 (Lian et. al.)). It is considered that, when a circuit is constituted using the surface-modified carbon material according to the present invention, a novel electronic device having a bandgap which is not a zero value and can be controlled by a voltage or the like can be provided (see Non-Patent Literature 9 (Novoselov et. al.)).

Thus, the surface-modified carbon material of the present invention has novel electrical properties, mechanical properties, optical properties, and thermal properties, and the like which are not found in conventional carbon materials such as graphene. Therefore, the surface-modified carbon material can be used in various applications such as a field-effect transistor (FET), a sensor, a light emitting element, and a catalyst.

For example, by forming the surface-modified carbon material of the present invention on an $SiO_2$ substrate or an SiC substrate or the like, a device containing the surface-modified carbon material of the present invention can be produced. Graphene (see Non-Patent Literatures 8 and 9 above) installed on an $SiO_2$ substrate or an SiC substrate or the like in advance can be chemically modified by the above method to prepare a surface-modified carbon material.

Thus, the novel electronic device can be formed by utilizing the technique of surface-modifying the surface of a carbon material selected from the group consisting of graphene, graphite, a glassy carbon film, and film-like pyrolytic carbon with adducts. That is, a substance in which the surface of the carbon compound within several layers is chemically modified is formed to acquire novel physical properties, thereby realizing a device. In the present invention, graphene contains not only monolayer graphene but also multi-layer graphene having two or more layers. For example, commercially available two-layer graphene is produced by transferring a film material formed by a CVD method onto a substrate.

Particularly, a structure as an electronic device is suitably constructed by forming a channel using monolayer graphene chemically modified so as to have a predetermined periodicity.

Figure 6A:
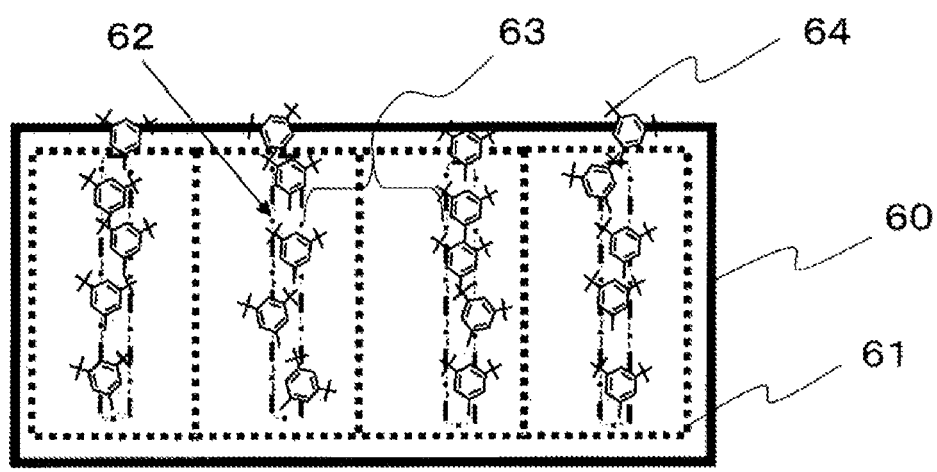
FIG. 6(a) is a schematic view showing the case where chemical addends are aligned on the surface of a carbon material so as to have a one-dimensional periodicity.
Figure 6B:
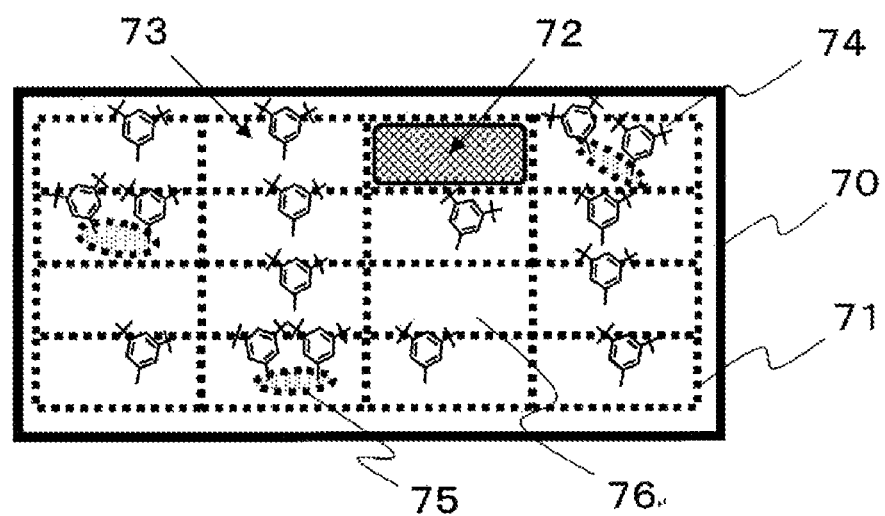
FIG. 6(b) is a schematic view showing the case where chemical addends are aligned on the surface of a carbon material so as to have a two-dimensional periodicity (square lattice-like alignment).
Figure 6C:
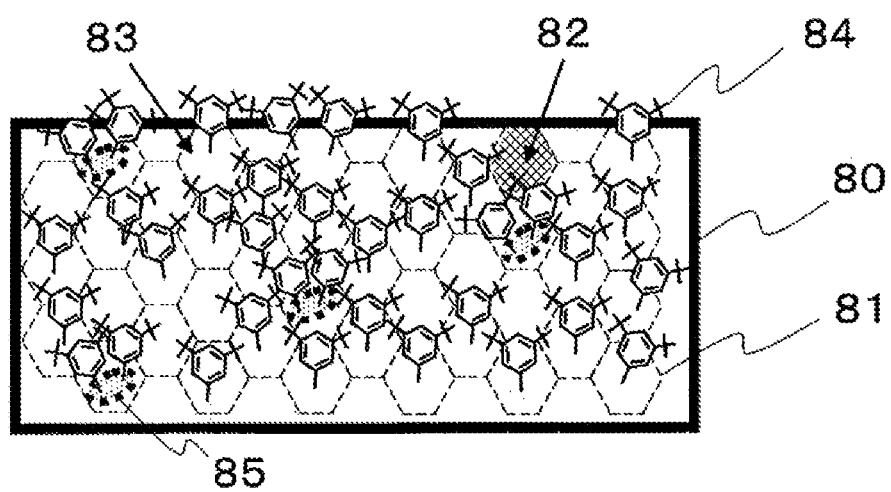
FIG. 6(c) is a schematic view showing the case where chemical addends are aligned on the surface of a carbon material so as to have a two-dimensional periodicity (honeycomb-shaped structure).
Figure 6D:
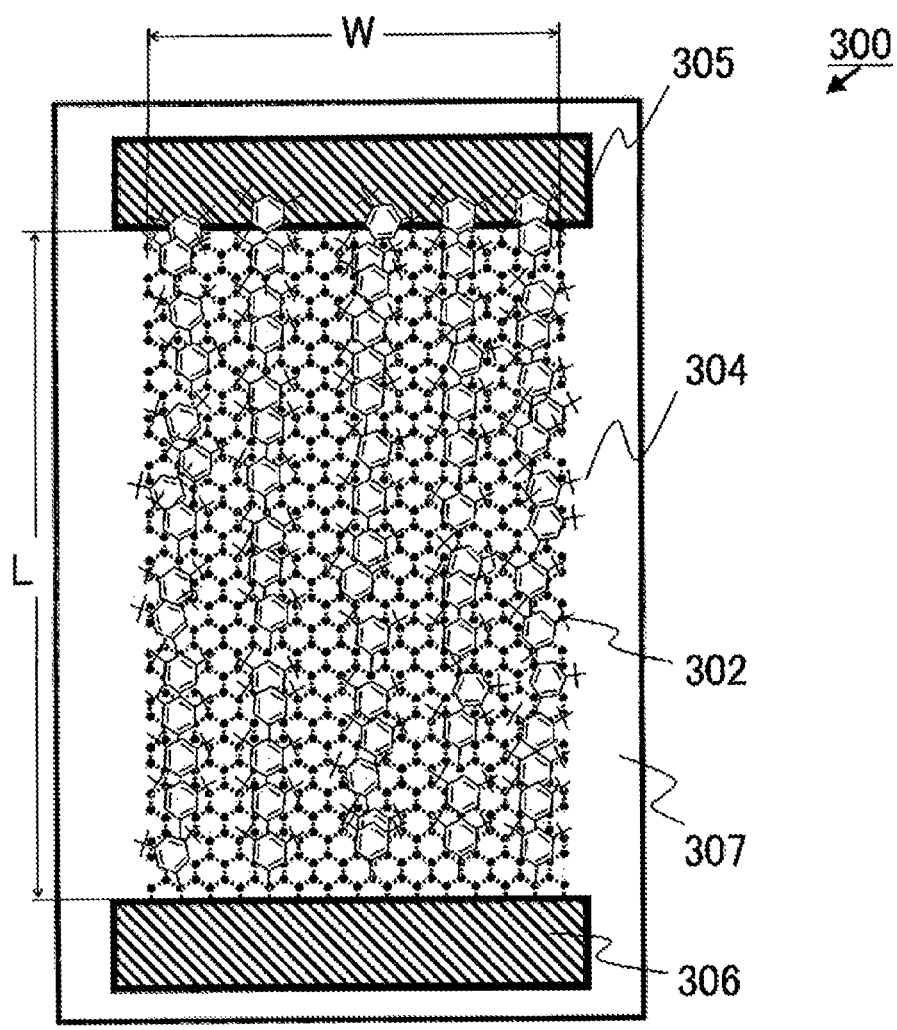
FIG. 6(d) is a schematic plan view of a basic form in which electrodes are formed on both ends of a carbon material (GNR) processed into fine pieces and modified with surface modification groups having a one-dimensional periodicity, for use in an electronic device 300.

FIG. 6(d) is a schematic plan view of a basic form of an electronic device 300 in which electrodes 305 and 306 are formed on both ends of planar alignment of 6-membered rings 302 of a surface-modified carbon material obtained by disposing chemical addends 304 so as to have a one-dimensional periodicity on the surface of a carbon material (graphene nanoribbon) placed on a substrate 307 and processed into fine pieces. The channel length of the electronic device 300 is represented by L, and the channel width thereof is represented by W.

In the configuration of the figure, the number of the alignments (one-dimensional periodicity) of the addends aligned in parallel in the channel direction between both the electrodes can be set to 10, 20 . . . 100, and 200 and the like. The number of the alignments of the adducts 304 can be set to the desired number depending on the relative ratio relationship between the channel length and the molecular length of the organic compound (alkane). The width of the graphene nanoribbon can also be adjusted. In the figure, a state where the thin film used as a mask is removed is shown.

Figure 6E:
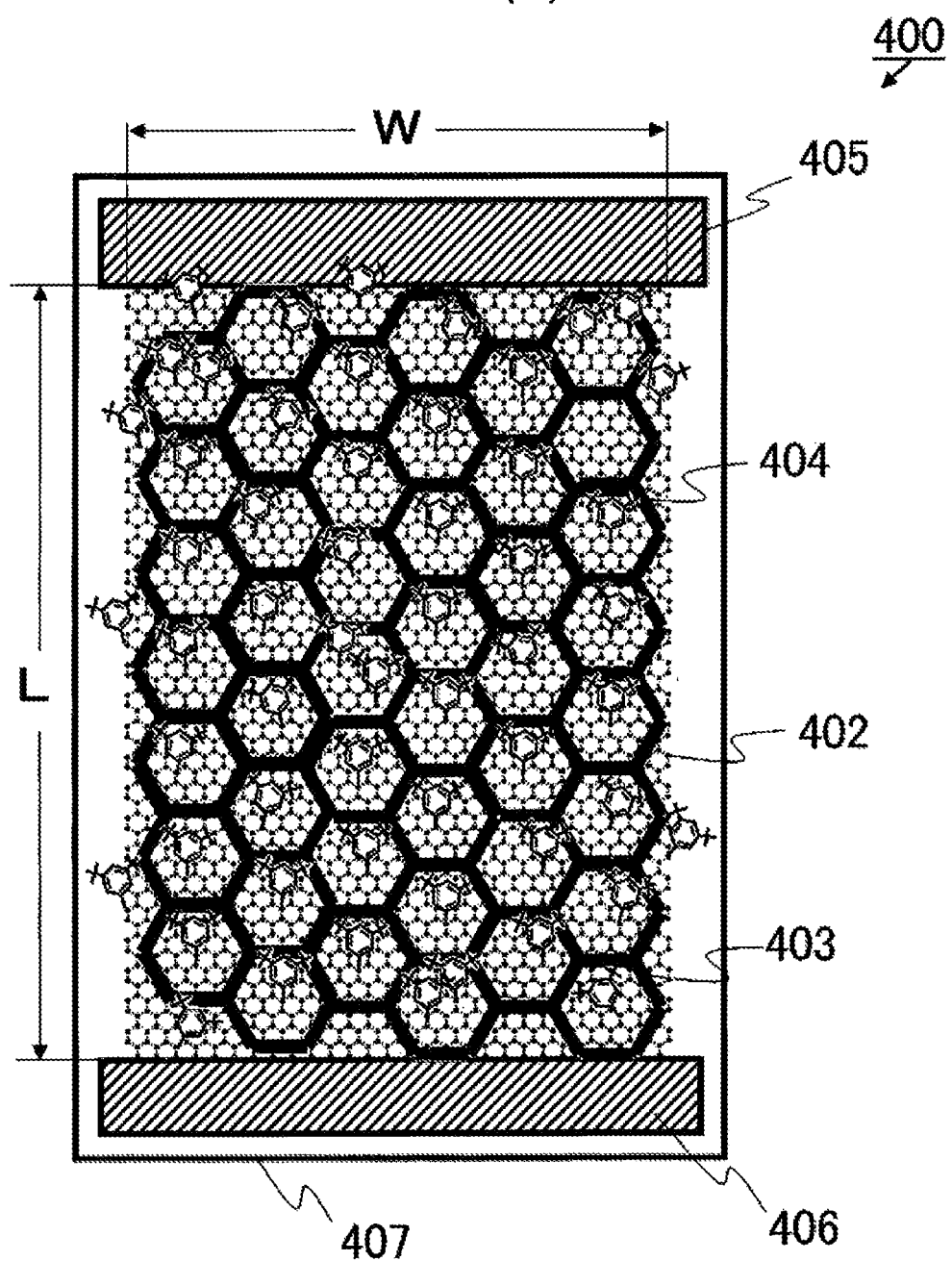
FIG. 6(e) is a schematic plan view of a basic form in which electrodes are formed on both ends of a surface-modified carbon material obtained by modifying a carbon material (GNR) processed into fine pieces with surface modification groups having a two-dimensional periodicity, for use in an electronic device 400.

FIG. 6(e) is a schematic plan view of a basic form of an electronic device 400 in which electrodes 405 and 406 are formed on both ends of planar alignment of 6-membered rings 402 of a surface-modified carbon material obtained by disposing chemical addends 404 so as to have a periodicity on the surface of a carbon material (graphene nanoribbon) placed on a substrate 407 and processed into fine pieces, as another example of the present invention.

In the configuration of the figure, a condition is shown, in which the adducts 404 added to the thin film having a two-dimensional periodicity are approximately averagely aligned in the surface with respect to a predetermined unit area (90 $nm^2$) for a channel area between both the electrodes. In the figure, a periodic assembly 403 exhibiting a two-dimensional periodicity and used as a mask when the chemical addends 404 are added is displayed on the planar alignment of 6-membered rings 402 in an overlapping manner in order to exhibit a mutual positional relationship. In example of the figure, a ratio in an effective area covered by the mask is 46 places/48 places=about 96%, except an edge-side portion. Four places where two chemical addends are added to one unit area are present.

Figure 6F:
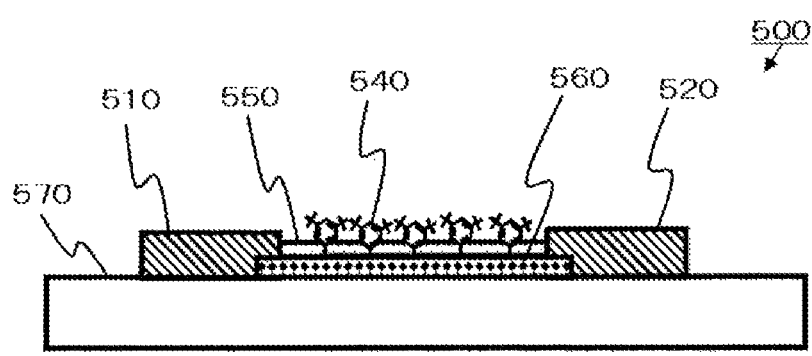
FIG. 6(f) is a schematic sectional view of an electronic device 500 in which electrodes are formed on both ends of a surface-modified carbon material of the present invention, for use in a sensor.

FIG. 6(f) is a schematic sectional view of an electronic device 500 for use in a sensor as an example of the present invention. A silicon substrate 570 is used as an insulating substrate, and graphene 560 is transferred and placed on the surface thereof. Then, the surface of graphene 560 is chemically modified by the above producing method. The shape and size of graphene in a surface direction are processed and adjusted, and electrodes 510 and 520 are formed on both the ends of a graphene part serving as a channel so that contact resistance is sufficiently low. Alternatively, graphene 560 can also be directly formed on the silicon substrate 570.

Reactive groups may be added to chemical addends 540 in advance so as to react with a chemical substance in a gas. However, it is difficult for the chemical addends to withstand an external force greater than or equal to a predetermined level. Therefore, a substance which does not substantially affect physical properties is provided as a protective layer 550 over the graphene part serving as a channel, whereby adducts and graphene can also be held. Examples of a material capable of protecting the surface of a carbon material to some extent include an alkane layer exhibiting an insulating property.

A control circuit is connected to the electrodes, whereby a chemical substance which reacts with the chemical addends 540 added to the surface of a channel part can be detected. The chemical substance can be detected because a change occurs in electrical properties in the channel.

Figure 6G:
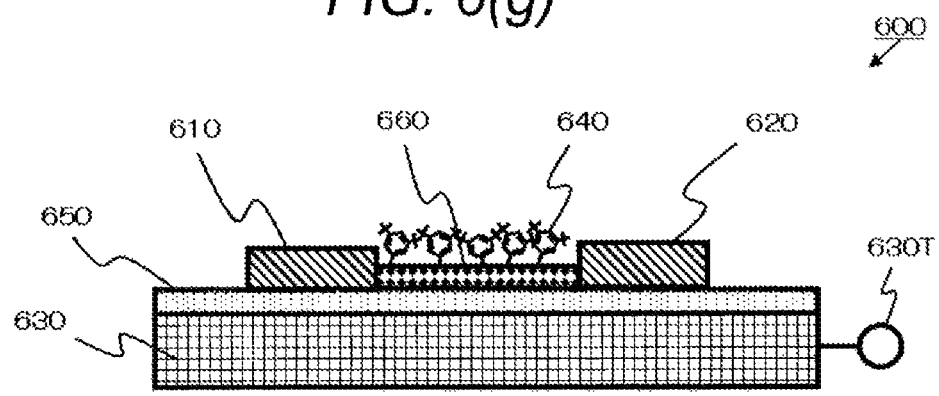
FIG. 6(g) is a schematic cross-sectional view of an electronic device 600 in which electrodes are formed on both ends of a surface-modified carbon material of the present invention, for use in an element structure having a bottom gate.

Next, FIG. 6(g) shows a basic form of a bottom gate type electronic device 600. The electronic device 600 has a three-terminal structure, and includes an electrode 610, an electrode 620, a substrate 630 which serves as an insulating film 650, a gate electrode, and a substrate below graphene 660 serving as a channel, and uses low-resistance doped Si, and a terminal 630T for applying a gate potential.

When the channel of the electronic device 600 is disposed between the electrodes, the arrangement of a main axis direction in a surface may be determined in advance so that the end structure of graphene in the channel direction is either a zigzag structure or an armchair structure in order to obtain desired semiconductor characteristics. A technique of protecting a surface-modified carbon material used as the channel with a hermetic seal to shield the carbon material from the outside air or the like can also be applied.

It is considered that metal nanoparticles made of cobalt, manganese, and iron and the like can be supported on adducts on the surface of graphene, for use in a catalyst. For example, it is expected that chemical addends containing an acidic or basic functional group in advance are periodically introduced into the surface of a carbon material, whereby a material exhibiting a substrate-selective and efficient catalytic action is provided. It is expected that a site which coordinates a metal or the like is introduced into the chemical addends, and metal ions or nanoparticles are fixed to the coordination site to provide a material exhibiting various catalytic actions. In this case, the reaction efficiency and the catalyst life can also be expected to be improved by the three-dimensional structure and electronic interaction of the carbon material and the catalyst.

EXAMPLES

A first embodiment of the present invention will be described below. The first embodiment is the case where a thin film has a "one-dimensional periodicity". A second embodiment which will be described later is the case where a thin film has a "two-dimensional periodicity".

First, the first embodiment will be described in detail with reference to Examples 1-1 to 1-5, but the present invention is not limited to these Examples.

First Embodiment

The structure and size of an electrochemical cell used in the following Examples and Comparative Examples are shown. A cell made of PTFE has heights of "upper part: 35 mm" and "lower part: 3 mm", and inner diameters of "upper part: 20.4 mmφ" and "lower part: 7 mmφ". An electrochemical cell 20 includes a working electrode 21 (carbon material) in the lower part, and a counter electrode 22 and a reference electrode 23 in the upper part (see FIGS. 3(a) to (c)). Various measurements in Examples and Comparative Examples were performed by the following methods.

(1) Observation with Scanning Tunneling Microscope (STM)

Observation with a scanning tunneling microscope (STM) was performed using Nanoscope V (manufactured by Bruker AXS, Inc.). An STM probe used was a mechanically cut Pt/Ir (composition ratio: 8:2) alloy purchased from Tanaka Kikinzoku Kogyo K. K. Many images were acquired at a tunnel current $I_t$ (30 pA to 60 pA) and a bias voltage $V_b$ (−600 mV), and height informations of samples were recorded.

An STM observation image was subjected to FFT processing using SPIP image analysis software (registered trademark) manufactured by Image Metrology A/S. FIG. 1(b) is an illustration diagram schematically showing STM observation adopted for verifying the state of chemical modification of the surface of a carbon material according to the present invention.

The STM observation makes it possible to provide certain results of an object to be inspected even in the atmosphere. However, resolution is generally known to be improved when the object to be inspected is set in a liquid. Therefore, in Examples and the like which will be described later, the object to be inspected was subjected to the STM observation in a state where the object to be inspected was placed in a liquid such as tetradecane or phenyloctane.

(2) Raman Spectrometry

Raman spectrometry was performed using XploRA (registered trademark) Plus Confocal Raman Microscope manufactured by Horiba, Ltd. An Nd-YAG laser (532 nm) was condensed by a 50× objective lens, and irradiated on the surface of the dried sample. Raman scattering was collected through the same objective lens, and detected with a CCD detector. From the Raman spectra obtained at 16 different points in the same sample, the integrated intensities of a D band and a G band were calculated, and Id/Ig thereof was calculated. The average value of Id/Ig at the 16 points was set as Id/Ig of the sample (see FIG. 3(g) described above).

There is used the ratio of the peak intensity ($I_D$) of a D band appearing in the vicinity of 1350 cm$^{-1}$ to the peak intensity ($I_G$) of a G band appearing in the vicinity of 1590 cm$^{-1}$ ($I_D/I_G$) in the Raman spectra with respect to the surface of the chemically modified carbon material. The G band is a vibration mode derived from the structure of the carbon material. As the crystallinity is higher, the peak intensity is higher. The D band is derived from the structure of the carbon material as with the G band, but it is not the original vibration mode, and reflects defects such as the presence of modification groups due to surface modification. The spectral intensity is increased depending on the degree of the defects. All the following operations were performed at room temperature.

Example 1-1

Highly oriented pyrolytic graphite (HOPG, ZYB grade, manufactured by Momentive Performance Materials inc.) was immersed in dichloromethane and hexane for washing, and cleaved with an adhesive tape (Nittotape, No. 3800K). The highly oriented pyrolytic graphite was then attached as a working electrode 21 to an electrochemical cell 20. 20 μL of a tetradecane solution of pentacontane ($C_{50}H_{102}$) at a concentration of $1.0 \times 10^{-5}$ M was added onto the HOPG in the electrochemical cell 20 with a micropipette. After 10 minutes, 4.9 mL of a 50 mM hydrochloric acid solution having a 3,5-di-tert-butylaniline at a concentration of 1 mM, and 0.1 mL of a 0.1 M sodium nitrite aqueous solution were shaken in a sample tube for 30 seconds to prepare 3,5-di-tert-butylbenzenediazonium chloride (TBD). 500 μL of the solution was carefully added onto the tetradecane layer on the HOPG with a micropipette so as not to disturb the tetradecane layer. Then, all the remaining solution was added to the electrochemical cell 20.

After 3 minutes from the start of mixing, sweep was repeated 5 times with a potential width of −0.7 V to +0.1 V (Ag/Ag$^+$) using cyclic voltammetry (612 DA Electrochemical Analyzer, manufactured by ALS/CH instruments) to record a cyclic voltammogram.

After sweep, a water layer was removed with a micropipette, and 5.0 mL of ultrapure water was added into the electrochemical cell 20 with a micropipette so as not to disturb the tetradecane layer. Then, the ultrapure water was removed to wash the surface of the tetradecane layer. This washing operation was performed twice in total.

The HOPG was removed from the electrochemical cell 20, and the interface between the tetradecane solution remaining on the surface and the HOPG was subjected to STM observation. After the STM observation, the tetradecane on the surface was dried and removed with warm air from a dryer, to record Raman spectra.

The obtained cyclic voltammogram is shown in FIG. 7(a). Irreversible reduction waves were observed at −340 mV and −460 mV in first sweep (lowermost graph). From this, it became clear that an aryl diazonium salt is reduced to generate radical species.

The obtained STM observation images ($V_{bias}$=−600 mV, $I_{set}$=30 pA) are shown in FIGS. 7-(b) and (c). Light spots in the images are due to aryl groups added to the HOPG. Portions where a plurality of light spots are observed as if the light spots are aligned in line correspond to the lamellar structure of pentacontane attached as a thin film to the HOPG (FIG. 7-(c)). It was found that the plurality of light spots are disposed on a straight line along the molecule rows of pentacontane (FIG. 7-(b)). An image shown in the upper right part of FIG. 7-(b) is a Fourier-transformed image obtained by subjecting the STM observation image to Fourier processing (FFT). FIG. 7(e) is the enlarged Fourier-transformed image. From the Fourier-transformed image, positions where the plurality of light spots were present were found to be aligned so as to have a periodicity with a pitch of 6.8 nm.

From the above, it was confirmed that the HOPG after the above treatment is a surface-modified carbon material in which aryl groups are added to the surface of graphite, and a periodicity corresponding to the addition positions of the large number of aryl groups is observed in a one-dimensional direction in the Fourier-transformed image of the STM observation image of the surface.

The obtained Raman spectra are shown in FIG. 7(d). In this Raman spectra, a D band due to the presence of spa carbon in a graphite lattice was observed, and Id/Ig was 0.036.

Example 1-2

Highly oriented pyrolytic graphite (HOPG, ZYB grade, manufactured by Momentive Performance Materials inc.) was immersed in dichloromethane and hexane for washing, and cleaved with an adhesive tape (Nittotape, No. 3800K). The highly oriented pyrolytic graphite was then attached as a working electrode 21 to an electrochemical cell 20. 20 μL of a tetradecane solution of tetracontane ($C_{40}H_{82}$) at a concentration of $3.5 \times 10^{-5}$ M was added onto the HOPG in the electrochemical cell 20 with a micropipette.

After 10 minutes, 4.9 mL of a 50 mM hydrochloric acid solution of 3,5-di-tert-butylaniline at a concentration of 1 mM, and 0.1 mL of a 0.1 M sodium nitrite aqueous solution were shaken in a sample tube for 30 seconds to prepare 3,5-di-tert-butylbenzenediazonium chloride (TBD). 500 μL of the solution was carefully added onto the tetradecane layer on the HOPG with a micropipette so as not to disturb the tetradecane layer. Then, all the remaining solution was added to the electrochemical cell 20.

After 3 minutes from the start of mixing, sweep was repeated 5 times with a potential width of −0.7 V to +0.1 V (Ag/Ag$^+$) using cyclic voltammetry (612 DA Electrochemical Analyzer, manufactured by ALS/CH instruments).

After sweep, a water layer was removed with a micropipette, and 5.0 mL of ultrapure water was added into the electrochemical cell 20 with a micropipette so as not to disturb the tetradecane layer. Then, the ultrapure water was removed to wash the surface of the tetradecane layer. This washing operation was performed twice in total.

The HOPG was removed from the electrochemical cell 20, and the interface between the tetradecane solution remaining on the surface and the HOPG was subjected to STM observation. After the STM observation, the tetradecane on the surface was dried and removed with warm air from a dryer, to record Raman spectra.

The obtained STM observation image ($V_{bias}$=−600 mV, $I_{set}$=50 pA) is shown in FIG. 8-(a). As with the case of Example 1-1 using pentacontane, it was confirmed from FIG. 8-(a) that a plurality of light spots are disposed in the gap of the lamellar structure of tetracontane. FIG. 8-(b) is a Fourier-transformed image obtained by subjecting the STM observation image to Fourier processing (FFT). From the Fourier-transformed image, it was found that positions where the light spots are present are aligned so as to have a periodicity with a pitch of 5.8 nm.

From the above, the HOPG after the above treatment is a surface-modified carbon material in which aryl groups are added to the surface of graphite. It was confirmed that a periodicity corresponding to the addition positions of the large number of aryl groups is observed in a one-dimensional direction in the Fourier-transformed image of the STM observation image of the surface. A D band was observed in the obtained Raman spectra, and Id/Ig was 0.029.

Example 1-3

Highly oriented pyrolytic graphite (HOPG, ZYB grade, manufactured by Momentive Performance Materials inc.) was immersed in dichloromethane and hexane for washing, and cleaved with an adhesive tape (Nittotape, No. 3800K). The highly oriented pyrolytic graphite was then attached as a working electrode 21 to an electrochemical cell 20.

20 μL of a tetradecane solution of triacontane ($C_{30}H_{62}$) at a concentration of $1.2 \times 10^{-2}$ M was added onto the HOPG in the electrochemical cell 20 with a micropipette. After 10 minutes, 4.9 mL of a 50 mM hydrochloric acid solution of 3,5-di-tert-butylaniline at a concentration of 1 mM, and 0.1 mL of a 0.1 M sodium nitrite aqueous solution were shaken in a sample tube for 30 seconds to prepare 3,5-di-tert-butylbenzenediazonium chloride (TBD). 500 μL of the solution was carefully added onto the tetradecane layer on the HOPG with a micropipette so as not to disturb the tetradecane layer. Then, all the remaining solution was added to the electrochemical cell 20.

After 3 minutes from the start of mixing, sweep was repeated 5 times with a potential width of −0.7 V to +0.1 V (Ag/Ag$^+$) using cyclic voltammetry (612 DA Electrochemical Analyzer, manufactured by ALS/CH instruments).

After sweep, a water layer was removed with a micropipette, and 5.0 mL of ultrapure water was added into the electrochemical cell 20 with a micropipette so as not to disturb the tetradecane layer. Then, the ultrapure water was removed to wash the surface of the tetradecane layer. This washing operation was performed twice in total.

The HOPG was removed from the electrochemical cell 20, and the interface between the tetradecane solution remaining on the surface and the HOPG was subjected to STM observation. After the STM observation, the tetradecane on the surface was dried and removed with warm air from a dryer, to record Raman spectra.

The obtained STM observation image ($V_{bias}$=−600 mV, $I_{set}$=20 pA) is shown in FIG. 9-(a). As with the case of Example 1-1 using pentacontane, it was confirmed from FIG. 9-(a) that a plurality of light spots are disposed in the gap of the lamellar structure of triacontane. An image shown in the upper right part of FIG. 9-(a) is a Fourier-transformed image obtained by subjecting the STM observation image to Fourier processing (FFT). FIG. 9-(b) is the enlarged Fourier-transformed image. From the Fourier-transformed image, it was found that positions where the plurality of light spots are present are aligned so as to have a periodicity with a pitch of 4.1 nm.

From the above, it was confirmed that the HOPG after the above treatment is a surface-modified carbon material in which aryl groups are added to the surface of graphite, and a periodicity corresponding to the addition positions of the large number of aryl groups is observed in a one-dimensional direction in the Fourier-transformed image of the STM observation image of the surface. A D band was observed in the obtained Raman spectra, and Id/Ig was 0.029.

Example 1-4

The Raman spectra of monolayer graphene (manufactured by Graphene Platform Corporation) formed on a copper foil by a CVD method was measured. After the measurement of the Raman spectra, the monolayer graphene was attached as a working electrode 21 to an electrochemical cell 20 together with a copper foil. 20 μL of a tetradecane solution of triacontane ($C_{30}H_{62}$) at a concentration of $1.2 \times 10^{-2}$ M was added onto the monolayer graphene in the electrochemical cell 20 with a micropipette.

After 10 minutes, 4.9 mL of a 50 mM hydrochloric acid solution of 3,5-di-tert-butylaniline at a concentration of 1 mM, and 0.1 mL of a 0.1 M sodium nitrite aqueous solution were shaken in a sample tube for 30 seconds to prepare 3,5-di-tert-butylbenzenediazonium chloride (TBD). 500 μL of the solution was carefully added onto the tetradecane layer on the monolayer graphene with a micropipette so as not to disturb the tetradecane layer. Then, all the remaining solution was added to the electrochemical cell 20.

After 3 minutes from the start of mixing, sweep was repeated 5 times with a potential width of −0.7 V to +0.1 V (Ag/Ag$^+$) using cyclic voltammetry (612 DA Electrochemical Analyzer, manufactured by ALS/CH instruments) to measure a cyclic voltammogram.

After sweep, a water layer was removed with a micropipette, and 5.0 mL of ultrapure water was added into the electrochemical cell 20 with a micropipette so as not to disturb the tetradecane layer. Then, the ultrapure water was removed to wash the surface of the tetradecane layer. This washing operation was performed twice in total.

The copper foil and the monolayer graphene were removed from the electrochemical cell 20, and the interface between the tetradecane solution remaining on the surface and the monolayer graphene was subjected to STM observation. After the STM observation, the tetradecane on the surface was dried and removed with warm air from a dryer, to record Raman spectra.

The obtained cyclic voltammogram is shown in FIG. 10-(a). An irreversible reduction wave was observed at −420 mV in first sweep (lowermost graph).

The obtained STM observation images ($V_{bias}$=−600 mV, $I_{set}$=30 pA) are shown in FIGS. 10-(b), -(c), and (f). As with the case of Example 1-3 using HOPG, it was confirmed from FIGS. 10-(b), -(c) and -(f) that a plurality of light spots are disposed in the gap of the lamellar structure of triacontane.

An image shown in FIG. 10-(g) is a Fourier-transformed image obtained by subjecting the STM observation image to Fourier processing (FFT). From the Fourier-transformed image, it was found that the alignment of the plurality of light spots has a periodicity with a pitch of 4.6 nm. From the above, it was found that the monolayer graphene after the above treatment is a surface-modified carbon material in which aryl groups are added to the surface of graphene. A periodicity corresponding to the addition positions of the large number of aryl groups could be confirmed to be exhibited in a one-dimensional direction in the Fourier-transformed image of the STM observation image of the surface.

FIG. 10-(d) shows the Raman spectra obtained for the monolayer graphene before the treatment with the electrochemical cell, and FIG. 10-(e) shows the Raman spectra obtained for the monolayer graphene after the treatment with the electrochemical cell. A D band was observed in the Raman spectra shown in FIG. 10-(e), and Id/Ig was 1.9.

Example 1-5

The same treatment as that in Example 1-4 above was performed. First, before surface modification, the Raman spectra of single layer graphene on a Cu substrate prepared by a CVD method was measured. After the Raman spectra was measured, the monolayer graphene was attached to an electrochemical cell. A solution of pentacontane in tetradecane (20 μL, 1.0×10$^{-5}$ M) was added onto the monolayer graphene in the electrochemical cell with a micropipette.

After 10 minutes, a solution of 3,5-di-tert-butylaniline (1 mM) in hydrochloric acid (50 mM, 4.9 mL) and a sodium nitrite aqueous solution (0.1 M, 0.1 mL) were added into a sample tube, followed by shaking for 30 seconds for stirring. A part (500 μL) of the solution was carefully added onto the tetradecane layer on the monolayer graphene from a micropipette so as not to disturb the tetradecane layer.

Then, all the remaining solution was added to the electrochemical cell. After 3 minutes from the start of mixing, a cyclic voltammogram was measured. After the measurement, a water layer was removed with a micropipette, and ultrapure water (5.0 mL) was added into the electrochemical cell with a micropipette so as not to disturb the tetradecane layer. Then, the ultrapure water was removed to wash the surface of the tetradecane layer.

This washing operation was performed twice in total (total 10 mL). The monolayer graphene was removed from the electrochemical cell, and the interface between the tetradecane solution remaining on the surface and the monolayer graphene was subjected to STM observation. FIG. 11 is data corresponding to the present example. FIG. 11-(a) is a cyclic voltammogram of the present example, and FIGS. 11-(b), -(c) and -(d) are STM observation images obtained in the present example.

Comparative Example 1-1

Highly oriented pyrolytic graphite (HOPG, ZYB grade, manufactured by Momentive Performance Materials inc.) was immersed in dichloromethane and hexane for washing, and cleaved with an adhesive tape (Nittotape, No. 3800K). The highly oriented pyrolytic graphite was then attached as a working electrode 21 to an electrochemical cell 20.

20 μL of 1-phenyloctane was added onto the HOPG in the electrochemical cell 20 with a micropipette. After 10 minutes, 4.9 mL of a 50 mM hydrochloric acid solution of 3,5-di-tert-butylaniline at a concentration of 1 mM, and 0.1 mL of a 0.1 M sodium nitrite aqueous solution were added into a sample tube, followed by shaking for 30 seconds to prepare 3,5-di-tert-butylbenzenediazonium chloride (TBD). 500 μL of the solution was carefully added onto the 1-phenyloctane layer on the HOPG with a micropipette so as not to disturb the 1-phenyloctane layer. Then, all the remaining solution was added to the electrochemical cell 20.

After 3 minutes from the start of mixing, sweep was repeated 5 times with a potential width of −0.7 V to +0.1 V (Ag/Ag$^+$) using cyclic voltammetry (612 DA Electrochemical Analyzer, manufactured by ALS/CH instruments) to record a cyclic voltammogram.

After sweep, a water layer was removed with a micropipette, and 5.0 mL of ultrapure water was added into the electrochemical cell 20 with a micropipette so as not to disturb the 1-phenyloctane layer. Then, the ultrapure water was removed to wash the surface of the 1-phenyloctane layer. This washing operation was performed twice in total.

The HOPG was removed from the electrochemical cell 20, and the interface between the 1-phenyloctane remaining on the surface and the HOPG was subjected to STM observation. After the STM observation, the 1-phenyloctane on the surface was dried and removed with warm air from a dryer, to measure Raman spectra. The obtained cyclic voltammogram is shown in FIG. 12-(a). An irreversible reduction wave with a peak top of −140 mV (Ag/Ag$^+$) was observed in first sweep (lowermost graph).

The obtained STM observation image ($V_{bias}$=−600 mV, $I_{set}$=30 pA) is shown in FIG. 12-(b). Light spots in the image were due to aryl groups added to the HOPG, and the aryl groups were confirmed to be added to the HOPG. However, no regularity was found in positions where a plurality of light spots were present in the image. An image shown in the upper right part of FIG. 12-(b) is a Fourier-transformed image obtained by subjecting the STM observation image to Fourier processing (FFT). FIG. 12-(d) is the enlarged Fourier-transformed image. Regarding the Fourier-transformed image, no periodicity was confirmed in the positions where the light spots were present.

From the above, it was confirmed that the HOPG after the above treatment is a surface-modified carbon material in which aryl groups are added to the surface of graphite, and a periodicity corresponding to the addition positions of the large number of aryl groups is not observed in a one-dimensional direction in the Fourier-transformed image of the STM observation image of the surface. The obtained Raman spectra are shown in FIG. 12-(c). A D band was observed, and Id/Ig was 0.11.

Comparative Example 1-2

Highly oriented pyrolytic graphite (HOPG, ZYB grade, manufactured by Momentive Performance Materials inc.) was immersed in dichloromethane and hexane for washing, and cleaved with an adhesive tape (Nittotape, No. 3800K). The highly oriented pyrolytic graphite was then attached as a working electrode 21 to an electrochemical cell 20.

20 μL of 1,2,4-trichlorobenzene was added onto the HOPG in the electrochemical cell 20 with a micropipette. After 10 minutes, 4.9 mL of a 50 mM hydrochloric acid solution of 3,5-di-tert-butylaniline at a concentration of 1 mM, and 0.1 mL of a 0.1 M sodium nitrite aqueous solution were added into a sample tube, followed by shaking for 30 seconds to prepare 3,5-di-tert-butylbenzenediazonium chloride (TBD). 500 μL of the solution was carefully added onto the 1,2,4-trichlorobenzene layer on the HOPG with a micropipette so as not to disturb the 1,2,4-trichlorobenzene layer. Then, all the remaining solution was added to the electrochemical cell 20.

After 3 minutes from the start of mixing, sweep was repeated 5 times with a potential width of −0.7 V to +0.1 V (Ag/Ag$^+$) using cyclic voltammetry (612 DA Electrochemical Analyzer, manufactured by ALS/CH instruments) to record a cyclic voltammogram. After sweep, a water layer was removed with a micropipette, and 5.0 mL of ultrapure water was added into the electrochemical cell 20 with a micropipette so as not to disturb the 1,2,4-trichlorobenzene layer. Then, the ultrapure water was removed to wash the surface of the 1,2,4-trichlorobenzene layer. This washing operation was performed twice in total.

The HOPG was removed from the electrochemical cell 20, and the interface between the 1,2,4-trichlorobenzene remaining on the surface and the HOPG was subjected to STM observation. After the STM observation, the 1,2,4-trichlorobenzene on the surface was dried and removed with warm air from a dryer, to measure Raman spectra.

An irreversible reduction wave with a peak top of −140 mV (Ag/Ag$^+$) was observed from the obtained cyclic voltammogram.

From the obtained STM observation image, light spots due to aryl groups were confirmed as with Comparative Example 1-1. However, no regularity was found in positions where a plurality of light spots were present. From the Fourier-transformed image obtained by subjecting the STM observation image to Fourier processing (FFT), no periodicity was confirmed in the alignment of the plurality of light spots.

From the above, it was confirmed that the HOPG after the above treatment is a surface-modified carbon material in which aryl groups are added to the surface of graphite, and a periodicity corresponding to the addition positions of the large number of aryl groups is not observed in the Fourier-transformed image of the STM observation image of the surface. A D band was observed in the obtained Raman spectra, and Id/Ig was 0.13.

Comparative Example 1-3

Highly oriented pyrolytic graphite (HOPG, ZYB grade, manufactured by Momentive Performance Materials inc.) was immersed in dichloromethane and hexane for washing, and cleaved with an adhesive tape (Nittotape, No. 3800K). The highly oriented pyrolytic graphite was then attached as a working electrode 21 to an electrochemical cell 20.

20 μL of tetradecane was added onto the HOPG in the electrochemical cell 20 with a micropipette. After 10 minutes, 4.9 mL of a 50 mM hydrochloric acid solution of 3,5-di-tert-butylaniline at a concentration of 1 mM, and 0.1 mL of a 0.1 M sodium nitrite aqueous solution were added into a sample tube, followed by shaking for 30 seconds to prepare 3,5-di-tert-butylbenzenediazonium chloride (TBD).

500 μL of the solution was carefully added onto the tetradecane layer on the HOPG with a micropipette so as not to disturb the tetradecane layer. Then, all the remaining solution was added to the electrochemical cell 20. After 3 minutes from the start of mixing, sweep was repeated 5 times with a potential width of −0.7 V to +0.1 V (Ag/Ag$^+$) using cyclic voltammetry (612 DA Electrochemical Analyzer, manufactured by ALS/CH instruments) to measure a cyclic voltammogram.

After sweep, a water layer was removed with a micropipette, and 5.0 mL of ultrapure water was added into the electrochemical cell 20 with a micropipette so as not to disturb the tetradecane layer. Then, the ultrapure water was removed to wash the surface of the tetradecane layer. This washing operation was performed twice in total.

The HOPG was removed from the electrochemical cell 20, and the interface between the tetradecane remaining on the surface and the HOPG was subjected to STM observation. After the STM observation, the tetradecane on the surface was dried and removed with warm air from a dryer, to measure Raman spectra. An irreversible reduction wave with a peak top of −140 mV (Ag/Ag$^+$) was observed from the obtained cyclic voltammogram.

From the obtained STM observation image, light spots due to aryl groups were confirmed as with Comparative Example 1-1. However, no regularity was found in positions where a plurality of light spots were present. Regarding the Fourier-transformed image obtained by subjecting the STM observation image to Fourier processing (FFT), no periodicity was confirmed in the positions of the plurality of light spots.

From the above, it was confirmed that the HOPG after the above treatment is a surface-modified carbon material in which aryl groups are added to the surface of graphite, and a periodicity corresponding to the addition positions of the large number of aryl groups is not observed in the Fourier-transformed image of the STM observation image of the surface. A D band was observed in the obtained Raman spectra, and Id/Ig was 0.13. The above results are shown in Table 2 below. In these Examples, it is considered that the periodic pitch is linked so as to correspond to the molecular length of the alkane used.

TABLE 2

| Examples | Carbon material | Liquid medium | | Chemical modification compound | Surface-modified carbon material | |
|---|---|---|---|---|---|---|
| | | Organic solvent | Alkane | | Presence or absence of periodicity (pitch) | Id/Ig |
| Example 1-1 | HOPG | Tetradecane | $C_{50}H_{102}$ | TBD | With one-dimensional periodicity (6.8 nm) | 0.036 |
| Example 1-2 | HOPG | Tetradecane | $C_{40}H_{82}$ | TBD | With one-dimensional periodicity (5.8 nm) | 0.029 |
| Example 1-3 | HOPG | Tetradecane | $C_{30}H_{62}$ | TBD | With one-dimensional periodicity (4.1 nm) | 0.029 |
| Example 1-4 | Single-layer graphene | Tetradecane | $C_{30}H_{62}$ | TBD | With one-dimensional periodicity (4.6 nm) | 1.9 |
| Example 1-5 | Single-layer graphene | Tetradecane | $C_{50}H_{102}$ | TBD | With one-dimensional periodicity (8.6 nm) | — |
| Comparative example 1-1 | HOPG | 1-phenyloctane | — | TBD | No periodicity | 0.11 |
| Comparative example 1-2 | HOPG | 1,2,4-trichlorobenzene | — | TBD | No periodicity | 0.13 |
| Comparative example 1-3 | HOPG | Tetradecane | — | TBD | No periodicity | 0.13 |

Next, Table 3 below shows alkanes which can be suitably used in the first embodiment of the present invention.

TABLE 3

| Number of carbon atoms | Names |
|---|---|
| C = 15 | Pentadecane |
| C = 16 | Hexadecane |
| C = 17 | Heptadecane |
| C = 18 | Octadecane |
| C = 19 | Nonadecane |
| C = 20 | Icosane |
| C = 21 | Henicosane |
| C = 22 | Docosane |
| C = 23 | Tricosane |
| C = 24 | Tetracosane |
| C = 25 | Pentacosane |
| C = 26 | Hexacosane |
| C = 27 | Heptacosane |
| C = 28 | Octacosane |
| C = 29 | Nonacosane |
| C = 30 | Triacontane |
| C = 40 | Tetracontane |
| C = 50 | Pentacontane |
| C = 60 | Hexacontane |
| C = 70 | Heptacontane |
| C = 80 | Octacontane |

As examples of the organic compound which can be applied to the first embodiment of the present invention, the alkanes listed in Table 3 above are linear saturated hydrocarbons, and have 15 to 80 carbon atoms. The alkane derivative may also have 10 to 80 carbon atoms. The organic solvent may be any compound which can dissolve the above alkane or alkane derivative.

For example, an alkane having a relatively small number of carbon atoms such as pentane having 5 carbon atoms, hexane having 6 carbon atoms, heptane having 7 carbon atoms, octane having 8 carbon atoms, nonane having 9 carbon atoms, decane having 10 carbon atoms, undecane having 11 carbon atoms, dodecane having 12 carbon atoms, tridecane having 13 carbon atoms, or tetradecane having 14 carbon atoms can be suitably used as the organic solvent.

Preferably, an alkane is selected and used, which has a relative difference of 4 or more in the number of carbon atoms between the alkane and an alkane for constituting the thin film, and has a high boiling point. The solution may contain a compound other than the alkane as long as the compound does not influence a unimolecular film made of an alkane serving as the mask.

As described above, the first embodiment including Examples 1-1 to 1-5 is an aspect in which the surface is modified with adducts having a one-dimensional periodic structure. Next, a second embodiment in which a surface is modified with adducts having a two-dimensional periodic structure according to the present invention will be described.

Second Embodiment

FIG. 16 shows the structural schematic view of 1,3,5-tris (4-carboxyphenyl)benzene (H3BTB) which is an organic compound capable of being used in the present embodiment.

An STM observation image of a simple assembly was observed in order to verify whether or not it can be used in the present embodiment. The structure of an assembly centered on a hole was optimized by molecular mechanics calculation (MM calculation) based on the structure of the H3BTB. As a result, the diameter of the hole were predicted to be about 3.4 nm. The size of the hole is sufficient to cause the addition reaction of aryl radicals.

A periodic structure was attempted to be formed using the H3BTB. As a result, a defect structure was also observed in part, but it had a relatively large domain size (200 nm×200 nm or more). Regarding the size of the hole of a single unit, a hexagon inscribed in the hole had a length (a=b) of 3.2 nm, and a hexagon forming the hole had an included angle of 60 degrees between adjacent sides.

Hereinafter, an experiment of chemical modification of the surface of carbon was conducted using H3BTB which can form a thin film having a two-dimensional periodicity. As with Examples 1-1 to 1-5 above, a thin film was formed on a carbonaceous film, and was subjected to STM observation. As experimental conditions, nonanoic acid (n-nonanoic acid (NA)) and a 2.5% saturated solution were used as a solvent, and a temperature was room temperature.

[Chemical Formula 11]

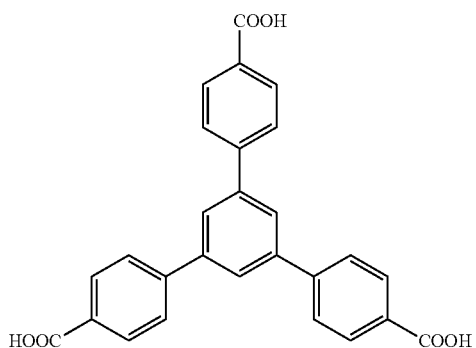

(5)

Experimental Conditions

The HOPG was washed with dichloromethane ($CH_2Cl_2$) and hexane, and the cleaved HOPG was then attached to an EC cell. 20 μL of an H3BTB/NA solution (degree of saturation: 2.5%) was added thereto, followed by left standing for 10 minutes. Furthermore, a 3,4,5-trimethoxyaniline (TMA) hydrochloric acid aqueous solution (3 mM, 4.9 mL) and an $NaNO_2$ aqueous solution (0.1 M, 0.3 mL) were mixed. After 30 seconds, the aqueous solution was gradually added to the EC cell using a micropipette.

After 3 minutes from the mixing, a reduction operation using CV was performed. A scan range was +0.20 V to −0.70 V; a scan speed was 0.1 V/sec; and the number of scans was 1. Thus, the TMA is also a compound which can chemically modify the surface of the carbon material almost uniformly without multilayering, as with TBD.

After the completion of the reduction operation, the aqueous solution was removed using a micropipette, and the inside of the EC cell was washed twice with ultrapure water. The HOPG was removed from the EC cell, and was subjected to STM observation as it was.

(a) and (c) of FIG. 17(a) show an STM observation image and Raman spectra data after an electrochemical treatment. (b) of FIG. 17(a) is the obtained cyclic voltammogram. From the bottom, a first sweep wave and a second sweep wave are shown.

Comparative Example 2-1 and Comparative Example 2-2 are cases where the chemical addend is TBD and the content of TBD in the liquid medium is low. Since the formed thin film does not exhibit a two-dimensional periodicity, it is found that TBD does not satisfy a necessary content condition.

Meanwhile, in Example 2-1, a thin film recognized as a periodic assembly could be formed by using the 3 mM TMA. The ratio of the chemical modification to the HOPG was 70% or more, as the result calculated by the above technique.

Next, in Example 2-2, DBA-006 dissolved in 1-phenyloctane (PO) was used as a mask, and TMA was used as a chemical modifier. The concentration of the DBA-006 was $2.0 \times 10^{-5}$ M. A TMA hydrochloric acid aqueous solution (2 mM, 4.8 mL, hydrochloric acid: in 50 mM) and an $NaNO_2$ aqueous solution (0.1 M, 0.2 mL) were mixed and stirred for 30 seconds. The aqueous solution was then gradually added to the EC cell using a micropipette.

From the STM observation of the chemically modified HOPG ((a) of FIG. 17(b)), a hexagonal period was found to be present in the Fourier-transformed image of the STM observation image (FIG. 17(b)). Id/Ig was 0.085 and the ratio was 78%.

In the present Example, the concentration of a chemical modification compound contained in an electrolyte aqueous solution 24 is set to be within a range of 0.2 to 10 mmol/L. The combination properties of the chemical modification compound and a thin film material, and the correlation between the chemical addend and the size of the periodic structure, and the like may be related as parameters. In order to cause chemical modification to proceed at a predetermined reaction rate when the ratio of 70% or more can be obtained, the concentration of the chemical modification compound is preferably 2 to 7 mmol/L. The concentration of the chemical modification compound is more preferably 3 to 6 mmol/L. When the concentration of the chemical modification compound is within the above range, a reaction between the chemical modification compound and the surface of a carbon material typified by graphene which is a working electrode 21 or graphite suitably proceeds, whereby a sufficient amount of the chemical addend is likely to be added to the surface of the carbon material such as graphene while a periodicity is exhibited. Table 4 below shows the experimental results of the present Example.

TABLE 4

| | Liquid medium | | | | |
|---|---|---|---|---|---|
| Examples | Mask (thin film) | Chemical modifier (adduct) | STM observation image | $I_D/I_G$ | Ratio |
| Comparative example 2-1 | H3BTB/NA 2.5% sat. | TBD 1 mM | No periodicity | 0.015 | — |
| Comparative example 2-2 | H3BTB/NA 2.5% sat. | TBD 2 mM | No periodicity | 0.039 | — |
| Example 2-1 | H3BTB/NA 2.5% sat. | TMA 3 mM | Distorted hexagonal period was observed | 0.100 | 70% or more |
| Example 2-2 | DBA-OC6/PO $2.0 \times 10^{-6}$ M | TMA 2 mM | Hexagonal period was observed | 0.085 | 78% |

Next, another specific examples using DBA as a single unit capable of forming an assembly will be described. First, FIGS. 18 and 19 show DBA-OC4 to DBA-OC10 having different hole sizes. The sizes of the holes of four organic compounds are 1.4 nm, 1.6 nm, 2.1 nm, and 2.7 nm. The holes have different sizes, but a single unit can be formed.

Among the four organic compounds, three of DBA-OC10 to OC6 could be confirmed to exhibit a periodic structure. It is also possible to verify an Id/Ig value in Raman spectra. The concentration of DBA or H3BTB or the like in a solution for forming a thin film having a periodic structure is more preferably 1 micromol/L or more and 1 mmol/L or less.

FIG. 20 shows STM observation images and Fourier-transformed images of DBAOC10, DBAOC8, and DBAOC6. It could be confirmed from the Fourier-transformed images that the periodic structure is exhibited.

FIG. 21 is a drawing quoted from Non-Patent Literature 6 (Tahara et. al.) above, and shows organic compound groups having DBA as a central framework, which can be applied to the present invention. By using organic compounds having different branch lengths as a single unit (FIG. 21-(a)), the sizes of the holes in the resulting assemblies can be controlled (see FIGS. 21(b) to (e)).

Basically, the same organic compounds may be used to form the assembly. The holes in the resulting assembly generally show a polygonal shape, and preferably a hexagonal shape. This is because the hexagonal shape is likely to form a uniform and stable assembly on the surface of the carbon material. More preferably, the holes of the assembly have a regular hexagonal shape.

(a) of FIG. 22 is a drawing quoted from Non-Patent Literature 6 (Tahara et. al.) above, and is a surface observation photograph. (b) of FIG. 22 is an STM image. (c) of FIG. 22 is a structural schematic view of a single unit formed of an organic compound. FIG. 23 is an illustration diagram showing the structures of another organic compound groups capable of forming a two-dimensional periodic structure.

Finally, the case where the two-dimensional periodic structure of a thin film exhibits a star alignment structure will be described. It is known that, when a large number of organic compounds are aligned on a two-dimensional surface, they have a predetermined polygonal shape or a star polygonal shape. Among these, FIG. 24 shows an example of an organic compound which is a base of an assembly having a star regular hexagonal shape (a so-called Kagome structure).

Specifically, (a) of FIG. 24 shows the chemical structural formula of a rhomboid condensed dehydrobenzo[12]annulene (bisDBA) derivative (R=$C_{10}H_{21}$, $C_{12}H_{25}$, $C_{14}H_{29}$, and $C_{16}H_{33}$), and (b) of FIG. 24 shows an STM observation image. The relative position of the star hexagonal shape in (b) of FIG. 24 is shown in (c) of FIG. 24. As with FIG. 5(a) above, in (c) of FIG. 24, the size of the hole is indicated by 200S, and the sizes of the hole in a vertical and horizontal directions is indicated by cross symbol 200XY.

Finally, FIG. 25 shows an illustration diagram showing a compound capable of forming an assembly exhibiting a two-dimensional periodicity when it has a double annular structure. An assembly having a relatively large size can be formed and used in the present invention.

INDUSTRIAL APPLICABILITY

In a surface-modified carbon material of the present invention, a graphene nanoribbon-type conjugated system is considered to be incompletely present in the surface portion of a carbon material typified by graphite or graphene. Therefore, the surface-modified carbon material can control a bandgap and may exhibit anisotropic electrical conductivity (electrical conduction along the conjugated system).

Therefore, the surface-modified carbon material of the present invention can be used as a field-effect transistor (FET) or a molecular electronic material. For example, the surface-modified carbon material can be applied to a highly selective and highly sensitive molecular sensor which utilizes chemical addends (functional groups) periodically introduced into graphene and graphite, and can be applied to a catalyst and an information storage medium by controlling the surface alignment of metal nanoparticles.

It goes without saying that the present invention can be applied to a carbon material such as carbon nanotube in addition to graphene, graphite, a glassy carbon film, or film-like pyrolytic carbon. In that case, the local region of a carbon material having a curved surface is considered to be chemically modified. Alternatively, the structure of an electrochemical cell may be redesigned so that the above chemical reaction can be performed on the carbon material having a curved surface.

REFERENCE SINGS LIST

1, 41 carbon material
2, 12 linear alkane
3, 13, 43 thin film
30, 105a, 205a basic framework
33U assembly (hexagonal structure using DBA)
4, 14, 44 chemical addend
5, 15a, 15b, 15c, 45 surface-modified carbon material
20 electrochemical cell
21 working electrode
22 counter electrode
23 reference electrode
24 liquid medium
25 electrolyte aqueous solution
26 organic compound-carbon material composite
100 carbon material covered with compound having two-dimensional periodicity (conventional example)
102, 112, 122 planar alignment of 6-membered rings (surface part of carbon material)
105b, 205b grafted part
110, 120 electronic device (conventional example)
200 carbon material covered with two-dimensional periodic mask
203, 403 periodic assembly
300, 400, 500 electronic device (present invention)
305, 306, 405, 406, 510, 520, 610, 620 electrode
550 protective layer
560, 660 graphene
630 substrate (highly doped Si substrate)
650 gate insulating film

The invention claimed is:

1. A surface-modified carbon material comprising:
multiple chemical addends provided on at least a part of a surface of a carbon material selected from the group consisting of graphene, graphite, a glassy carbon film, and film-like pyrolytic carbon, and
a one-dimensional periodicity corresponding to addition positions of the multiple chemical addends,
wherein the one-dimensional periodicity corresponding to the addition positions of the multiple chemical addends can be observed in a Fourier-transformed image of a scanning probe microscopic image of the surface, and
wherein a pitch corresponding to the one-dimensional periodicity is 2 to 10 nm.

2. The surface-modified carbon material according to claim 1, wherein the carbon material is the graphene, and Id/Ig between intensity Ig of a G band and intensity Id of a D band in Raman spectra of the surface is 0.2 to 5.0.

3. The surface-modified carbon material according to claim 1, wherein the carbon material is the graphite, and Id/Ig of intensity Ig of a G band and intensity Id of a D band in Raman spectra of the surface is 0.01 to 0.11.

4. The surface-modified carbon material according to claim 1, wherein the chemical addend is an aryl group.

5. The surface-modified carbon material according to claim 4, wherein the aryl group is represented by the following formula (1):

[Chemical Formula 1]

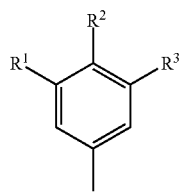

(1)

wherein: $R^1$, $R^2$, and $R^3$ are each independently an alkyl group, an alkenyl group, an alkynyl group, an aryl group, OR, COOH, SOOH, $SOONH_2$, $NO_2$, COOR, $SiR_3$, H, F, Cl, Br, I, OH, $NH_2$, NHR, $NR_2$, CN, CONHR, or COH (R is an alkyl group, an alkenyl group, an alkynyl group, an aryl group, or a halogen substitution product thereof).

6. An organic compound-carbon material composite comprising:
a carbon material;
a thin film; and
a solvent,
wherein the carbon material is selected from the group consisting of graphene, graphite, a glassy carbon film, and film-like pyrolytic carbon;
wherein the thin film is composed of a periodic organic compound assembly exhibiting a one-dimensional periodicity, wherein the one-dimensional periodicity observed in a Fourier-transformed image of a scanning probe microscopic image of the surface comprises a pitch of 2 to 10 nm;
wherein a surface of the carbon material is covered with the thin film; and
wherein the solvent is a non-polar organic solvent or a low-polarity organic solvent, and is disposed on the thin film.

7. The organic compound-carbon material composite according to claim 6, wherein the thin film includes the periodic organic compound assembly in which linear alkanes having 15 to 80 carbon atoms or linear alkane derivatives having 10 to 80 carbon atoms are disposed in parallel.

8. The organic compound-carbon material composite according to claim 6, wherein the periodic organic compound assembly has polygonal holes.

9. A method for producing a surface-modified carbon material, the method comprising: a first step of forming a thin film on a surface of a carbon material using an organic compound; and a second step of causing a chemical modification compound to react with the surface of the carbon material using the thin film as a mask, wherein:
the organic compound is a linear alkane having 15 to 80 carbon atoms or a linear alkane derivative having 10 to 80 carbon atoms;
the carbon material is selected from the group consisting of graphene, graphite, a glassy carbon film, and film-like pyrolytic carbon;
in the first step, the organic compound self-assembles on the surface of the carbon material to form a thin film which is a thin film periodic assembly exhibiting a one-dimensional periodicity, wherein the one-dimensional periodicity observed in a Fourier-transformed image of a scanning probe microscopic image of the surface comprises a pitch of 2 to 10 nm; and
in the second step, the chemical modification compound is caused to react with the surface of the carbon material at a position of a gap of the periodic assembly.

10. The method for producing a surface-modified carbon material according to claim 9, wherein the linear alkane or the linear alkane derivative is a compound represented by the following formula (2):

[Chemical Formula 2]

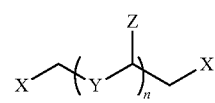

(2)

wherein: X represents H, $CH_3$, $CF_3$, $CH=CH_2$, $C\equiv CH$, an aryl group, F, Cl, Br, I, OH, SH, $NH_2$, COH, or COOH; Y represents $CH_2$, $CF_2$, $CH=CH$, $C\equiv C$, a divalent atomic group formed by removing two hydrogen atoms from an aromatic hydrocarbon, O, S, NH, CO, COO, CONH, NHCO, or NHCHX; Z represents H, $CH_3$, an aryl group, OH, SH, $NH_2$, COH, COOH, COOX, CONH, NHCOX, or NHCHX; and n is an integer satisfying a condition in which the number of carbon atoms in the formula (2) is 15 to 80 in the alkane, and 10 to 80 in the alkane derivative.

11. The method for producing a surface-modified carbon material according to claim 9, wherein the thin film is a lamella type unimolecular film.

12. The method for producing a surface-modified carbon material according to claim 9, wherein the chemical modification compound is a compound represented by the following formula (3):

[Chemical Formula 3]

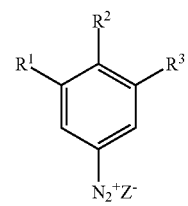

(3)

wherein: $R^1$, $R^2$, and $R^3$ are each independently an alkyl group, an alkenyl group, an alkynyl group, an aryl group, OR, COOH, SOOH, $SOONH_2$, $NO_2$, COOR, $SiR_3$, H, F, Cl, Br, I, OH, $NH_2$, NHR, CN, CONHR, or COH (R is an alkyl group, an alkenyl group, an alkynyl group, or an aryl group); and Z is a halogen atom, $BF_4$, $BR_4$, or $PF_6$ ($R_4$ is an alkyl group, an alkenyl group, an alkynyl group, an aryl group, or a halogen substitution product thereof).

13. A field-effect transistor comprising the surface-modified carbon material according to claim 1.

14. A sensor comprising the surface-modified carbon material according to claim 1.

15. A light emitting device comprising the surface-modified carbon material according to claim 1.

16. A catalyst comprising the surface-modified carbon material according to claim 1.

* * * * *